United States Patent
Ikefuji et al.

(10) Patent No.: US 10,998,767 B2
(45) Date of Patent: May 4, 2021

(54) POWER TRANSMISSION DEVICE AND NON-CONTACT POWER FEEDING SYSTEM FOR TRANSMITTING ELECTRIC POWER TO POWER RECEPTION DEVICE BY MAGNETIC RESONANCE

(71) Applicant: ROHM CO., LTD., Kyoto (JP)

(72) Inventors: Yoshihiro Ikefuji, Kyoto (JP); Takeshi Seike, Kyoto (JP); Yusuke Yoshii, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 490 days.

(21) Appl. No.: 15/755,284

(22) PCT Filed: Jul. 15, 2016

(86) PCT No.: PCT/JP2016/070964
§ 371 (c)(1),
(2) Date: Feb. 26, 2018

(87) PCT Pub. No.: WO2017/033614
PCT Pub. Date: Mar. 2, 2017

(65) Prior Publication Data
US 2018/0262049 A1    Sep. 13, 2018

(30) Foreign Application Priority Data

Aug. 26, 2015  (JP) .............................. JP2015-166841
Aug. 26, 2015  (JP) .............................. JP2015-166843
Sep. 16, 2015  (JP) .............................. JP2015-183026

(51) Int. Cl.
*H02J 50/12* (2016.01)
*H02J 50/60* (2016.01)
(Continued)

(52) U.S. Cl.
CPC .............. *H02J 50/12* (2016.02); *H02J 7/025* (2013.01); *H02J 50/60* (2016.02); *H03F 3/2176* (2013.01); *H02J 50/80* (2016.02)

(58) Field of Classification Search
CPC .. H02J 50/12; H02J 50/05; H02J 50/60; H02J 50/80; H02J 7/025; H02J 7/00034; H03F 3/2176
(Continued)

(56) References Cited

U.S. PATENT DOCUMENTS

2012/0306284 A1    12/2012  Lee et al.
2013/0015719 A1*   1/2013  Jung .................... H04B 5/0037
                                                    307/104
(Continued)

FOREIGN PATENT DOCUMENTS

JP    2014033504 A    2/2014
JP    2014519798 A    8/2014
(Continued)

OTHER PUBLICATIONS

International Search Report corresponding to Application No. PCT/JP2016/070964; dated Sep. 27, 2016.
(Continued)

*Primary Examiner* — Richard Isla
*Assistant Examiner* — Manuel Hernandez
(74) *Attorney, Agent, or Firm* — Cantor Colburn LLP

(57) ABSTRACT

This power transmission apparatus transmits power to a power reception apparatus by means of a magnetic field resonance system by supplying an output AC voltage ($V_E$) of a class E amplifier to a power-transmission side resonance circuit (TT). Before the transmission of power, the output AC voltage ($V_E$) of the class E amplifier is divided, and a voltage obtained by the division is supplied to the power-transmission side resonance circuit (TT). A current ampli-
(Continued)

tude detection value of a power-transmission side coil ($T_L$) at this time is obtained as an evaluation value, and whether to permit execution of power transmission is controlled on the basis of the evaluation value, through determination as to whether a foreign object is present or not.

28 Claims, 29 Drawing Sheets

(51) Int. Cl.
  *H02J 7/02* (2016.01)
  *H03F 3/217* (2006.01)
  *H02J 50/80* (2016.01)
(58) Field of Classification Search
  USPC .......................................... 320/108; 307/104
  See application file for complete search history.

(56) References Cited

U.S. PATENT DOCUMENTS

| | | |
|---|---|---|
| 2014/0015329 A1 | 1/2014 | Widmer et al. |
| 2014/0015522 A1 | 1/2014 | Widmer et al. |
| 2014/0035521 A1 | 2/2014 | Endo |
| 2015/0054345 A1 | 2/2015 | Monat et al. |
| 2016/0013683 A1 | 1/2016 | Endo |
| 2016/0087481 A1* | 3/2016 | Jiang ...................... H02J 50/10 320/108 |
| 2016/0126749 A1 | 5/2016 | Shichino |
| 2016/0322868 A1* | 11/2016 | Akuzawa ................ H02J 50/40 |
| 2017/0141604 A1* | 5/2017 | Park ...................... B60L 53/126 |
| 2017/0141606 A1* | 5/2017 | Yamanishi ............ H02J 7/0044 |
| 2017/0328740 A1 | 11/2017 | Widmer et al. |

FOREIGN PATENT DOCUMENTS

| | | |
|---|---|---|
| JP | 2015027239 A | 2/2015 |
| WO | 2014011776 A1 | 1/2014 |
| WO | 2015016334 A1 | 2/2015 |
| WO | 2015097807 A1 | 7/2015 |

OTHER PUBLICATIONS

Extended European Search Report corresponding to Application No. 16838961.7-1202/3331129 PCT/JP2016070964; dated Nov. 20, 2018.

\* cited by examiner

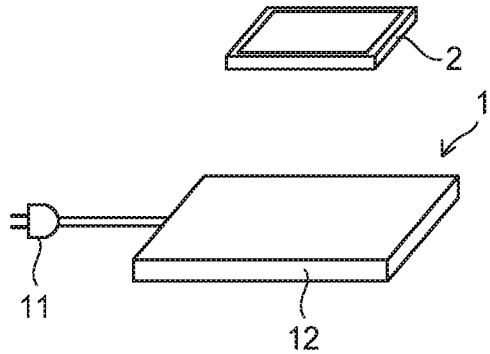
FIG.1A DETACHED STATE
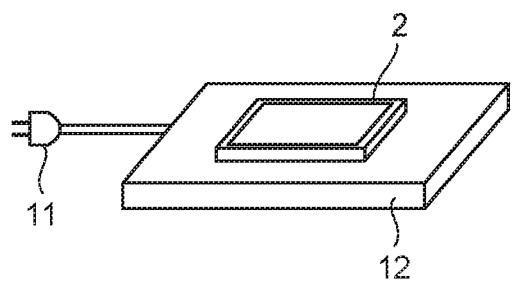
FIG.1B REGULARLY PLACED STATE
FIG.2
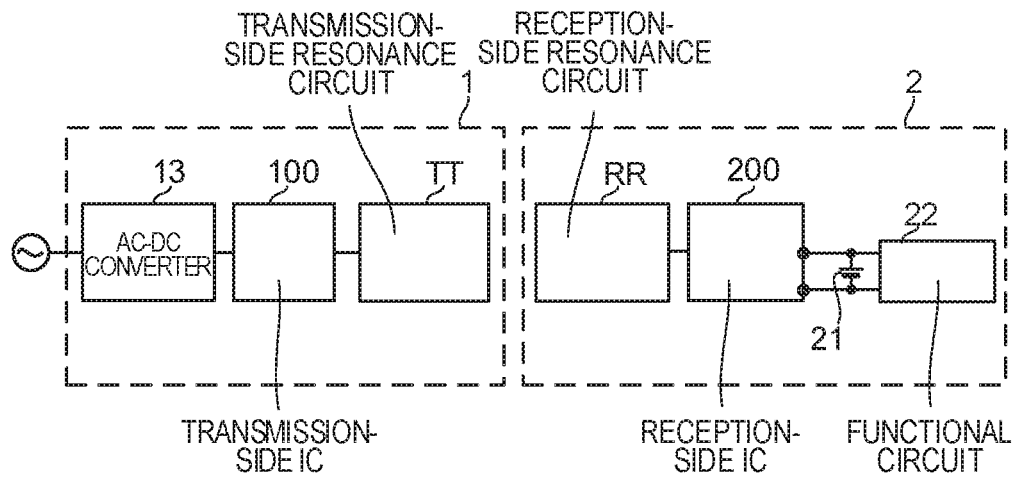
FIG.3
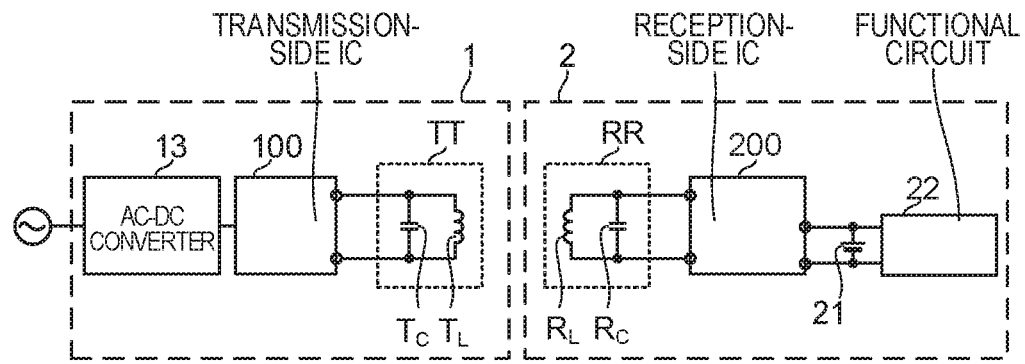

VOLTAGE DROP ACROSS
SENSE RESISTOR

DIRECT-CONNECTED STATE

DIVIDED-VOLTAGE STATE

FIG.17A  FIG.17B  FIG.17C  FIG.17D
1ST CASE   2ND CASE   3RD CASE   4TH CASE
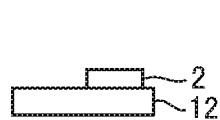
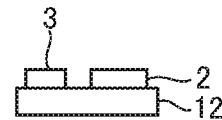
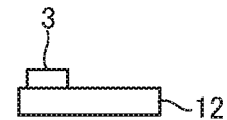
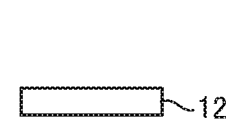
FIG.18
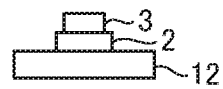
FIG.19
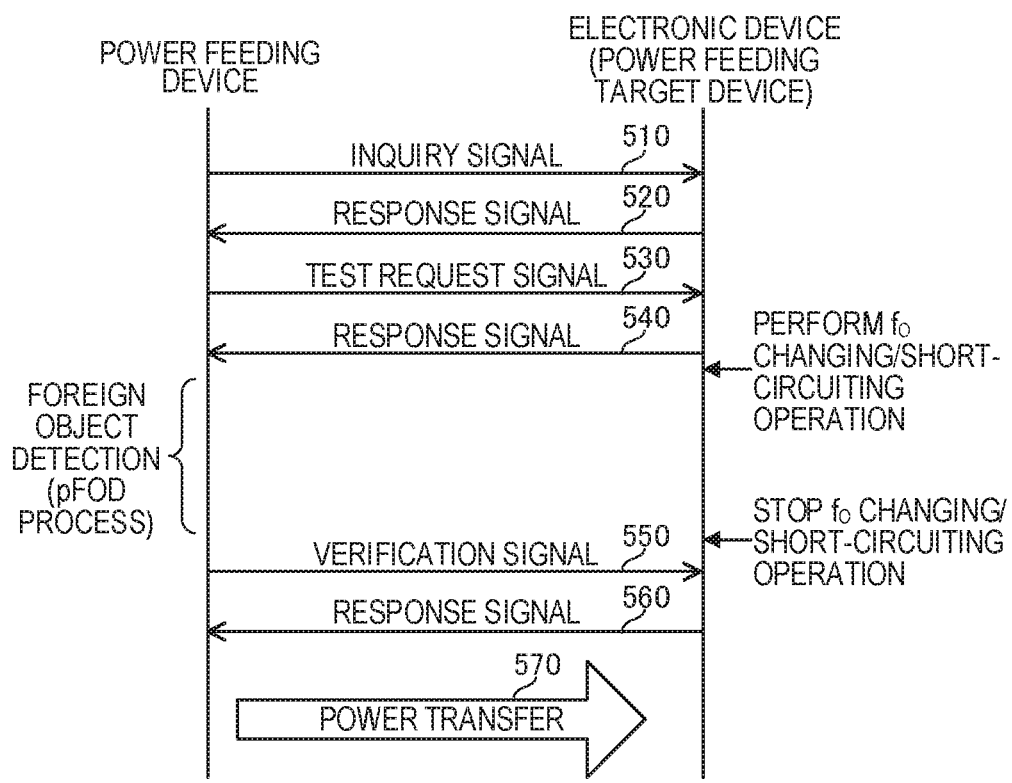

FIG.25

| OUTPUT STATE OF CLASS-E AMPLIFIER | VT1 (VOLTS) | | VT2 (A-D VALUE) | | DELTA | $R_{VT2}$ |
|---|---|---|---|---|---|---|
| | 1ST EXPERIMENTAL CONDITION $VT1_A$ | 2ND EXPERIMENTAL CONDITION $VT1_B$ | 1ST EXPERIMENTAL CONDITION $VT2_A$ | 2ND EXPERIMENTAL CONDITION $VT2_B$ | | |
| 1ST | 0.78 | 0.88 | 162 | 169 | 7 | 4.3% |
| 2ND | 0.86 | 1.10 | 226 | 230 | 4 | 1.8% |
| 3RD | 1.06 | 1.30 | 234 | 234 | 0 | 0.0% |
| 4TH | 1.35 | 1.46 | 245 | 234 | −11 | −4.5% |
| 5TH | 2.00 | 2.15 | 427 | 357 | −70 | −16.4% |
| 6TH | 3.00 | 2.72 | 472 | 388 | −84 | −17.8% |
| 7TH | 4.00 | 3.56 | 522 | 424 | −98 | −18.8% |
| 8TH | 5.00 | 4.32 | 579 | 469 | −110 | −19.0% |
| 9TH | 6.00 | 5.24 | 636 | 518 | −118 | −18.6% |
| 10TH | 7.00 | 6.24 | 681 | 567 | −114 | −16.7% |
| 11TH | 8.00 | 6.92 | 704 | 604 | −100 | −14.2% |
| 12TH | 9.00 | 7.72 | 725 | 658 | −67 | −9.2% |
| 13TH | 10.00 | 8.72 | 754 | 736 | −18 | −2.4% |
| 14TH | 10.30 | 8.88 | 762 | 761 | −1 | −0.1% |

1ST EXPERIMENTAL CONDITION: WITHOUT EXPERIMENTAL POWER RECEPTION BOARD
2ND EXPERIMENTAL CONDITION: WITH EXPERIMENTAL POWER RECEPTION BOARD

VT1: AMPLITUDE OF SUPPLY VOLTAGE TO RESONANCE CIRCUIT TT (PEAK-TO-PEAK)
VT2: OUTPUT DIGITAL VALUE OF A-D CONVERTER 144 REPRESENTING $V_D$
DELTA=$VT2_B$-$VT2_A$
$R_{VT2}$=DELTA/$VT2_A$

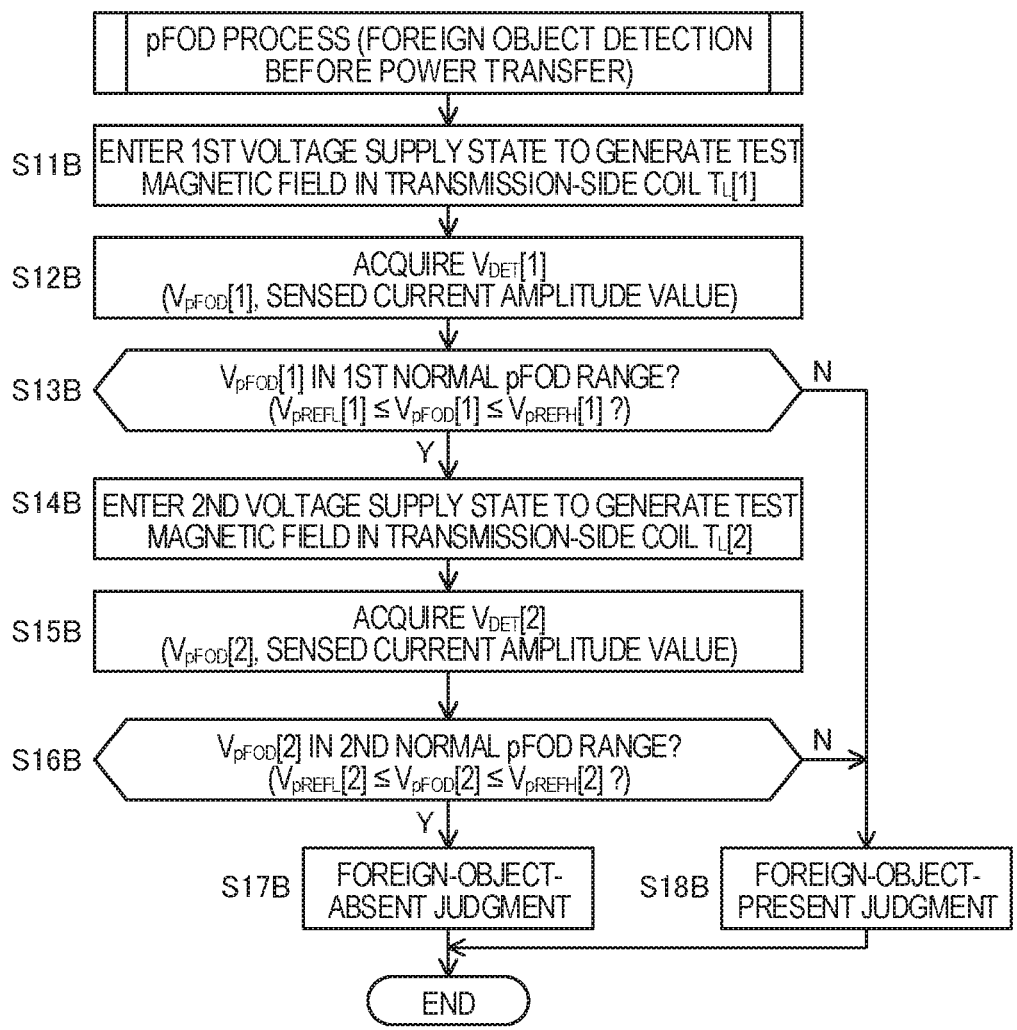

POWER TRANSMISSION DEVICE AND NON-CONTACT POWER FEEDING SYSTEM FOR TRANSMITTING ELECTRIC POWER TO POWER RECEPTION DEVICE BY MAGNETIC RESONANCE

CROSS REFERENCE TO RELATED APPLICATIONS

This is the U.S. national stage of application No. PCT/JP2016/070964, Jul. 15, 2016. Priority under 35 U.S.C. § 119(a) and 35 U.S.C. § 365(b) is claimed Japanese Application No. 2015-166843, filed Aug. 26, 2015, Japanese Application No. 2015-166841, filed Aug. 26, 2015, and Japanese Application No. 2015-183026, filed Sep. 16, 2015, the disclosures of which are also incorporated herein by reference.

TECHNICAL FIELD

The present invention relates to a power transmission device and a non-contact power feeding system.

BACKGROUND ART

As a kind of close-range wireless communication, there is known wireless communication by NFC (near-field communication), which uses a carrier frequency of 13.56 MHz. On the other hand, there have been proposed technologies that utilize a coil used for NFC communication to achieve non-contact power feeding by magnetic resonance.

In non-contact power feeding by magnetic resonance, a transmission-side resonance circuit including a transmission-side coil is arranged in a power feeding device, and a reception-side resonance circuit including a reception-side coil is arranged in an electronic device as a power reception device, with the resonance frequencies of the respective resonance circuits set at a common reference frequency. When an alternating current is passed in the transmission-side coil, an alternating magnetic field at the reference frequency is produced in the transmission-side coil. This alternating magnetic field propagates to the reception-side resonance circuit that resonates at the reference frequency, causing an alternating current to pass in the reception-side coil. Thus, electric power is transferred from the transmission-side resonance circuit including the transmission-side coil to the reception-side resonance circuit including the reception-side coil.

LIST OF CITATIONS

Patent Literature

Patent Document 1: Japanese Patent Application published as No. 2014-33504

SUMMARY OF THE INVENTION

Technical Problem

Normally, only an electronic device that is compatible with a power feeding device is placed on the power feeding stage (power feeding mat, or power feeding cradle) of the power feeding device, in which case power feeding (power transfer) is performed in a desired manner. It can happen, however, that a foreign object that is incompatible with the power feeding device is placed on the power feeding stage by mistake. The foreign object here can be, for example, an object (such as a card) incorporating a wireless IC tag including a 13.56 MHz antenna coil that does not respond to NFC communication. Or it can be an electronic device that has an NFC communication function but has it disabled. For example, a smartphone, even if it has an NFC communication function, if the function is turned OFF by a software setting, can be a foreign object. Also a smartphone, even if it has an NFC communication function enabled, if it has no power receiving function, it is categorized as a foreign object.

If the power feeding device performs power transmission operation with such a foreign object placed on the power feeding stage (or if such a foreign object is placed on the power feeding stage when power feeding operation is being performed), the strong magnetic field generated in the transmission-side coil may damage the foreign object. For example, the strong magnetic field during the power transmission operation can raise the terminal voltage of a coil in the foreign object on the power feeding stage to as high as 100 V to 200 V, and if the foreign object is not designed to withstand such a high voltage, it is damaged. To prevent a foreign object from being damaged or otherwise affected, it is beneficial to detect the presence or absence of one and control power transmission accordingly. Incidentally, a sheet of iron or the like can also be a foreign object. Though depending on the carrier frequency in power transmission, the magnetic field generated in the transmission-side coil can cause a foreign object such a sheet of iron to heat up. If the degree of heating-up is such as to pose a problem, some measure has to be taken. It is beneficial to prevent a foreign object from being damaged or otherwise affected through reliable foreign object detection.

On the other hand, by using a class-E amplifier to generate the alternating-current power for magnetic field generation, it is possible to achieve high-efficiency power transfer. It is further preferable to simultaneously achieve high-efficiency power transfer using a class-E amplifier and reliable foreign object detection.

Against the background discussed above, an object of the present invention is to provide a power transmission device and a non-contact power feeding system that contribute to preventing a foreign object from being damaged or otherwise affected, or a power transmission device and a non-contact power feeding system that contribute to enhancing power-related efficiency and preventing a foreign object from being damaged or otherwise affected.

Means for Solving the Problem

A first power transmission device according to the present invention is a power transmission device that can transmit electric power to a power reception device by magnetic resonance, and includes: a transmission-side resonance circuit which includes a transmission-side coil for transmitting the electric power and which has a predetermined reference frequency as the resonance frequency; a class-E amplifier which generates an alternating-current voltage at the reference frequency by switching a direct-current voltage fed from a direct-current power source by using a periodic signal at the reference frequency; a selective voltage division circuit which is inserted between the class-E amplifier and the transmission-side resonance circuit and which feeds the transmission-side resonance circuit selectively with either the output voltage of the class-E amplifier as a power transmission alternating-current voltage or a voltage obtained by dividing the output voltage of the class-E amplifier as a test alternating-current voltage; a sensing circuit which senses the amplitude of the current passing through the transmission-side coil; and a control circuit which controls the selective voltage division circuit and thereby controls the supply voltage to the transmission-side resonance circuit. The control circuit acquires, as an evaluation value, the sensed amplitude value from the sensing circuit when the test alternating-current voltage is fed to the transmission-side resonance circuit, and controls, based on the evaluation value, whether or not to perform power transmission by feeding the power transmission alternating-current voltage to the transmission-side resonance circuit.

Specifically, for example, in the first power transmission device described above, the control circuit can judge, based on the evaluation value, the presence or absence of a foreign object which differs from the power reception device and in which a current based on the magnetic field generated in the transmission-side coil can be generated, and can control, based on the result of the judgment, whether or not to perform the power transmission.

More specifically, for example, in the first power transmission device described above, the control circuit can, on judging that no foreign object is present, permit the power transmission and, on judging that a foreign object is present, inhibit the power transmission.

For another example, in the first power transmission device described above, the control circuit can judge the presence or absence of a foreign object by judging whether or not the evaluation value falls outside a predetermined range.

For another example, in the first power transmission device described above, the class-E amplifier can include: a switching device which performs switching operation according to the periodic signal; a first coil which is interposed between the direct-current power source and the switching device; a first capacitor which is connected in parallel with the switching device; and a resonance circuit which is connected to the connection node between the switching device and the first coil and which includes a second coil and a second capacitor. The alternating-current voltage can be output via the resonance circuit.

For another example, in connection with the first power transmission device described above, the power reception device can include: a reception-side resonance circuit which includes a reception-side coil for receiving the electric power and which has the reference frequency as the resonance frequency; and a changing/short-circuiting circuit which either changes the resonance frequency of the reception-side resonance circuit from the reference frequency or short-circuits the reception-side coil. When the evaluation value is acquired, according to a signal communicated from the power transmission device, the resonance frequency of the reception-side resonance circuit can be changed or the reception-side coil can be short-circuited in the power reception device.

For another example, in the first power transmission device described above, the direct-current voltage can have a voltage value such that, when the test alternating-current voltage is fed to the transmission-side resonance circuit, the absolute value of the difference between a first value and a second value, or the ratio of the absolute value to the first or second value, is equal to or lower than a predetermined value. The first value can be the sensed amplitude value from the sensing circuit acquired when the test alternating-current voltage is fed to the transmission-side resonance circuit and in addition the power reception device is not present in a predetermined power transmission region for performing the power transmission. The second value can be the sensed amplitude value from the sensing circuit acquired when the test alternating-current voltage is fed to the transmission-side resonance circuit and in addition the power reception device is present in the power transmission region in a state where the resonance frequency of the reception-side resonance circuit is changed or the reception-side coil is short-circuited.

A first non-contact power feeding system according to the present invention is a non-contact power feeding system that includes the first power transmission device described above and a power reception device, and enables transmission and reception of the electric power between the power transmission device and the power reception device by magnetic resonance.

A second non-contact power feeding system according to the present invention is a non-contact power feeding system that includes the first power transmission device described above and a power reception device, and enables transmission and reception of the electric power between the first power transmission device and the power reception device by magnetic resonance. In addition, the power reception device includes: a reception-side resonance circuit which includes a reception-side coil for receiving the electric power and which has the reference frequency as the resonance frequency; and a changing/short-circuiting circuit which either changes the resonance frequency of the reception-side resonance circuit from the reference frequency or short-circuits the reception-side coil. When the evaluation value is acquired in the first power transmission device, according to a signal communicated from the power transmission device, the resonance frequency of the reception-side resonance circuit is changed or the reception-side coil is short-circuited.

For example, in connection with the second non-contact power feeding system described above, the direct-current voltage can have a voltage value such that, when the test alternating-current voltage is fed to the transmission-side resonance circuit, the absolute value of the difference between a first value and a second value, or the ratio of the absolute value to the first or second value, is equal to or lower than a predetermined value. The first value can be the sensed amplitude value from the sensing circuit acquired when the test alternating-current voltage is fed to the transmission-side resonance circuit and in addition the power reception device is not present in a predetermined power transmission region for performing the power transmission. The second value can be the sensed amplitude value from the sensing circuit acquired when the test alternating-current voltage is fed to the transmission-side resonance circuit and in addition the power reception device is present in the power transmission region in a state where the resonance frequency of the reception-side resonance circuit is changed or the reception-side coil is short-circuited.

A second power transmission device according to the present invention is a power transmission device that can transmit electric power to a power reception device by magnetic resonance, and includes: a transmission-side resonance circuit which includes a transmission-side coil for transmitting the electric power and which has a predetermined reference frequency as the resonance frequency; a class-E amplifier which generates a power transmission alternating-current voltage at the reference frequency by switching a direct-current voltage fed from a direct-current power source by using a periodic signal at the reference frequency; an input signal amplifier which generates and outputs a test alternating-current voltage at the reference frequency by amplifying an input alternating-current voltage at the reference frequency; a selection circuit which feeds the transmission-side resonance circuit selectively with either the power transmission alternating-current voltage or the test alternating-current voltage; a sensing circuit which senses the amplitude of the current passing through the transmission-side coil; and a control circuit which controls the selection circuit and thereby controls the supply voltage to the transmission-side resonance circuit. The control circuit acquires, as an evaluation value, the sensed amplitude value from the sensing circuit when the test alternating-current voltage is fed to the transmission-side resonance circuit, and controls, based on the evaluation value, whether or not to perform power transmission by feeding the power transmission alternating-current voltage to the transmission-side resonance circuit.

Specifically, for example, in the second power transmission device described above, the control circuit can judge, based on the evaluation value, the presence or absence of a foreign object which differs from the power reception device and in which a current based on the magnetic field generated in the transmission-side coil can be generated, and can control, based on the result of the judgment, whether or not to perform the power transmission.

More specifically, for example, in the second power transmission device described above, the control circuit can, on judging that there is no foreign object, permit the power transmission and, on judging that there is a foreign object, inhibit the power transmission.

For another example, in the second power transmission device described above, the control circuit can judge the presence or absence of a foreign object by judging whether or not the evaluation value falls outside a predetermined range.

For another example, in the second power transmission device described above, the class-E amplifier can include: a switching device which performs switching operation according to the periodic signal; a first coil which is interposed between the direct-current power source and the switching device; a first capacitor which is connected in parallel with the switching device; and a resonance circuit which is connected to the connection node between the switching device and the first coil and which includes a second coil and a second capacitor. The alternating-current voltage can be output via the resonance circuit.

For another example, in the second power transmission device described above, the amplitude of the test alternating-current voltage can be smaller than the amplitude of the power transmission alternating-current voltage.

For another example, in the second power transmission device described above, the periodic signal to the class-E amplifier and the input alternating-current voltage to the input signal amplifier can be generated based on a common signal having the reference frequency.

For another example, in connection with the second power transmission device described above, the power reception device can include: a reception-side resonance circuit which includes a reception-side coil for receiving the electric power and which has the reference frequency as the resonance frequency; and a changing/short-circuiting circuit which either changes the resonance frequency of the reception-side resonance circuit from the reference frequency or short-circuits the reception-side coil. When the evaluation value is acquired, according to a signal communicated from the power transmission device, the resonance frequency of the reception-side resonance circuit can be changed or the reception-side coil can be short-circuited in the power reception device.

A third non-contact power feeding system according to the present invention is a non-contact power feeding system that includes the second power transmission device described above and a power reception device, and enables transmission and reception of the electric power between the second power transmission device and the power reception device by magnetic resonance.

A fourth non-contact power feeding system according to the present invention is a non-contact power feeding system that includes the second power transmission device described above and a power reception device, and enables transmission and reception of the electric power between the second power transmission device and the power reception device by magnetic resonance. In addition, the power reception device includes: a reception-side resonance circuit which includes a reception-side coil for receiving the electric power and which has the reference frequency as the resonance frequency; and a changing/short-circuiting circuit which either changes the resonance frequency of the reception-side resonance circuit from the reference frequency or short-circuits the reception-side coil. When the evaluation value is acquired in the second power transmission device, according to a signal communicated from the second power transmission device, the resonance frequency of the reception-side resonance circuit is changed or the reception-side coil is short-circuited.

A third power transmission device according to the present invention is a power transmission device that can transmit electric power to a power reception device by magnetic resonance, and includes: a plurality of transmission-side resonance circuits which include a plurality of transmission-side coils respectively; a power transmission circuit which can feed an alternating-current voltage to each of the transmission-side resonance circuits; a sensing circuit which senses the current passing through each of the transmission-side coils; and a control circuit which controls transmission of the electric power by controlling the supply state of the alternating-current voltage to each of the transmission-side resonance circuits. The plurality of transmission-side coils included in the plurality of transmission-side resonance circuits have different sizes from each other. The control circuit starts the power transmission by feeding the alternating-current voltage to the plurality of transmission-side resonance circuits and thereafter controls whether or not to continue the power transmission based on a plurality of sensed amplitude values sensed by the sensing circuit with respect to the plurality of transmission-side coils.

Specifically, for example, in the third power transmission device described above, when the power transmission is being performed, the control circuit can control whether or not to continue the power transmission by monitoring, for the transmission-side coils respectively, whether or not the sensed amplitude values fall outside a predetermined reference range.

More specifically, for example, in the third power transmission device described above, when the power transmission is being performed, the control circuit can stop the power transmission if the sensed amplitude value from at least one transmission-side coil out of the plurality of transmission-side coils falls outside the reference range.

For another example, in the third power transmission device described above, when the power transmission is being performed, the control circuit can judge, for the transmission-side coils respectively, whether or not the sensed amplitude values fall outside the reference range and thereby judge the presence or absence of a foreign object which differs from the power reception device and in which a current based on the magnetic field generated in the transmission-side coils can be generated, and can stops the power transmission on judging that a foreign object is present.

In that case, for example, in the third power transmission device described above, when the power transmission is being performed, the control circuit can judge, for the transmission-side coils respectively, whether or not the sensed amplitude values exceed the upper limit value of the reference range and thereby judge the presence or absence of, as the foreign object, a foreign object including a coil.

For another example, in the third power transmission device described above, the reference range can be set for each of the transmission-side coils.

For another example, in the third power transmission device described above, the plurality of transmission-side resonance circuits can include at least a first transmission-side resonance circuit and a second transmission-side resonance circuit. When the power transmission is being performed, from the power transmission circuit, a predetermined first alternating-current voltage can be fed to the first transmission-side resonance circuit and a second alternating-current voltage lower than the first alternating-current voltage can be fed to the second transmission-side resonance circuit.

In that case, for example, in the third power transmission device described above, when the power transmission is being performed, a division voltage of the first alternating-current voltage can be fed, as the second alternating-current voltage, to the second transmission-side resonance circuit.

A fifth non-contact power feeding system according to the present invention is a non-contact power feeding system that includes the third power transmission device described above and a power reception device, and enables transmission and reception of the electric power between the third power transmission device and the power reception device by magnetic resonance.

In the fifth non-contact power feeding system described above, for example, the power reception device can include: a reception-side resonance circuit which includes a reception-side coil for receiving the electric power; and a changing/short-circuiting circuit which can, prior to reception of the electric power from the third power transmission device, either change the resonance frequency of the reception-side resonance circuit from the reference frequency or short-circuit the reception-side coil. The control circuit can, in a state where the resonance frequency of the reception-side resonance circuit is changed or the reception-side coil is short-circuited in the power reception device according to a signal communicated from the third power transmission device, prior to the power transmission, have a third alternating-current voltage lower than the first alternating-current voltage fed to the plurality of transmission-side resonance circuits sequentially to acquire from the sensing circuit a plurality of pre-transmission sensed amplitude values with respect to the plurality of transmission-side coils, and can permit or restrict the start of the power transmission based on the plurality of pre-transmission sensed amplitude values.

A sixth non-contact power feeding system according to the present invention is a non-contact power feeding system that includes the third power transmission device described above and a power reception device, and enables transmission and reception of the electric power between the third power transmission device and the power reception device by magnetic resonance. In addition, the power reception device includes a reception-side resonance circuit which includes a reception-side coil for receiving electric power. The size of the reception-side coil is equal to the size of the transmission-side coil in the first transmission-side resonance circuit, or is closer to the size of the transmission-side coil in the first transmission-side resonance circuit than to the size of the transmission-side coil in the second transmission-side resonance circuit.

Advantageous Effects of the Invention

According to the present invention, it is possible to provide a power transmission device and a non-contact power feeding system that contribute to preventing a foreign object from being damaged or otherwise affected, or a power transmission device and a non-contact power feeding system that contribute to enhancing power-related efficiency and preventing a foreign object from being damaged or otherwise affected.

BRIEF DESCRIPTION OF DRAWINGS

FIG. 1A and FIG. 1B are each a schematic exterior view of a power feeding device and an electronic device according to a first embodiment of the present invention;

FIG. 2 is a schematic internal configuration diagram of the power feeding device and the electronic device according to the first embodiment of the present invention;

FIG. 3 is a schematic internal configuration diagram of the power feeding device and the electronic device according to the first embodiment of the present invention;

FIG. 17A to FIG. 17D are diagrams showing examples of the arrangement relationship among a power feeding stage, an electronic device, and a foreign object;

FIG. 18 is a diagram showing an arrangement relationship among a power feeding stage, an electronic device, and a foreign object;

FIG. 19 is a diagram illustrating the exchange of signals between the power feeding device and the electronic device according to the first embodiment of the present invention;

FIG. 25 is a diagram showing the results of experiments conducted with a non-contact power feeding system according to the first embodiment of the present invention;

FIG. 38 is a diagram showing the relationship between the states of switches and a plurality of voltages in the circuit shown in FIG. 37 according to the third embodiment of the present invention;

FIG. 39 is an operation flow chart of a pFOD process performed in the power feeding device according to the third embodiment of the present invention;

DESCRIPTION OF EMBODIMENTS

Figure 4:
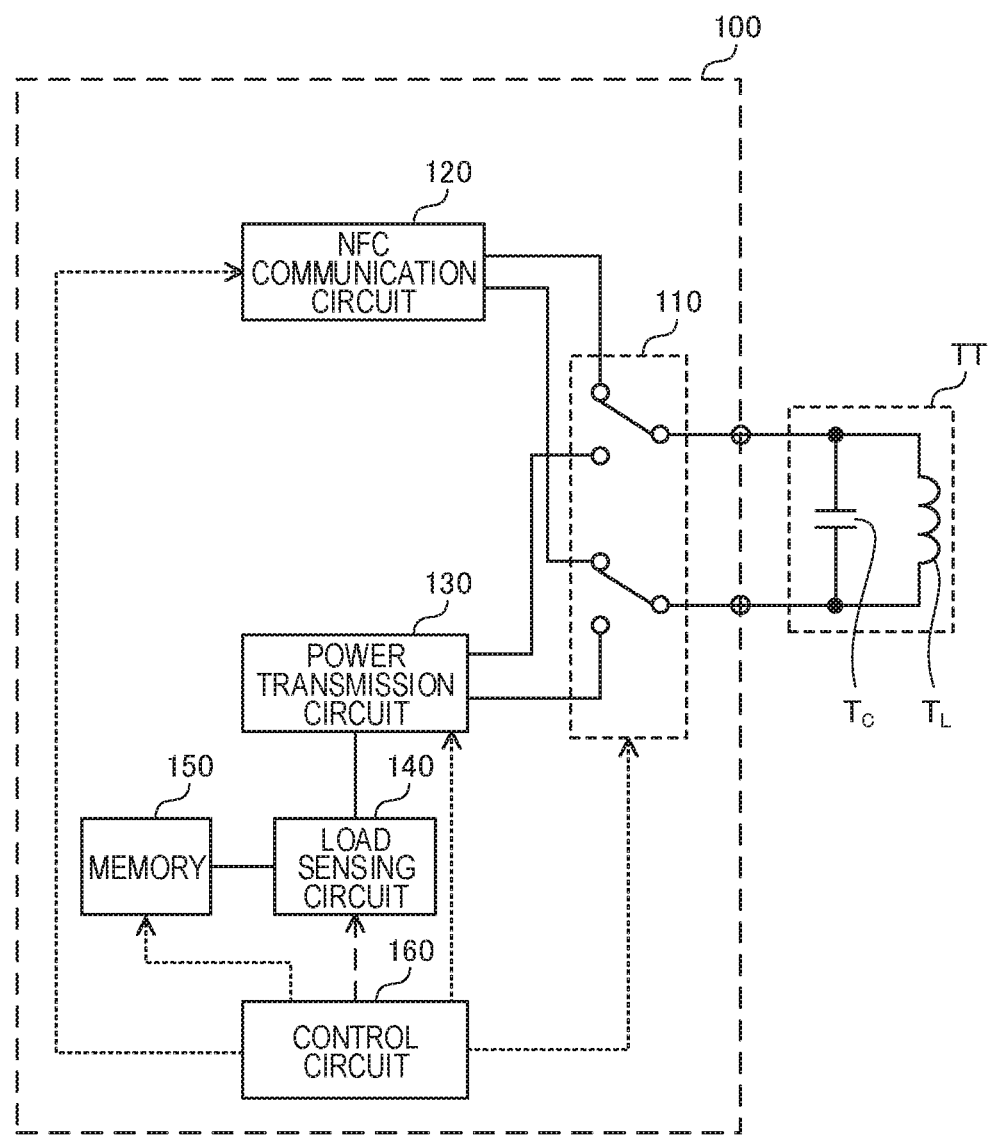
FIG. 4 is a configuration diagram of a part of the power feeding device, including an internal block diagram of an IC in the power feeding device, according to the first embodiment of the present invention.

Embodiments of the present invention will be described specifically below with reference to the accompanying drawings. Among the drawings referred to in the course, the same parts are identified by the same reference numerals, and in principle no overlapping description as to the same parts will be repeated. In the present description, for the sake of simple description, symbols and other designations referring to information, signals, physical quantities, states, components, and the like are occasionally used with the names of the corresponding information, signals, physical quantities, states, components, and the like omitted or abbreviated. In any flow chart referred to later, any plurality of processes in any plurality of steps can be performed in any modified order, or concurrently, so long as they do not conflict with each other.

First Embodiment

A first embodiment of the present invention will be described. FIG. 1A and FIG. 1B are schematic exterior views of a power feeding device 1 and an electronic device 2 according to the first embodiment of the present invention. While FIG. 1A is an exterior view of the power feeding device 1 and the electronic device 2 as they are in a detached state, FIG. 1B is an exterior view of the power feeding device 1 and the electronic device 2 as they are in a regularly placed state. The significance of the detached state and the regularly placed state will be described in detail later. The power feeding device 1 and the electronic device 2 together constitute a non-contact power feeding system. The power feeding device 1 includes a power plug 11 for receiving commercial alternating-current electric power and a power feeding stage 12 formed of a resin material.

FIG. 2 is a schematic internal configuration diagram of the power feeding device 1 and the electronic device 2. The power feeding device 1 includes: an AC-DC converter 13 which generates and yields, from a commercial alternating-current voltage fed to it via the power plug 11, a direct-current voltage with a predetermined voltage value; a transmission-side IC 100 (hereinafter referred to also as the "IC 100") which is an integrated circuit that operates by using the output voltage of the AC-DC converter 13; and a transmission-side resonance circuit TT (hereinafter referred to also as the "resonance circuit TT") which is connected to the IC 100. The AC-DC converter 13, the transmission-side IC 100, and the resonance circuit TT can be arranged inside the power feeding stage 12. Other than the IC 100, any circuit that operates by using the output voltage of the AC-DC converter 13 can be provided in the power feeding device 1.

The electronic device 2 includes: a reception-side IC 200 (hereinafter referred to also as the "IC 200") which is an integrated circuit; a reception-side resonance circuit RR (hereinafter referred to also as the "resonance circuit RR") which is connected to the IC 200; a battery 21 which is a secondary battery; and a functional circuit 22 which operates based on the output voltage of the battery 21. As will be described in detail later, the IC 200 can feed charging electric power to the battery 21. The IC 200 may operate by using the output voltage of the battery 21, or may operate based on a voltage from any voltage source other than the battery 21. Instead, a direct-current voltage obtained by rectifying a signal for NFC communication (described in detail later) received from the power feeding device 1 may be used as the operating voltage for the IC 200. In that case, even when the battery 21 is depleted of its remaining capacity, the IC 200 can operate.

The electronic device 2 may be any electronic device, and can be, for example, a mobile telephone (including one classified as a smartphone), personal digital assistant, tablet personal computer, digital camera, MP3 player, pedometer, or Bluetooth (registered trademark) headset. The functional circuit 22 performs the functions to be performed by the electronic device 2. Accordingly, for example, in a case where electronic device 2 is a smartphone, the functional circuit 22 includes a telephony processor for conducting telephone communication with a partner device, a communication processor for exchanging information with another device across a network, and the like. For another example, in a case where the electronic device 2 is a digital camera, the functional circuit 22 includes a drive circuit for driving an image sensor, an image processing circuit for generating image data from the output signal of the image sensor, and the like. The functional circuit 22 may be taken as a circuit that is provided in a device external to the electronic device 2.

As shown in FIG. 3, the resonance circuit TT includes a coil $T_L$, which is a transmission-side coil, and a capacitor $T_C$, which is a transmission-side capacitor; the resonance circuit RR includes a coil $R_L$, which is a reception-side coil, and a capacitor $R_C$, which is a reception-side capacitor. In the following description, for concreteness' sake, unless otherwise stated, it is assumed that the transmission-side coil $T_L$ and the transmission-side capacitor $T_C$ are connected in parallel with each other to form the resonance circuit TT as a parallel resonance circuit, and that the reception-side coil $R_L$ and the reception-side capacitor $R_C$ are connected in parallel with each other to form the resonance circuit RR as a parallel resonance circuit. Instead, the transmission-side coil $T_L$ and the transmission-side capacitor $T_C$ may be connected in series with each other to form the resonance circuit TT as a serial resonance circuit, and the reception-side coil $R_L$ and the reception-side capacitor $R_C$ may be connected in series with each other to form the resonance circuit RR as a serial resonance circuit.

When the electronic device 2 is placed in a predetermined region on the power feeding stage 12 as shown in FIG. 1B, between the devices 1 and 2, communication as well as power transmission and power reception is possible by magnetic field resonance (that is, by utilizing magnetic field resonance). Magnetic field resonance is also known as magnetic field induction or the like.

The communication between the devices 1 and 2 is wireless communication by NFC communication (near-field communication) (hereinafter referred to as NFC communication), and the frequency of the carrier wave for the communication is 13.56 MHz (megahertz). In the following description, the frequency of 13.56 MHz is referred to as the reference frequency. The NFC communication between the devices 1 and 2 is conducted by magnetic field resonance utilizing the resonance circuits TT and RR, and thus the resonance frequencies of the resonance circuits TT and RR are both set at the reference frequency. However, as will be described later, the resonance frequency of the resonance circuit RR can be temporarily changed from the reference frequency.

The power transmission and power reception between the devices 1 and 2 comprise power transmission by NFC from the power feeding device 1 to the electronic device 2 and power reception by NFC in the electronic device 2. Such power transmission and power reception are collectively referred to as NFC power transfer or, simply, power transfer. Through the delivery of electric power from the coil $T_L$ to the coil $R_L$ by magnetic field resonance, power transfer is achieved on a non-contact basis.

In power transfer utilizing magnetic field resonance, passing an alternating current in the transmission-side coil $T_L$ generates an alternating magnetic field at the reference frequency in the transmission-side coil $T_L$. Then, the alternating magnetic field propagates to the resonance circuit RR which resonates (in other words, resounds) at the reference frequency, and an alternating current passes in the coil $R_L$. That is, electric power is delivered from the resonance circuit TT including the transmission-side coil $T_L$ to the resonance circuit RR including the reception-side coil $R_L$. In the following description, even though no express mention is made, unless otherwise stated, the magnetic field generated in the coil $T_L$ or $R_L$ in NFC communication or in power transfer is an alternating magnetic field that oscillates at the reference frequency.

A state where the electronic device 2 is placed in a predetermined power transmission region on the power feeding stage 12 (the power feeding device 1 and the electronic device 2 are in a predetermined positional relationship) so that NFC communication and NFC power transfer as mentioned above are possible is called the regularly placed state (see FIG. 1B). On the other hand, a state where the electronic device 2 is sufficiently away from the power feeding stage 12 so that NFC communication and power transfer mentioned above are not possible is called the detached state (see FIG. 1A). Although the power feeding stage 12 shown in FIG. 1A has a flat surface, it may instead have formed in it a depression or the like that fits the shape of the electronic device 2 to be placed on it. The regularly placed state can be understood to belong to a state where the electronic device 2 is present in a predetermined power transmission region in which power transmission/reception is possible between the power feeding device 1 and the electronic device 2 (in other words, a region in which to perform power transmission and power reception); the detached state can be understood to belong to a state where the electronic device 2 is not present in that power transmission region.

Figure 5:
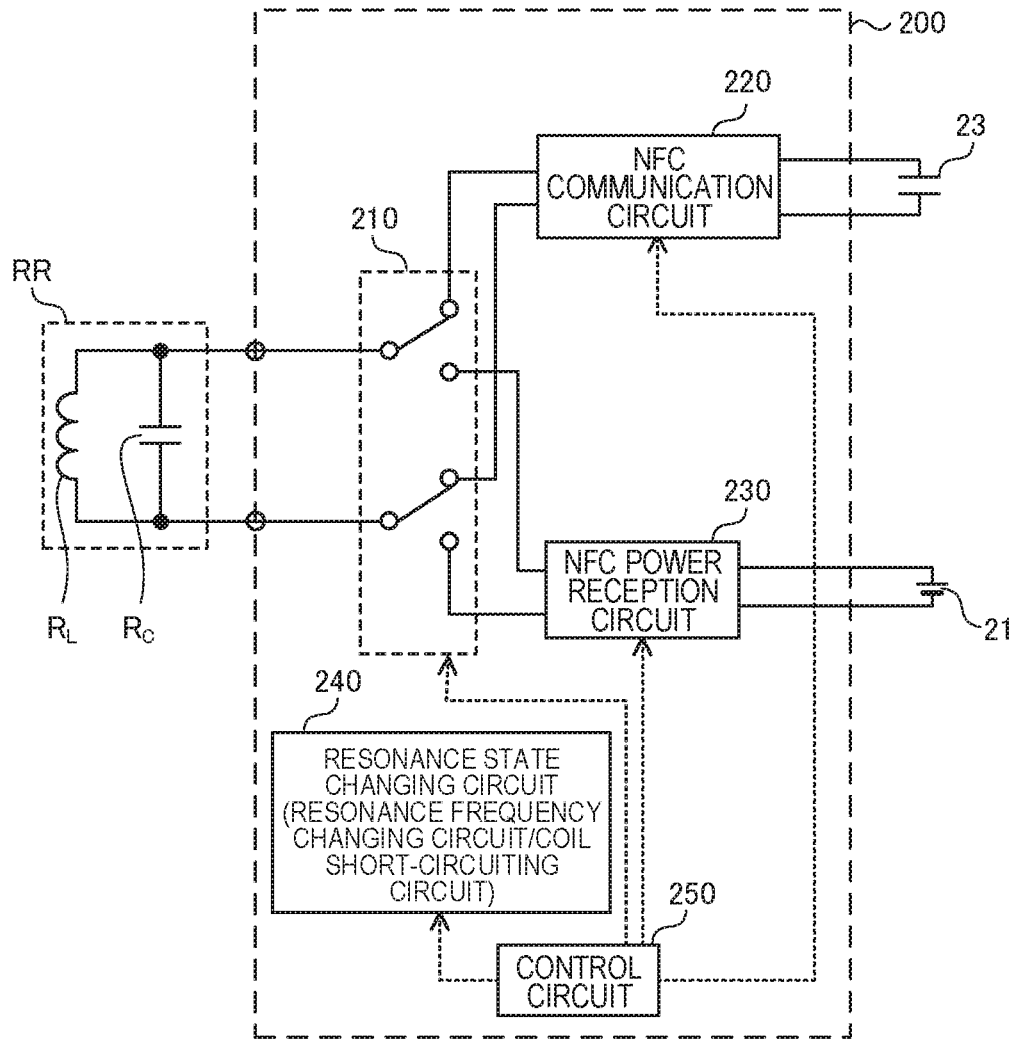
FIG. 5 is a configuration diagram of a part of the electronic device, including an internal block diagram of an IC in the electronic device, according to the first embodiment of the present invention.

FIG. 4 is a configuration diagram of a part of the power feeding device 1, including an internal block diagram of the IC 100. The IC 100 includes blocks identified by the reference signs 110, 120, 130, 140, 150, and 160. FIG. 5 is a configuration diagram of a part of the electronic device 2, including an internal block diagram of the IC 200. The IC 200 includes blocks identified by the reference signs 210, 220, 230, 240, and 250. The IC 200 may have connected to it a capacitor 23 which outputs the operating voltage for the IC 200. The capacitor 23 can output a direct-current voltage obtained by rectifying a signal for NFC communication received from the power feeding device 1.

A switch circuit 110, under the control of a control circuit 160, connects either an NFC communication circuit 120 or an NFC power transmission circuit 130 to the resonance circuit TT. The switch circuit 110 can comprise a plurality of switches provided between the resonance circuit TT and the circuits 120 and 130. Any switch mentioned in the present description can comprise a semiconductor switching device such as a field-effect transistor.

A switch circuit 210, under the control of a control circuit 250, connects the resonance circuit RR to either an NFC communication circuit 220 or an NFC power reception circuit 230. The switch circuit 210 can comprise a plurality of switches provided between the circuits 220 and 230 and the resonance circuit RR.

A state where the resonance circuit TT is connected via the switch circuit 110 to the NFC communication circuit 120 and in addition the resonance circuit RR is connected via the switch circuit 210 to the NFC communication circuit 220 is called a communication-connected state. In the communication-connected state, NFC communication is possible. In the communication-connected state, the NFC communication circuit 120 can feed an alternating signal (alternating-current voltage) at the reference frequency to the resonance circuit TT. The NFC communication between the devices 1 and 2 is performed by half-duplex operation.

In the communication-connected state, when the power feeding device 1 is on the transmitting side, the alternating-current signal that the NFC communication circuit 120 feeds to the resonance circuit TT can be superimposed with any information signal so that the information signal will be transmitted from the coil $T_L$ as a power feeding device-side antenna coil and received by the coil $R_L$ as an electronic device-side antenna coil. The information signal received by the coil $R_L$ is extracted in the NFC communication circuit 220. In the communication-connected state, when the electronic device 2 is on the transmitting side, the NFC communication circuit 220 can transmit any information signal (response signal) from the coil $R_L$ in the resonance circuit RR to the coil $T_L$ in the resonance circuit TT. The transmission here is carried out, as is well known, in conformity with an ISO standard (for example, the ISO 14443 standard), by load modulation which involves varying the impedance of the coil $R_L$ (electronic device-side antenna coil) as observed from the coil $T_L$ (power feeding device-side antenna coil).

The information signal delivered from the electronic device 2 is extracted in the NFC communication circuit 120.

A state where the resonance circuit TT is connected via the switch circuit 110 to the NFC power transmission circuit 130 and in addition the resonance circuit RR is connected via the switch circuit 210 to the NFC power reception circuit 230 is called a power feeding-connected state.

In the power feeding-connected state, the NFC power transmission circuit 130 can perform power transmission operation, and the NFC power reception circuit 230 can perform power reception operation. The power transmission operation and the power reception operation together achieve power transfer. In the power transmission operation, the power transmission circuit 130 feeds the resonance circuit TT with a power transmission alternating-current signal (power transmission alternating-current voltage) at the reference frequency to generate a power transmission magnetic field (power transmission alternating magnetic field) at the reference frequency in the transmission-side coil $T_L$; thereby electric power is transmitted from the resonance circuit TT (transmission-side coil $T_L$) to the resonance circuit RR by magnetic field resonance. The electric power received at the reception-side coil $R_L$ as a result of the power transmission operation is fed to the power reception circuit 230, so that, in the power reception operation, the power reception circuit 230 generates and yields desired direct-current electric power from the receive electric power. With the output power of the power reception circuit 230, the battery 21 can be charged.

Figure 6:
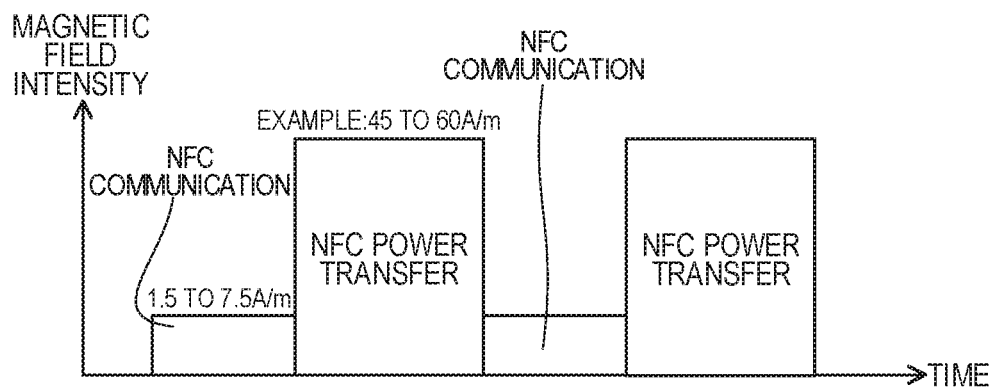
FIG. 6 is a diagram showing how magnetic field intensity changes as NFC communication and power transfer alternate.

Also when NFC communication is performed in the communication-connected state, a magnetic field is generated in the coil $T_L$ or $R_L$; however, the magnetic field intensity in NFC communication falls within a predetermined range. The lower and upper limit values of the range are prescribed in the NFC standard, being 1.5 A/m and 7.5 A/m respectively. By contrast, the intensity of the magnetic field generated in the transmission-side coil $T_L$ in power transfer (that is, in the power transmission operation) (the magnetic field intensity of the power transmission magnetic field) is higher than the just-mentioned upper limit, being, for example, about 45 to 60 A/m. In the non-contact power feeding system including the devices 1 and 2, NFC communication and power transfer (NFC power transfer) can be performed alternately, and how the magnetic field intensity behaves in such a case is shown in FIG. 6.

Figure 7:
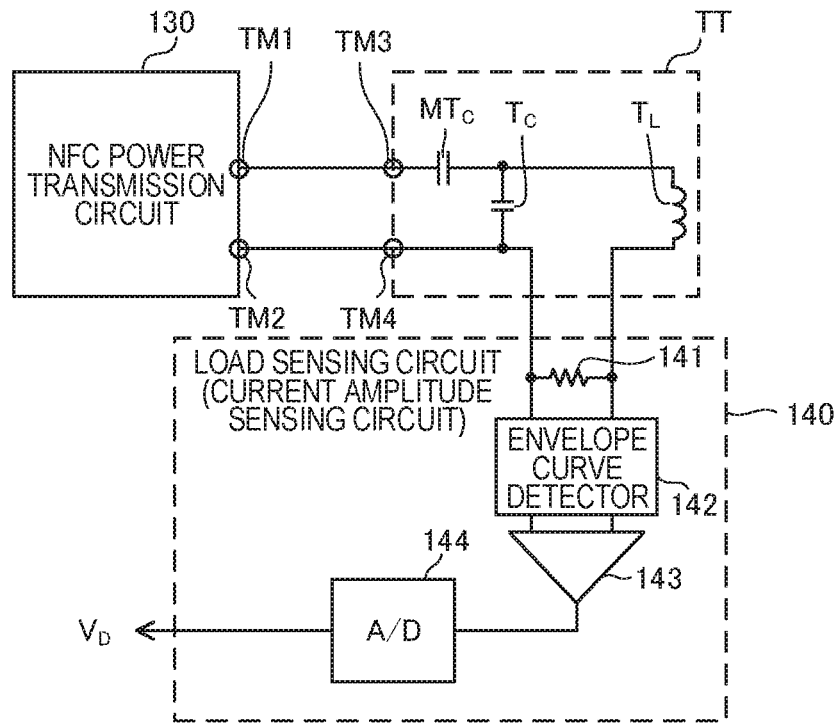
FIG. 7 is a diagram showing the relationship among a power transmission circuit, a load sensing circuit, and a resonance circuit in the power feeding device.

A load sensing circuit 140 senses the magnitude of the load of the transmission-side coil $T_L$, that is, the magnitude of the load to the transmission-side coil $T_L$ as observed when the transmission-side coil $T_L$ is fed with an alternating-current signal from the power transmission circuit 130. FIG. 7 shows the relationship among the power transmission circuit 130, the load sensing circuit 140, and the resonance circuit TT in the power feeding-connected state. It should be noted that, in FIG. 7, the switch circuit 110 is omitted from illustration (the same is true with FIG. 12, which will be referred to later).

The power transmission circuit 130 can output an alternating-current voltage between a pair of output terminals TM1 and TM2. The resonance circuit TT has a pair of input terminals TM3 and TM4, and in the power feeding-connected state, the terminals TM3 and TM4 are connected to the terminals TM1 and TM2 respectively. The resonance circuit TT has a capacitor $MT_C$ inserted in it. The capacitor $MT_C$ is an impedance matching capacitor for setting at a desired value the impedance of the resonance circuit TT as observed from the power transmission circuit 130. The desired value is here assumed to be 50Ω. In the first embodiment, unless otherwise stated, an impedance is that at the reference frequency.

The terminal TM3 is connected to one end of the capacitor $MT_C$. The other end of the capacitor $MT_C$ is connected to one end of the capacitor $T_C$ and to one end of the coil $T_L$. The other end of the coil $T_L$ is connected via a sense resistor 141 to the other end of the capacitor $T_C$ and to the terminal TM4. The load sensing circuit 140 includes the sense resistor 141, an envelope curve detector 142, an amplifier 143, and an A-D converter 144.

Figure 8:
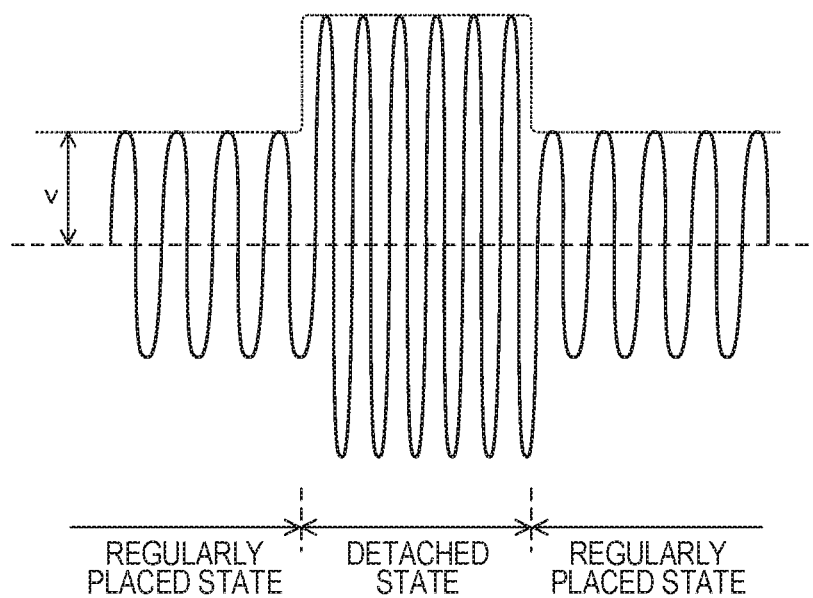
FIG. 8 is a waveform diagram of a voltage drop across a sense resistor in the load sensing circuit.

The power transmission operation is carried out by the power transmission circuit 130 feeding an alternating-current voltage (power transmission alternating-current voltage) to the resonance circuit TT (that is, between the terminals TM3 and TM4). In the power feeding-connected state, when the alternating-current voltage is fed from the power transmission circuit 130 to the resonance circuit TT, an alternating current at the reference frequency passes in the transmission-side coil $T_L$, with the result that an alternating-current voltage drop occurs across the sense resistor 141. In FIG. 8, a solid-line waveform is the voltage waveform of the voltage drop across the sense resistor 141. With respect to the resonance circuit TT, while the intensity of the magnetic field generated in the transmission-side coil $T_L$ is constant, bringing the electronic device 2 closer to the power feeding stage 12 causes a current based on the magnetic field generated in the transmission-side coil $T_L$ to pass in the reception-side coil $R_L$; simultaneously, a back electromotive force based on the current passing in the reception-side coil $R_L$ is generated in the transmission-side coil $T_L$, and this back electromotive force acts to reduce the current passing in the coil transmission-side $T_L$. Thus, as shown in FIG. 8, the amplitude of the voltage drop across the sense resistor 141 in the regularly placed state is smaller than that in the detached state.

The envelope curve detector 142 detects the envelope curve of the signal of the voltage drop across the sense resistor 141, and thereby yields an analog voltage signal that is proportional to the voltage v in FIG. 8. The amplifier 143 amplifies and then yields the output signal of the envelope curve detector 142. The A-D converter 144 coverts the output voltage signal of the amplifier 143 into a digital signal, and thereby yields a digital voltage value $V_D$. As will be understood from what has been discussed, the voltage value $V_D$ has a value that is proportional to the amplitude of the current passing in the sense resistor 141 (hence, the amplitude of the current passing in the transmission-side coil $T_L$) (as the amplitude increases, the voltage value $V_D$ increases). Accordingly, the load sensing circuit 140 can be taken as a current amplitude sensing circuit which senses the amplitude of the current passing in the transmission-side coil $T_L$, and its sensed amplitude value can be taken as the voltage value $V_D$. The envelope curve detector 142 may be provided in the stage succeeding the amplifier 143. However, providing the envelope curve detector 142 in the stage preceding the amplifier 143 as shown in FIG. 7 is more advantageous because it is then possible to adopt, as the amplifier 143, one with lower response at high frequencies.

Seen from the transmission-side coil $T_L$, which generates a magnetic field, a coil, like the reception-side coil $R_L$, that magnetically couples with the transmission-side coil $T_L$ can be taken as a load; thus, depending on the magnitude of the load, the sensing value of the load sensing circuit 140, namely the voltage value $V_D$, varies. Thus, the load sensing circuit 140 can be taken as sensing the magnitude of the load by outputting the voltage value $V_D$. Here, the magnitude of the load can be said to be the magnitude of the load to the transmission-side coil $T_L$ during power transmission, or can be said to be the magnitude of the load of the electronic device 2 as observed from the power feeding device 1 during power transmission. The sense resistor 141 may be provided inside the IC 100, or may be provided outside the IC 100.

A memory 150 (see FIG. 4) comprises a non-volatile memory, and stores any information on a non-volatile basis. The control circuit 160 controls the operation of the individual blocks in the IC 100 in a comprehensive manner. The control performed by the control circuit 160 includes, for example: controlling the switching operation of the switch circuit 110, controlling what to perform in, and whether or not to perform, the communication operation and power transfer operation by the communication circuit 120 and the power transmission circuit 130; controlling the operation of the load sensing circuit 140; and controlling writing to and reading from the memory 150. The control circuit 160 incorporates a timer (unillustrated), and can count the length of time between any time points.

In the electronic device 2, a resonance state changing circuit 240 (see FIG. 5) is a resonance frequency changing circuit which changes (can change) the resonance frequency of the resonance circuit RR from the reference frequency to another predetermined frequency $f_M$ or a coil short-circuiting circuit which short-circuits (can short-circuit) the reception-side coil $R_L$ in the resonance circuit RR.

Figure 9:
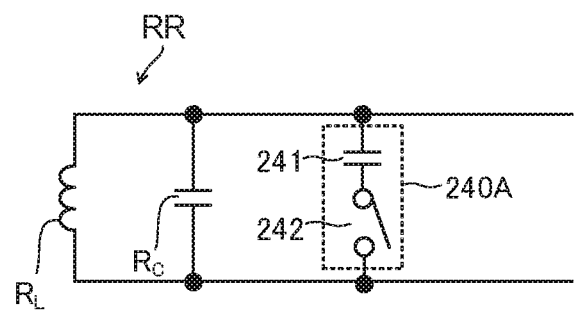
FIG. 9 is a circuit diagram showing one example of a resonance state changing circuit according to the first embodiment of the present invention.

FIG. 9 shows a resonance frequency changing circuit 240A as an example of a resonance frequency changing circuit as the resonance state changing circuit 240. The resonance frequency changing circuit 240A includes a serial circuit of a capacitor 241 and a switch 242. One end of the serial circuit is connected to both one end of the capacitor $R_C$ and one end of the coil $R_L$. The other end of the serial circuit is connected to both the other end of the capacitor $R_C$ and the other end of the coil $R_L$. The switch 242 is turned ON or OFF under the control of the control circuit 250. When the switch 242 is OFF, the capacitor 241 is disconnected from the capacitor $R_C$ and the coil $R_L$; thus, if the parasitic inductance and the parasitic capacitance are ignored, the resonance circuit RR is composed only of the coil $R_L$ and the capacitor $R_C$, and the resonance frequency of the resonance circuit RR equals the reference frequency. That is, when the switch 242 is OFF, the reception-side capacitance which determines the resonance frequency of the resonance circuit RR is that of the capacitor $R_C$ itself. When the switch 242 is ON, the capacitor 241 is connected in parallel with the capacitor $R_C$; thus, the resonance circuit RR is composed of the coil $R_L$ and the combined capacitance of the capacitors $R_C$ and 241. As a result, the resonance frequency of the resonance circuit RR equals a frequency $f_M$ lower than the reference frequency. That is, when the switch 242 is ON, the reception-side capacitance which determines the resonance frequency of the resonance circuit RR equals the just-mentioned combined capacitance. Here, it is assumed that the frequency $f_M$ is deviated from the reference frequency in such a degree that, when the switch 242 is ON, the resonance circuit RR does not act as a load to the transmission-side coil $T_L$ (that is, in such a degree that no sufficient magnetic resonance occurs between the resonance circuits TT and RR). For example, the resonance frequency of the resonance circuit RR with the switch 242 ON (that is, the frequency $f_M$) is set at several hundred kilohertz to one megahertz.

So long as the resonance frequency of the resonance circuit RR can be changed to the frequency $f_M$, the resonance frequency changing circuit as the changing circuit 240 is not limited to the resonance frequency changing circuit 240A;

the frequency $f_M$ may be higher than the reference frequency. For example, the resonance frequency changing circuit may be a circuit that switches the path between the coil $R_L$ and the capacitor $R_C$ between a connected and a disconnected state by turning ON and OFF a switch inserted in series in the current loop connecting the coil $R_L$ and the capacitor $R_C$ together (in the disconnected state, the coil $R_L$ combined with the parasitic capacitance of the wiring and the like determines the resonance frequency (>> the reference frequency) of the resonance circuit RR). Thus, with consideration given to the possibility of the reception-side resonance circuit RR being a serial resonance circuit, the following can be said: the reception-side resonance circuit RR includes a parallel or serial circuit of the reception-side coil ($R_L$) and the reception-side capacitance, and when the reception-side capacitance equals a predetermined reference capacitance, the resonance frequency $f_O$ of the reception-side resonance circuit RR equals the reference frequency. The resonance frequency changing circuit can, whenever necessary, increase or decrease the reception-side capacitance from the reference capacitance. Thus, in the reception-side resonance circuit RR, the reception-side coil ($R_L$) along with the reception-side capacitance that is higher or lower than the reference capacitance forms a parallel or serial circuit, with the result that the resonance frequency $f_O$ of the reception-side resonance circuit RR is changed from the reference frequency.

Figure 10:
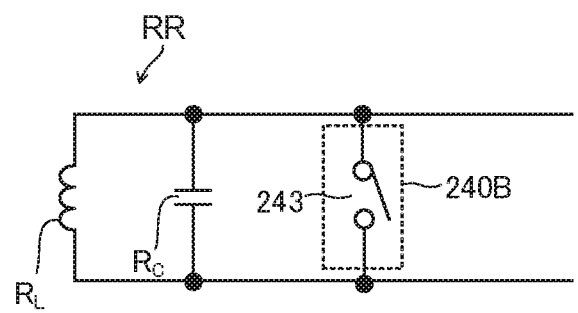
FIG. 10 is a circuit diagram showing another example of the resonance state changing circuit according to the first embodiment of the present invention.

FIG. 10 shows a coil short-circuiting circuit 240B as an example of a coil short-circuiting circuit as the resonance state changing circuit 240. The coil short-circuiting circuit 240B comprises a switch 243 connected (inserted) between the node at which one end of the capacitor $R_C$ and one end of the coil $R_L$ are connected together in the resonance circuit RR and the node at which the other end of the capacitor $R_C$ and the other end of the coil $R_L$ are connected together in the resonance circuit RR. The switch 243 is turned ON or OFF under the control of the control circuit 250. When the switch 243 is ON, the coil $R_L$ in the resonance circuit RR is short-circuited (more precisely, the coil $R_L$ is short-circuited across its terminals). With the reception-side coil $R_L$ short-circuited, the reception-side resonance circuit RR is no longer present (a state that is equivalent to a state where no reception-side resonance circuit RR is present comes into effect). Accordingly, with the reception-side coil $R_L$ short-circuited, the load to the transmission-side coil $T_L$ is sufficiently light (that is, a state as if no electronic device 2 were present on the power feeding stage 12 comes into effect). So long as the reception-side coil $R_L$ can be short-circuited, the coil short-circuiting circuit as the changing circuit 240 is not limited to the coil short-circuiting circuit 240B.

In the following description, the operation of changing the resonance frequency $f_O$ of the reception-side resonance circuit RR from the reference frequency to the predetermined frequency $f_M$ is called resonance frequency changing operation, and the operation of short-circuiting the reception-side coil $R_L$ by use of the coil short-circuiting circuit is called coil short-circuiting operation. For simplicity's sake, resonance frequency changing operation or coil short-circuiting operation is occasionally referred to as $f_O$ changing/short-circuiting operation.

The control circuit 250 (see FIG. 5) controls the operation of the individual blocks in the IC 200 in a comprehensive manner. The control performed by the control circuit 250 includes, for example: controlling the switching operation of the switch circuit 210; controlling what to perform in, and whether or not to perform, the communication operation and power reception operation by the communication circuit 220 and the power reception circuit 230; and controlling the operation of the changing circuit 240. The control circuit 250 incorporates a timer (unillustrated), and can count the length of time between any time points. For example, the timer in the control circuit 250 can count the time for which the resonance frequency $f_O$ is kept changed to the predetermined frequency $f_M$, or the time for which the reception-side coil $R_L$ is kept short-circuited, by the $f_O$ changing/short-circuiting operation (that is, it can count the time $T_M$ mentioned later; see step S207 in FIG. 22).

The control circuit 160 in the power feeding device 1 can judge the presence or absence of a foreign object on the power feeding stage 12 and control the power transmission circuit 130 to perform the power transmission operation only when no foreign object is present. In the first embodiment, a foreign object can be an object which differs from the electronic device 2 or its components (such as the reception-side coil $R_L$) and in addition in which, when it is brought close to the power feeding device 1, an electric current (an electric current inside the foreign object) can be generated based on the magnetic field generated in the transmission-side coil $T_L$. In the first embodiment, the presence of a foreign object can be understood to denote the presence of a foreign object at a position where a non-negligible electric current based on the magnetic field generated in the transmission-side coil $T_L$ passes in the foreign object. The electric current that passes in the foreign object based on the magnetic field generated in the transmission-side coil $T_L$ generates an electromotive force (or back electromotive force) in a coil (such as $T_L$ or $R_L$) located opposite and coupled with the foreign object; thus, it can exert a non-negligible effect on the characteristics of the circuit that includes that coil.

Figure 11A:
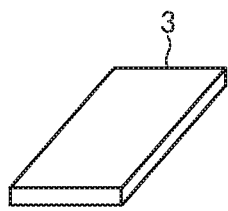
FIG. 11A and FIG. 11B are a schematic external view and a schematic internal configuration diagram, respectively, of a foreign object according to the first embodiment of the present invention.
Figure 11B:
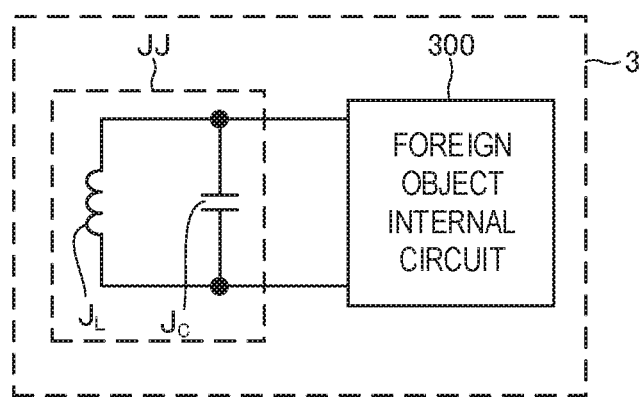

FIG. 11A is a schematic exterior view of a foreign object 3 as a kind of foreign object, and FIG. 11B is a schematic internal configuration diagram of the foreign object 3. The foreign object 3 includes: a resonance circuit JJ comprising a parallel circuit of a coil $J_L$ and a capacitor $J_C$; and a foreign object internal circuit 300 connected to the resonance circuit JJ. The resonance frequency of the resonance circuit JJ is set at the reference frequency. Unlike the electronic device 2, the foreign object 3 is a device that is incompatible with the power feeding device 1. For example, the foreign object 3 is an object (such as a non-contact IC card) fitted with a wireless IC tag including a 13.56 MHz antenna coil (coil $J_L$) that does not respond to NFC communication. For another example, the foreign object 3 is an electronic device that does have an NFC communication function itself but has it disabled. For example, a smartphone that has an NFC communication function but has it turned off by a software setting can be a foreign object 3. Even a smartphone that has an NFC communication function enabled, if it does not have a power reception function, is classified as a foreign object 3.

In a state where a foreign object 3 as mentioned above is placed on the power feeding stage 12, if the power feeding device 1 performs the power transmission operation, the strong magnetic field generated by the transmission-side coil $T_L$ (for example, a magnetic field with a magnetic field intensity of 12 A/m or more) may damage the foreign object 3. For example, the strong magnetic field in the power transmission operation can raise the terminal voltage of the coil $J_L$ in the foreign object 3 on the power feeding stage 12 to as high as 100 V to 200 V, and if the foreign object 3 is not designed to withstand such a high voltage, it is damaged.

[Configuration Example of the Power Transmission Circuit]

Figure 12:
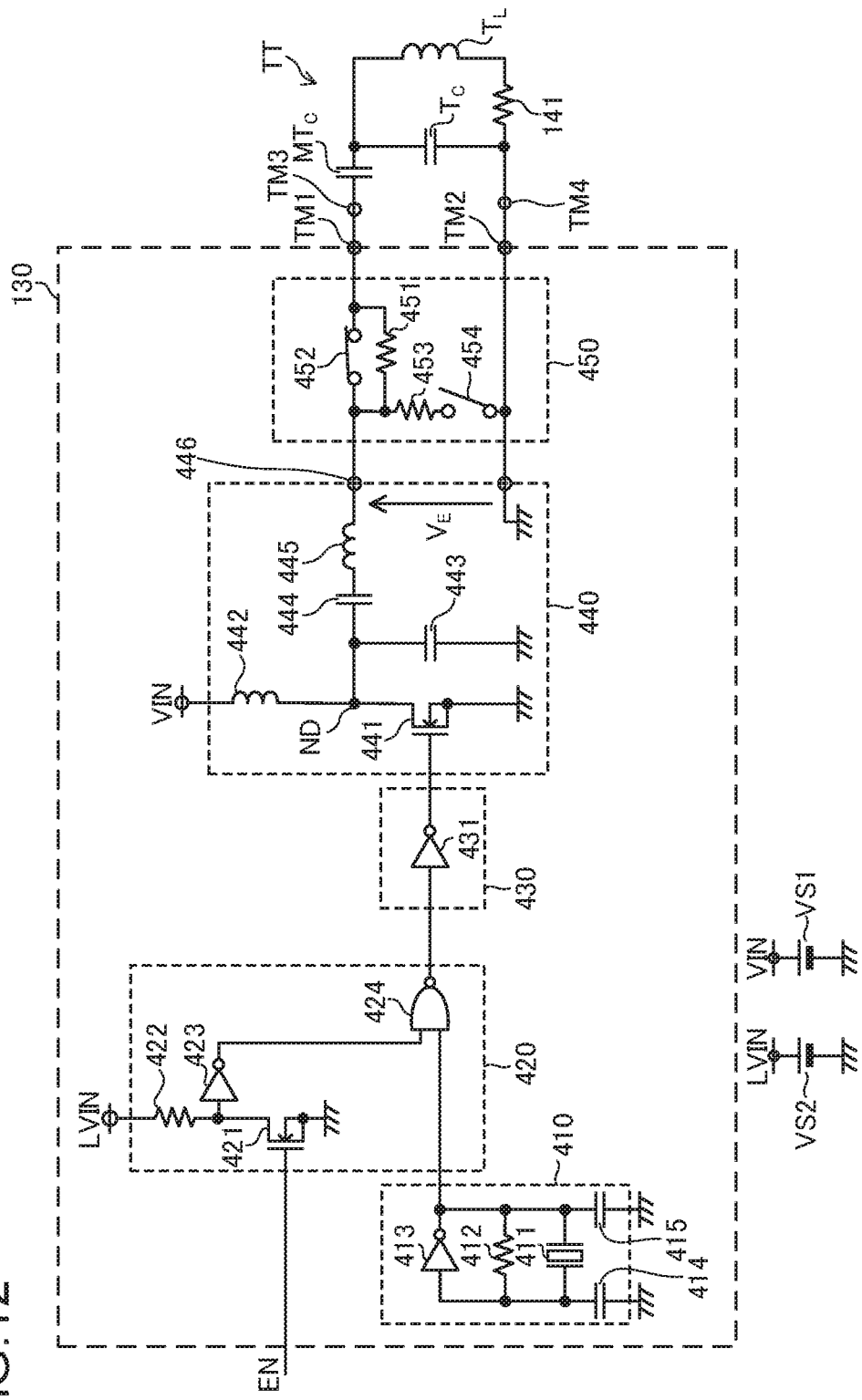
FIG. 12 is a circuit diagram of a part of the power feeding device, including a detailed circuit diagram of the power transmission circuit, according to the first embodiment of the present invention.

FIG. 12 shows a configuration example of the power transmission circuit 130 which is suitable for foreign object presence/absence detection and which operates with high efficiency. FIG. 12 also shows some circuits other than the power transmission circuit 130 that are provided in the power feeding device 1. FIG. 12, like FIG. 7, assumes the power feeding-connected state.

The power transmission circuit 130 in FIG. 12 includes: an oscillation circuit 410 which generates and outputs a clock signal that is a square-wave signal at the reference frequency; an enable circuit 420 which switches whether or not to feed a drive circuit 430 with a signal synchronous with the clock signal from the oscillation circuit 410; a drive circuit 430 which, when fed from the enable circuit 420 with the signal synchronous with the clock signal, feeds a class-E amplifier 440 with a drive signal synchronous with the clock signal and thereby drives the class-E amplifier 440; a class-E amplifier 440 which generates and outputs an alternating-current voltage $V_E$ at the reference frequency by switching a direct-current voltage VIN fed from a direct-current power source VS1 with the drive signal that is a square-wave signal at the reference frequency; and a selective voltage division circuit 450 which is inserted between the class-E amplifier 440 and the transmission-side resonance circuit TT and which feeds the resonance circuit TT selectively with either the output voltage $V_E$ of the class-E amplifier 440 or a voltage obtained by dividing the output voltage $V_E$ of the class-E amplifier 440.

To follow is a further description of an example of the circuit configuration of the blocks 410 to 450.

The oscillation circuit 410 includes blocks identified by the reference signs 411 to 415. An oscillator 411 is an oscillator which comprises a crystal oscillator or a ceramic oscillator and which yields an oscillation output at the reference frequency. A resistor 412 is connected in parallel with the oscillator 411. One end of the oscillator 411 is connected to the input terminal of an inverter circuit (logic NOT circuit) 413, and is also connected via a capacitor 414 to ground. The other end of the oscillator 411 is connected to the output terminal of the inverter circuit 413, and is also connected via a capacitor 415 to ground. Ground has a reference potential of 0 V (volts). The inverter circuit 413 yields, from its output terminal, a clock signal that is a square-wave signal at the reference frequency with a duty of 50%.

The enable circuit 420 includes blocks identified by the reference signs 421 to 424. A transistor 421 is formed as an N-channel MOSFET (metal-oxide-semiconductor field-effect transistor). Of the transistor 421, the gate is fed with an enable signal EN, the drain is connected to the input terminal of an inverter circuit 423 and is also connected via a resistor 422 to a terminal to which a direct-current voltage LVIN is applied, and the source is connected to ground. The direct-current voltages VIN and LVIN having predetermined positive direct-current voltage values are generated respectively by direct-current sources VS1 and VS2 provided in the power feeding device 1 (for example, in the IC 100). The logic circuits in the power transmission circuit 130 operate by using the direct-current voltage LVIN. A first and a second input terminal of a two-input NAND circuit (negative logical conjunction circuit) 424 are fed respectively with the output signals of the inverter circuits 413 and 423.

The drive circuit 430 comprises an inverter circuit 431. The input terminal of the inverter circuit 431 is fed with the output signal of the NAND circuit 424.

The class-E amplifier 440 includes blocks identified by the reference signs 441 to 445. A transistor 441 is formed as an N-channel MOSFET. Of the transistor 441, the gate is fed with the output signal of the inverter circuit 431, the drain is connected to a node ND, and the source is connected to ground. Of a choke coil 442, one end is connected to the node ND, and the other end is fed with the direct-current voltage VIN. Thus, the choke coil 442 is interposed in series between the direct-current voltage source VS1 and the transistor 441. The node ND is connected to one end of a capacitor 443, and the other end of the capacitor 443 is connected to ground. Thus, the capacitor 443 is connected in parallel with the transistor 441. In addition, the node ND is connected to one end of an LC resonance circuit composed of a capacitor 444 and a coil 445, so that between the other end of the LC resonance circuit, which is the output terminal 446 of the class-E amplifier 440, and ground, the output voltage $V_E$ of the class-E amplifier 440 appears. More specifically, the node ND is connected to one end of the capacitor 444, the other end of the capacitor 444 is connected to one end of the coil 445, and the other end of the coil 445 is connected to the terminal 446. The capacitor 444 and the coil 445 may be arranged the other way around.

The selective voltage division circuit 450 includes blocks identified by the reference signs 451 to 454. The terminal 446 is connected to one end of a parallel circuit of a switch 452 and a resistor 451, and the other end of the parallel circuit is connected to the terminal TM1. The terminal 446 is connected to one end of a serial circuit of a resistor 453 and a switch 454, and the other end of the serial circuit is connected to ground. The terminal TM2 is connected to ground. FIG. 12 shows the selective voltage division circuit 450 in a direct-connected state (see FIG. 14A), which will be described later.

The control circuit 160 feeds selectively either a LOW-level or HIGH-level enable signal EN to the gate of the transistor 421.

When the level of the enable signal EN fed to the gate of the transistor 421 is HIGH, the transistor 421 is ON, and thus an inverse clock signal, which is the inverted signal of the clock signal, is output from the NAND circuit 424, with the result that a drive signal, which is a square-wave signal at the reference frequency with a duty of 50%, is fed from the inverter circuit 431 to the gate of the transistor 441. The drive signal is generally the same signal as the clock signal.

When the level of the enable signal EN fed to the gate of the transistor 421 is LOW, the transistor 421 is OFF, and thus the output signal of the NAND circuit 424 is held at HIGH level, with the result that the potential at the gate of the transistor 441 is held at LOW level, and thus the transistor 441 remains OFF (accordingly, the class-E amplifier 440 stops operating, and ceases to output the alternating-current voltage).

The transistor 441 may be configured as a parallel circuit of a plurality of transistors, in which case the inverter circuit 431 may be configured as a parallel circuit of a plurality of inverter circuits. Some of the components of the power transmission circuit 130 shown in FIG. 12 (for example, the oscillator 411 and the coil in the class-E amplifier 440) can be provided outside the IC 100.

Figure 13:
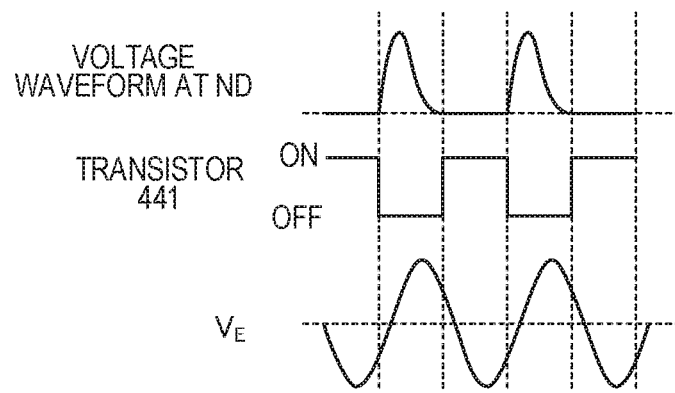
FIG. 13 is a diagram showing the waveform of signals related to a class-E amplifier.

Witt reference to FIG. 13, the operation of the class-E amplifier 440 will be described. FIG. 13 shows the waveforms of signals relevant to the class-E amplifier 440. In the following description, unless otherwise stated, it is assumed that a HIGH-level enable signal EN is being fed to the gate of the transistor 421.

The drive signal fed to the gate of the transistor 441 makes the transistor 441 perform switching operation, that is, turn ON and OFF, repeatedly. Suppose now that, during the repetition, the transistor 441 has just turned from ON to OFF. Even when the transistor 441 turns OFF, the choke coil 442 acts to keep a current passing from the choke coil 442 toward the node ND; thus, electric charge accumulates in the capacitor 443, and the potential at the node ND rises. Shortly, the potential at the node ND stops rising and starts to fall. This is because the electric charge accumulated in the capacitor 443 now flows toward the resonance circuit composed of the capacitor 444 and the coil 445.

Here, for the class-E amplifier 440 to operate with optimal efficiency (in other words, with the least loss), when the transistor 441 is turned from OFF to ON, the first and second class-E operation conditions described below have to be satisfied. The first class-E operation condition requires that, at the moment that the transistor 441 is turned from OFF to ON, the potential at the node ND equal generally 0 V. The second class-E operation condition requires that, at the moment that the transistor 441 is turned from OFF to ON, the slope of the voltage waveform at the node ND equals generally zero. When these conditions are satisfied, the alternating-current voltage $V_E$ with a sinusoidal waveform at the reference frequency is generated with low loss. The operation of generating the alternating-current voltage $V_E$ that satisfies the first and second class-E operation conditions is referred to as class-E amplification operation.

Whether or not class-E amplification operation is achieved depends on the inductances of the coils 442 and 445 and the capacitances of the capacitors 443 and 444. To make the class-E amplifier 440 operate with high efficiency (low loss) and thereby achieve high-efficiency power transfer in the system as a whole, the inductances of the coils 442 and 445 and the capacitances of the capacitors 443 and 444 can be previously so set that class-E amplification operation is achieved. More specifically, the inductances of the coils 442 and 445 and the capacitances of the capacitors 443 and 444 can be so set, for example, that class-E amplification operation is achieved when the power transmission operation is performed in the regularly placed state with the electronic device 2 placed on the power feeding stage 12, and/or that class-E amplification operation is achieved in the detached state.

Figure 14A:
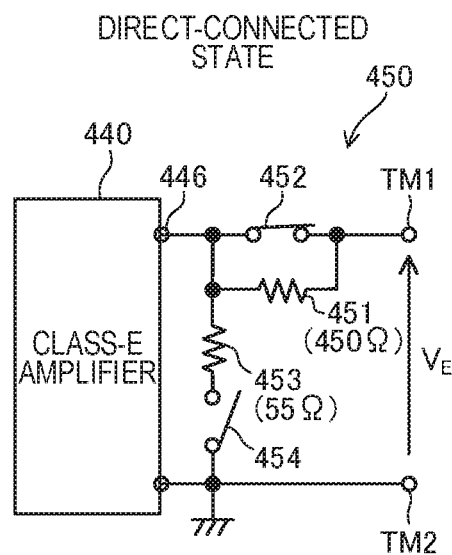
FIG. 14A and FIG. 14B are diagrams showing a direct-connected state and a divided-voltage state, respectively, of a selective voltage division circuit according to the first embodiment of the present invention.
Figure 14B:
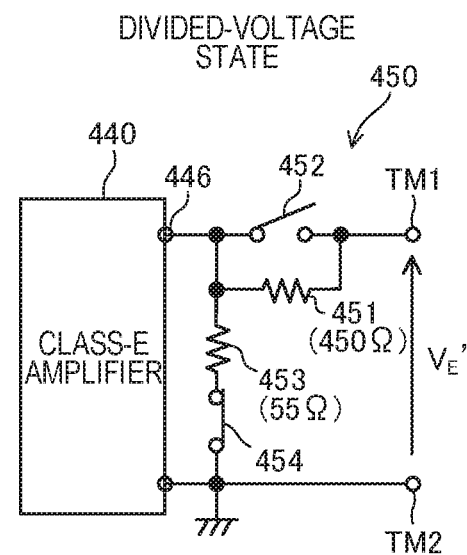

With reference to FIG. 14A and FIG. 14B, the operation and function of the selective voltage division circuit 450 will be described. The control circuit 160 can, by turning ON and OFF the switches 452 and 454 individually, switch the selective voltage division circuit 450 between a direct-connected state and a divided-voltage state. FIG. 14A and FIG. 14B shows the selective voltage division circuit 450 in the direct-connected state and in the divided-voltage state respectively. In the following description, unless otherwise stated, the direct-connected and divided-voltage states refer to those when the switch circuit 110 is in the power feeding-connected state.

In the direct-connected state, the switch 452 is ON and the switch 454 is OFF. Thus, in the direct-connected state, the output terminal 446 of the class-E amplifier 440 is connected via the terminal TM1 directly to the terminal TM3 (see also FIG. 12), with the result that the output voltage $V_E$ itself of the class-E amplifier 440 is fed to the resonance circuit TT. As mentioned earlier, owing to the impedance matching capacitor $MT_C$, the impedance value of the resonance circuit TT as observed from the power transmission circuit 130 equals 50Ω. Accordingly, in the direct-connected state, the impedance value of the selective voltage division circuit 450 and the resonance circuit TT as observed from the class-E amplifier 440 equals 50Ω, if the effect of a foreign object or the like is ignored (the effect of a foreign object or the like will be discussed later).

In the divided-voltage state, the switch 452 is OFF and the switch 454 is ON. Thus, in the power feeding-connected state and in addition in the divided-voltage state, the output terminal 446 of the class-E amplifier 440 is connected via the resistor 451 to the terminals TM1 and TM3 (see also FIG. 12), with the result that a voltage (hereinafter referred to as the division voltage $V_E'$) obtained by dividing the output voltage $V_E$ of the class-E amplifier 440 is fed to the resonance circuit TT. The resistance values of the resistors 451 and 453 are set at 450Ω and 55Ω respectively. Moreover, as mentioned earlier, owing to the impedance matching capacitor $MT_C$, the impedance value of the resonance circuit TT as observed from the power transmission circuit 130 equals 50Ω. Accordingly, in the divided-voltage state, the impedance value of the selective voltage division circuit 450 and the resonance circuit TT as observed from the class-E amplifier 440 equals "$(1/55+1/(450+50))^{-1} \approx 50$", that is, about 50Ω, if the effect of a foreign object or the like is ignored (the effect of a foreign object or the like will be discussed later). Based on the resistance values mentioned above, the amplitude of the division voltage $V_E'$ is 1/10 of the amplitude of the output voltage $V_E$. This means that the electric power that is fed from the class-E amplifier 440 to the resonance circuit TT in the divided-voltage state is 1/100 of that in the direct-connected state. It should be noted that the just-mentioned voltage division ratio (the amplitude ratio between $V_E$ and $V_E'$) is merely an example and may be changed as desired.

The power feeding device 1 can perform a foreign object detection process to detect the presence or absence of a foreign object. A foreign object detection process that is performed before power transfer is performed, in particular, is referred to as a pFOD process. When a magnetic field is being generated in the transmission-side coil $T_L$, placing a foreign object on the power feeding stage 12 causes an electric current based on the magnetic field generated in the coil $T_L$ to pass in the foreign object; the current in the foreign object generates a voltage in the resonance circuit TT, and causes a variation in the current amplitude in the transmission-side coil $T_L$ (hereinafter referred to as a detection target current amplitude variation for convenience's sake). Thus, by observing a detection target current amplitude variation, it is possible to judge the presence or absence of a foreign object. However, generating a strong magnetic field in the pFOD process may lead to, as mentioned earlier, the foreign object being damaged or otherwise affected.

One possible approach is to lower the direct-current voltage VIN in the pFOD process compared with that in the power transmission operation so that, while the lowering is in effect, the alternating-current voltage $V_E$ output from the class-E amplifier 440 is fed to the resonance circuit TT (hereinafter referred to as the lowered VIN approach). The lowered VIN approach requires a configuration, unlike that of the first embodiment, where the selective voltage division circuit 450 is omitted from the power transmission circuit 130 and the output terminal 446 of the class-E amplifier 440 is connected directly to the terminals TM1 and TM3 (see also FIG. 12). The lowered VIN approach may help avoid damaging a foreign object but, because of the use of the class-E amplifier 440 in the power transmission circuit 130 with a view to achieving high-efficiency operation, raises the following concern.

If a foreign object is present at a position where it causes a detection target current amplitude variation, due to magnetic coupling and the like between the foreign object and the transmission-side coil $T_L$, the impedance value of the resonance circuit TT as observed from the class-E amplifier 440 deviates from 50Ω. The class-E amplifier 440 is designed to perform class-E amplification operation on the assumption that the impedance value of the resonance circuit TT as observed from the class-E amplifier 440 equals 50Ω, and thus a deviation in the impedance value from 50Ω produces a variation in the output of the class-E amplifier 440 compared with that when the impedance value equals 50Ω. The variation in the output here includes a variation in the amplitude of the output voltage $V_E$ of the class-E amplifier 440 and a variation in the waveform of the output voltage $V_E$. A variation in the output of the class-E amplifier 440 resulting from a deviation in the impedance value from 50Ω causes a variation in the current amplitude in the transmission-side coil $T_L$. This variation in the current amplitude in the transmission-side coil $T_L$ resulting from a variation in the output of the class-E amplifier 440 is referred to, for convenience' sake, as a noise current amplitude variation. The presence of a noise current amplitude variation interferes with the detection of a detection target current amplitude variation which should rather be observed for foreign object detection.

If, for discussion's sake, the amount and direction of a variation in current amplitude resulting from a noise current amplitude variation are determined unequivocally, it is possible, by taking what results from the noise current amplitude variation into consideration, to perform foreign object detection by the pFOD process with high accuracy. However, in reality, depending on factors such as the kind of the foreign object and how it is placed on the power feeding stage 12, the amount and direction of a variation in current amplitude resulting from a noise current amplitude variation vary (that is, a noise current amplitude variation may cause the current amplitude in the transmission-side coil $T_L$ to increase in some cases and decrease in other cases, and by varying amounts). Thus, a noise current amplitude variation lowers the accuracy of foreign object detection by the pFOD process.

Out of these considerations, in the first embodiment, the lowered VIN approach is not adopted, but instead the effect of a noise current amplitude variation is alleviated by use of the selective voltage division circuit 450. Specifically, in the first embodiment, the voltage value of the direct-current voltage VIN is fixed, and when the power transmission operation is performed, the selective voltage division circuit 450 is kept in the direct-connected state so that the maximum electric power that the class-E amplifier 440 can output is fed to the resonance circuit TT, while, in the pFOD process, the selective voltage division circuit 450 is kept in the divided-voltage state. In the divided-voltage state, the impedance of the selective voltage division circuit 450 and the resonance circuit TT as observed from the class-E amplifier 440 is composed of an impedance component ascribable to the resistance value, 450Ω, of the resistor 451 and an impedance component (50Ω if the presence of a foreign object or the like is ignored) of the circuits in the stages succeeding the terminals TM3 and TM4. The former impedance component, which accounts for about 90%, is constant irrespective of the presence or absence of a foreign object, and thus, in the divided-voltage state, a variation ascribable to the presence of a foreign object in the impedance value (the impedance value of the resonance circuit TT as observed from the class-E amplifier 440) is about ⅒ of that in the direct-connected state. Thus, the effect of a noise current amplitude variation on a detection target current amplitude variation in the divided-voltage state is about ⅒ of that in the direct-connected state. Needless to say, the values mentioned above such as "⅒" change as the voltage division ratio (the amplitude ratio between $V_E$ and $V_E'$) changes.

[pFOD Process (pFOD Process Before Power Transfer)]

Figure 15:
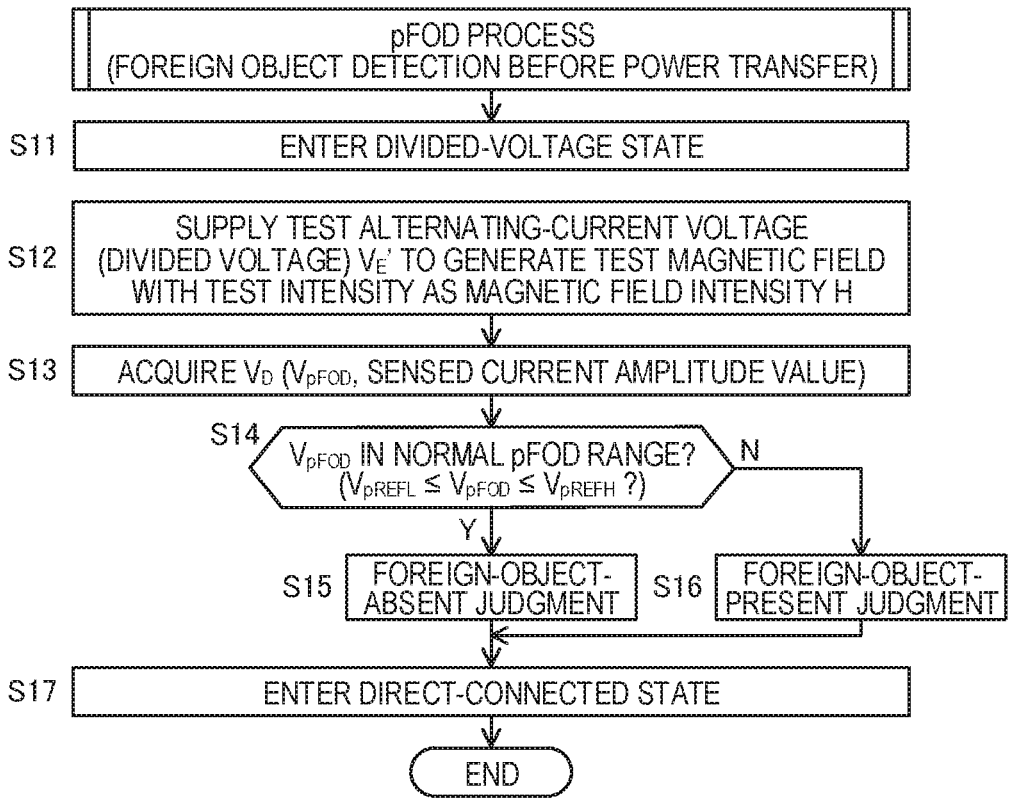
FIG. 15 is an operation flow chart of a pFOD process performed in the power feeding device according to the first embodiment of the present invention.

With reference to FIG. 15, a pFOD process based on what has been discussed above will be described. FIG. 15 is a flow chart of the pFOD process.

When the pFOD process is performed, the power transmission circuit 130 is connected to the resonance circuit TT. Then, first, at step S11, the divided-voltage state is put into effect. Thus, at step S12, the division voltage $V_E'$ is, as a test alternating-current voltage, fed from the class-E amplifier 440 via the selective voltage division circuit 450 to the resonance circuit TT, with the result that a test magnetic field with a predetermined test intensity as its magnetic field intensity H is generated in the transmission-side coil $T_L$. The magnetic field intensity H is the magnetic field intensity of the magnetic field generated in the transmission-side coil $T_L$, and more precisely it is the magnetic field intensity of the alternating magnetic field generated by the transmission-side coil $T_L$ and oscillating at the reference frequency. The test intensity, which is the magnetic field intensity of the test magnetic field, is significantly lower than the intensity of the magnetic field generated in the transmission-side coil $T_L$ in power transfer (that is, in the power transmission operation) (that is, the magnetic field intensity of the power transmission magnetic field; for example, 45 to 60 A/m), and falls, for example, within the range between the lower limit value, 1.5 A/m, and the upper limit value, 7.5 A/m, of communication magnetic field intensity. Thus, there is no or almost no danger of the test magnetic field damaging or otherwise affecting the foreign object 3.

Subsequently to step S12, at step S13, by using the load sensing circuit 140, the control circuit 160 acquires, as a sensed current amplitude value $V_{pFOD}$, the voltage value $V_D$ as observed when the test magnetic field is being generated. The sensed current amplitude value $V_{pFOD}$ has a value commensurate with the amplitude of the current passing in the transmission-side coil $T_L$ when the test magnetic field is being generated in the transmission-side coil $T_L$. During the period in which the pFOD process is performed, according to an instruction from the power feeding device 1 via NFC communication, the $f_O$ changing/short-circuiting operation (resonance frequency changing operation or coil short-circuiting operation) is performed in the electronic device 2. Accordingly, the resonance circuit RR (reception-side coil $R_L$) generally does not act as a load to the transmission-side coil $T_L$, and thus causes no or almost no decrease in the sensed current amplitude value $V_{pFOD}$.

Subsequently to step S13, at step S14, the control circuit 160 checks whether or not the sensed current amplitude value $V_{pFOD}$ falls within a predetermined normal pFOD range. If the sensed current amplitude value $V_{pFOD}$ falls within the normal pFOD range, the control circuit 160 judges that no foreign object 3 is present on the power feeding stage 12 (step S15). This judgment is referred to as a foreign-object-absent judgment. On the other hand, if the sensed current amplitude value $V_{pFOD}$ falls outside the normal pFOD range, the control circuit 160 judges that a foreign object 3 is present on the power feeding stage 12 (step S16). This judgment is referred to as a foreign-object-present judgment. After a foreign-object-absent or foreign-object-present judgment, the selective voltage division circuit 450 is brought into the direct-connected state (step S17), and the pFOD process is ended. On making a foreign-object-absent judgement, the control circuit 160 recognizes that the power transmission operation by the power transmission circuit 130 is permissible, and permits the power transmission circuit 130 to perform the power transmission operation (power transmission using the resonance circuit TT); on making a foreign-object-present judgment, the control circuit 160 recognizes that the power transmission operation by the power transmission circuit 130 is not permissible, and inhibits the power transmission circuit 130 from performing the power transmission operation. In the power transmission operation, the selective voltage division circuit 450 is kept in the direct-connected state; thus, the alternating-current voltage $V_E$ is, as a power transmission alternating-current voltage, fed from the class-E amplifier 440 via the selective voltage division circuit 450 to the resonance circuit TT, so that a predetermined power transmission magnetic field is generated in the transmission-side coil $T_L$.

The normal pFOD range is a range of values equal to or larger than a predetermined lower limit value $V_{pREFL}$ but equal to or smaller than a predetermined upper limit value $V_{pREFH}$ ($0<V_{pREFL}<V_{pREFH}$). Accordingly, when the check inequality "$V_{pREFL} \leq V_{pFOD} \leq V_{pREFH}$" is satisfied, a foreign-object-absent judgment is made, and otherwise a foreign-object-present judgment is made.

When the pFOD process is performed, if a foreign object 3 is present on the power feeding stage 12, the resonance circuit JJ (coil $J_L$) in the foreign object 3 acts as a load to the transmission-side coil $T_L$, with the result that a decrease is observed in the sensed current amplitude value $V_{pFOD}$ as compared with when no foreign object 3 is present on the power feeding stage 12.

A foreign object can be a foreign object 3a (unillustrated) different from the foreign object 3. The foreign object 3a is, for example, a metal body containing aluminum (a foil or sheet of aluminum) or a metal body containing copper. When the pFOD process is performed, if a foreign object 3a is present on the power feeding stage 12, due to electric and magnetic effects, an increase is observed in the sensed current amplitude value $V_{pFOD}$ as compared with when no foreign object 3a is present on the power feeding stage 12.

The lower limit value $V_{pREFL}$ and the upper limit value $V_{pREFH}$ are set beforehand through experiments or the like and stored in the memory 150 such that, before power transfer is performed: if a foreign object 3 is present on the power feeding stage 12, the sensed current amplitude value $V_{pFOD}$ is lower than the lower limit value $V_{pREFL}$; if a foreign object 3a is present on the power feeding stage 12, the sensed current amplitude value $V_{pFOD}$ is higher than the upper limit value $V_{pREFH}$; and if no foreign object (3 or 3a) is present on the power feeding stage 12, the sensed current amplitude value $V_{pFOD}$ falls within the normal pFOD range.

When a power transmission magnetic field is generated with a foreign object 3a present on the power feeding stage 12, the foreign object 3a may absorb electric power and heat up. In the first embodiment, where the reference frequency as the carrier frequency for power transfer is assumed to be 13.56 MHz, it can be said that no such heating-up is likely. Accordingly, it is also possible, with no consideration given to the presence of the foreign object 3a, to make a foreign-object-present judgment only if the sensed current amplitude value $V_{pFOD}$ is lower than the lower limit value $V_{pREFL}$ and to make a foreign-object-absent judgment always if the sensed current amplitude value $V_{pFOD}$ is equal to or higher than the lower limit value $V_{pREFL}$ (that is, the upper limit value $V_{pREFH}$ may be omitted). However, in the invention according to the first embodiment, the reference frequency is not limited to 13.56 MHz; when the reference frequency is set at, for example, about several hundred kilohertz, the foreign object 3a is likely to heat up, and therefore it is preferable to adopt the previously described method in which the normal pFOD range is defined by not only the lower limit value $V_{pREFL}$ but also the upper limit value $V_{pREFH}$.

Figure 16:
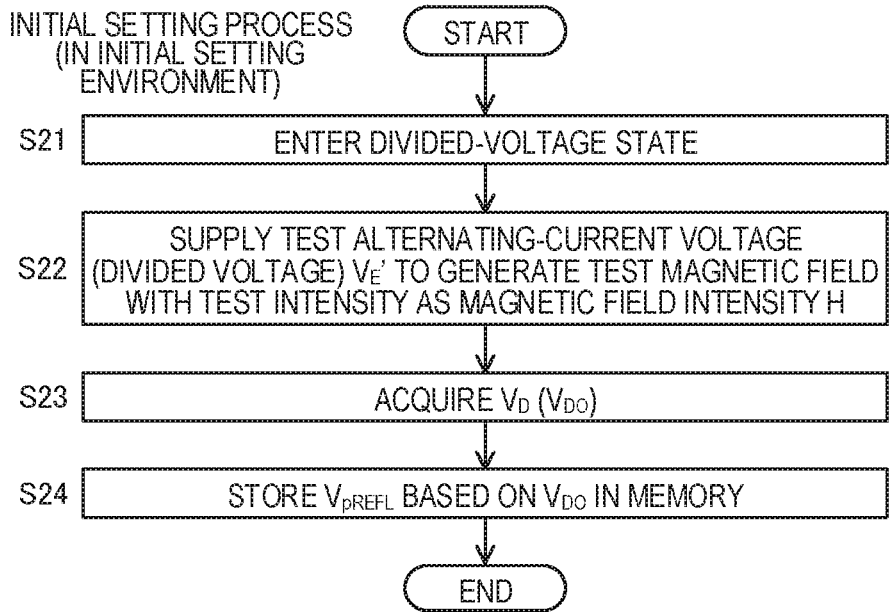
FIG. 16 is an operation flow chart of an initial setting process performed in the power feeding device according to the first embodiment of the present invention.

An additional description will now be given of how the lower limit value $V_{pREFL}$ is determined. The lower limit value $V_{pREFL}$ is determined in an initial setting process. FIG. 16 is an operation flow chart of the initial setting process. The initial setting process is performed by the IC 100 in an initial setting environment as described below. In the initial setting environment, the load to the transmission-side coil $T_L$ is null or negligibly small, and no object in which an electric current can be generated by the magnetic field generated in the transmission-side coil $T_L$ (including a coil that magnetically couples with the transmission-side coil $T_L$) is present except the components of the power feeding device 1. The detached state in FIG. 1A can be taken as satisfying the initial setting environment. To secure an initial setting environment, the initial setting process can be performed, for example, at the time of manufacture, shipment, or the like of the power feeding device 1. So long as an initial setting environment can be secured, the initial setting process can be performed at any time.

When the initial setting process is performed, the power transmission circuit 130 is connected to the resonance circuit TT. Then, first, at step S21, the divided-voltage state is put into effect. Thus, at step S22, the division voltage $V_E'$ is, as a test alternating-current voltage, fed from the class-E amplifier 440 via the selective voltage division circuit 450 to the resonance circuit TT, with the result that a test magnetic field with a predetermined test intensity as its magnetic field intensity H is generated in the transmission-side coil $T_L$. Subsequently to step S22, at step S23, by using the load sensing circuit 140, the control circuit 160 acquires, as a voltage value $V_{DO}$, the voltage value $V_D$ as observed when the test magnetic field is being generated. Then, at step S24, a lower limit value $V_{pREFL}$ based on the voltage value $V_{DO}$ is stored in the memory 150. The lower limit value $V_{pREFL}$ is set at a value lower than the voltage value $V_{DO}$ so that, only when a foreign object 3 is present, the pFOD process yields a foreign-object-present judgment. For example, the setting may be such that "$V_{pREFL}=V_{DO}-\Delta V$" or "$V_{pREFL}=V_{DO} \times k$". Here, $\Delta V$ is a predetermined positive minute value (it may also be that $\Delta V=0$); k represents a coefficient with a predetermined positive value smaller than 1. The voltage value $V_D$ that is expected to be obtained when the magnetic field intensity H is set at a predetermined test intensity in the initial setting environment can be estimated at the stage of designing. Based on the value derived from the estimation, it is possible, without performing the initial setting process, to determine the lower limit value $V_{pREFL}$ and store it in the memory 150.

With reference to FIG. 17A to FIG. 17D, a first to a fourth case related to the detection of a foreign object 3 will be considered. In the first case, only the electronic device 2 is present on the power feeding stage 12. In the second case, the electronic device 2 and a foreign object 3 are present on the power feeding stage 12. In the third case, only a foreign object 3 is present on the power feeding stage 12. In the fourth case, neither the electronic device 2 nor a foreign object 3 is present on the power feeding stage 12.

As mentioned earlier, during the period in which the pFOD process is performed, the $f_O$ changing/short-circuiting operation is performed in the electronic device 2. Thus, in the first case, the load to the transmission-side coil $T_L$ is sufficiently light (a state as if no electronic device 2 were present on the power feeding stage 12), and the sensed current amplitude value $V_{pFOD}$ is sufficiently large, so that a foreign-object-absent judgment is made. On the other hand, in the second case, though the resonance frequency of the resonance circuit RR is changed to the above-mentioned frequency $f_M$, or the reception-side coil $R_L$ is short-circuited, the foreign object 3 remains a load to the transmission-side coil $T_L$ (the resonance frequency of the resonance circuit JJ in the foreign object 3 remains at the reference frequency), and thus the sensed current amplitude value $V_{pFOD}$ is sufficiently small, so that a foreign-object-present judgment is made.

In the third and fourth cases, no electronic device 2 that responds to NFC communication is present on the power feeding stage 12, and thus in the first place, no power transmission operation is necessary; accordingly, the pFOD process itself is not performed. The power feeding device 1 can, by NFC communication, check whether or not an electronic device 2 compatible with power transfer is present on the power feeding stage 12. A state where a foreign object 3 is present on the power feeding stage 12 is not limited to a state where the foreign object 3 is in direct contact with the power feeding stage 12. For example, as shown in FIG. 18, a state where the electronic device 2 is present on the power feeding stage 12 in direct contact with it and a foreign object 3 is present on the electronic device 2 also counts, so long as a foreign-object-present judgment is made, as a state where a foreign object 3 is present on the power feeding stage 12.

[Signal Exchange Before Power Transfer, FIG. 19]

With reference to FIG. 19, the exchange of signals between the devices 1 and 2 before power transfer is performed will be described. In connection with the first embodiment, unless otherwise stated, the following description assumes that the electronic device 2 is present on the power feeding stage 12 in the regularly placed state (FIG. 1B).

First, with the power feeding device 1 on the transmitting side and the electronic device 2 on the receiving side, the power feeding device 1 (IC 100) transmits an inquiry signal 510 to a device on the power feeding stage 2 (hereinafter referred to also as the power feeding target device) by NFC communication. The power feeding target device includes the electronic device 2, and can include a foreign object 3. The inquiry signal 510 includes a signal inquiring individual identification information of the power feeding target device, a signal inquiring whether or not the power feeding target device is in a state enabled to perform NFC communication, and a signal inquiring whether or not the power feeding target device can receive electric power or is requesting transmission of electric power.

On receiving the inquiry signal 510, the electronic device 2 (IC 200) transmits a response signal 520 responding to the inquiry of the inquiry signal 510 to the power feeding device 1 by NFC communication. On receiving the response signal 520, the power feeding device 1 (IC 100) analyzes the response signal 520, and if the power feeding target device is enabled to perform NFC communication and in addition it can receive electric power or is requesting transmission of electric power, the power feeding device 1 (IC 100) transmits a test request signal 530 to the power feeding target device by NFC communication. On receiving the test request signal 530, the electronic device 2 (IC 200) as the power feeding target device transmits a response signal 540 responding to the test request signal 530 to the power feeding device 1 by NFC communication, and then promptly performs the $f_O$ changing/short-circuiting operation (resonance frequency changing operation or coil short-circuiting operation). The test request signal 530 is, for example, a signal requesting and indicating the execution of the $f_O$ changing/short-circuiting operation, and when triggered by the reception of the test request signal 530, the control circuit 250 in the electronic device 2 makes the resonance state changing circuit 240 perform the $f_O$ changing/short-circuiting operation. Before the reception of the test request signal 530, the $f_O$ changing/short-circuiting operation remains unperformed. The test request signal 530 may be any signal so long as it can trigger the execution of the $f_O$ changing/short-circuiting operation, and may be contained in the inquiry signal 510.

On receiving the response signal 540, the power feeding device 1 (IC 100) performs the above-described pFOD process. During the period in which the pFOD process is performed, the electronic device 2 (IC 200) continues performing the $f_O$ changing/short-circuiting operation. Specifically, the electronic device 2 (IC 200), by using an incorporated timer, continues performing the $f_O$ changing/short-circuiting operation for a time corresponding to the length of the period for which the pFOD process is performed, and then stops the $f_O$ changing/short-circuiting operation.

In the pFOD process, if it is judged that no foreign object is present on the power feeding stage 12, the power feeding device 1 (IC 100) transmits a verification signal 550 to the power feeding target device by NFC communication. The verification signal 550 includes, for example, a signal notifying the power feeding target device of the forthcoming power transmission. On receiving the verification signal 550, the electronic device 2 (IC 200) transmits a response signal 560 responding to the verification signal 550 to the power feeding device 1 by NFC communication. The response signal 560 includes, for example, a signal notifying recognition of what is conveyed by the verification signal 550 or a signal giving permission to what is conveyed by the verification signal 550. On receiving the response signal 560, the power feeding device 1 (IC 100) connects the power transmission circuit 130 to the resonance circuit TT to perform the power transmission operation, and thus power transfer 570 is achieved. As mentioned above, when the power transmission operation is performed, the selective voltage division circuit 450 is kept in the direct-connected state.

Figure 20:
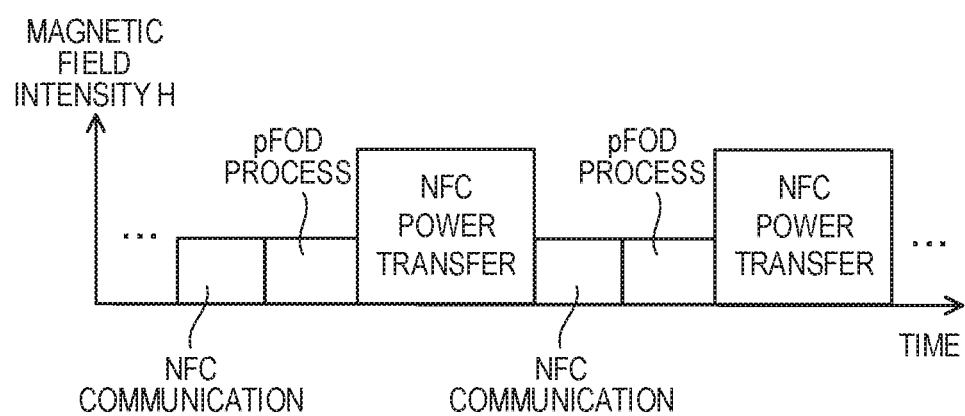
FIG. 20 is a diagram showing how NFC communication, the pFOD process, and power transfer are performed sequentially and repeatedly according to the first embodiment of the present invention.

In the first case in FIG. 17A, power transfer 570 is performed through the procedure described above. However, in the second case in FIG. 17B, although the procedure proceeds up to the transmission and reception of the response signal 540, in the pFOD process, it is judged that a foreign object is present on the power feeding stage 12; thus, no power transfer 570 is performed. A single session of power transfer 570 may be performed for a predetermined time. The sequence of operation from the transmission of the inquiry signal 510 to power transfer 570 may be performed repeatedly. In practice, as shown in FIG. 20, NFC communication, a pFOD process, and power transfer (NFC power transfer) can be performed sequentially and repeatedly. That is, in the non-contact power feeding system, operation for performing NFC communication, operation for performing a pFOD process, and operation for performing power transfer (NFC power transfer) can be performed sequentially and repeatedly on a time-division basis.

[Operation Flow Chart of a Power Feeding Device and an Electronic Device]

Figure 21:
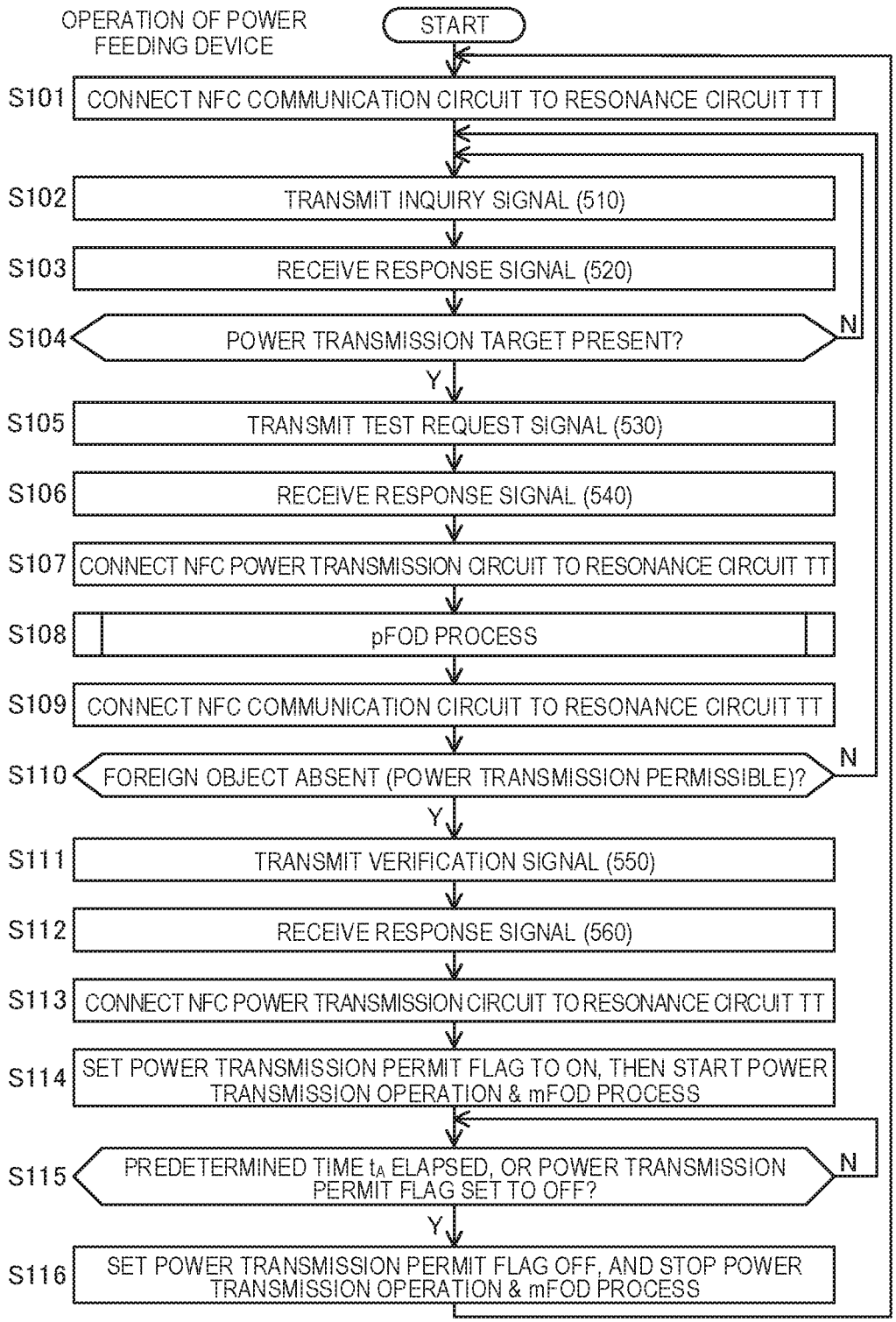
FIG. 21 is an operation flow chart of the power feeding device according to the first embodiment of the present invention.

Next, the flow of the operation of the power feeding device 1 will be described. FIG. 21 is an operation flow chart of the power feeding device 1. The operation of the communication circuit 120 and the power transmission circuit 130 is performed under the control of the control circuit 160.

When the power feeding device 1 starts up, first, at step S101, the control circuit 160 controls the switch circuit 110 such that the communication circuit 120 is connected to the resonance circuit TT. Subsequently, at step S102, the control circuit 160 transmits an inquiry signal 510 to the power feeding target device by NFC communication using the communication circuit 120 and the resonance circuit TT, and then, at step S103, the control circuit 160 waits for the reception of a response signal 520. When the communication circuit 120 receives the response signal 520, the control circuit 160 analyzes the response signal 520, and if the power feeding target device is enabled to perform NFC communication and in addition it can receive electric power or is requesting transmission of electric power, it is judged that a power transmission target is present (step S104, Y), and an advance is made to step S105; otherwise (step S104, N), a return is made to step S102.

At step S105, the control circuit 160 transmits a test request signal 530 to the power feeding target device by NFC communication using the communication circuit 120 and the resonance circuit TT, and then, at step S106, the control circuit 160 waits for the reception of a response signal 540. When the communication circuit 120 receives the response signal 540, then, at step S107, the control circuit 160 controls the switch circuit 110 such that the power transmission circuit 130 is connected to the resonance circuit TT, and subsequently, at step S108, the above-described pFOD process is performed.

After the pFOD process, at step S109, the control circuit 160 controls the switch circuit 110 such that the communication circuit 120 is connected to the resonance circuit TT, and an advance is made to step S110. If, in the pFOD process at step S108, a foreign-object-present judgment has been made, a return is made from step S110 to step S102; if a foreign-object-absent judgment has been made, an advance is made from step S110 to step S111.

At step S111, the control circuit 160 transmits a verification signal 550 to the power feeding target device by NFC communication using the communication circuit 120 and the resonance circuit TT, and then, at step S112, the control circuit 160 waits for the reception of a response signal 560. When the communication circuit 120 receives the response signal 560, then, at step S113, the control circuit 160 controls the switch circuit 110 such that the power transmission circuit 130 is connected to the resonance circuit TT, and an advance is made to step S114.

At step S114, the control circuit 160 sets a power transmission permit flag to ON, and starts power transmission operation and an mFOD process, and then an advance is made to step S115. As mentioned above, when the power transmission operation is performed, the selective voltage division circuit 450 is kept in the direct-connected state. As will be described in detail later, through the mFOD process, the presence or absence of a foreign object during power transfer is checked, and if a foreign object is detected, the power transmission permit flag is turned to OFF. The control circuit 160 counts the time that has elapsed from the start of the power transmission operation, and, at step S115, the control circuit 160 compares the time elapsed with a predetermined time $t_A$ (for example, 10 minutes) and checks the status of the power transmission permit flag. When the time elapsed reaches the predetermined time $t_A$, or when through the mFOD process the power transmission permit flag is set to OFF, an advance is made to step S116. At step S116, the control circuit 160 turns the power transmission permit flag from ON to OFF, or keeps the power transmission permit flag set to OFF, and stops the power transmission operation and the mFOD process; a return is then made to step S101.

Figure 22:
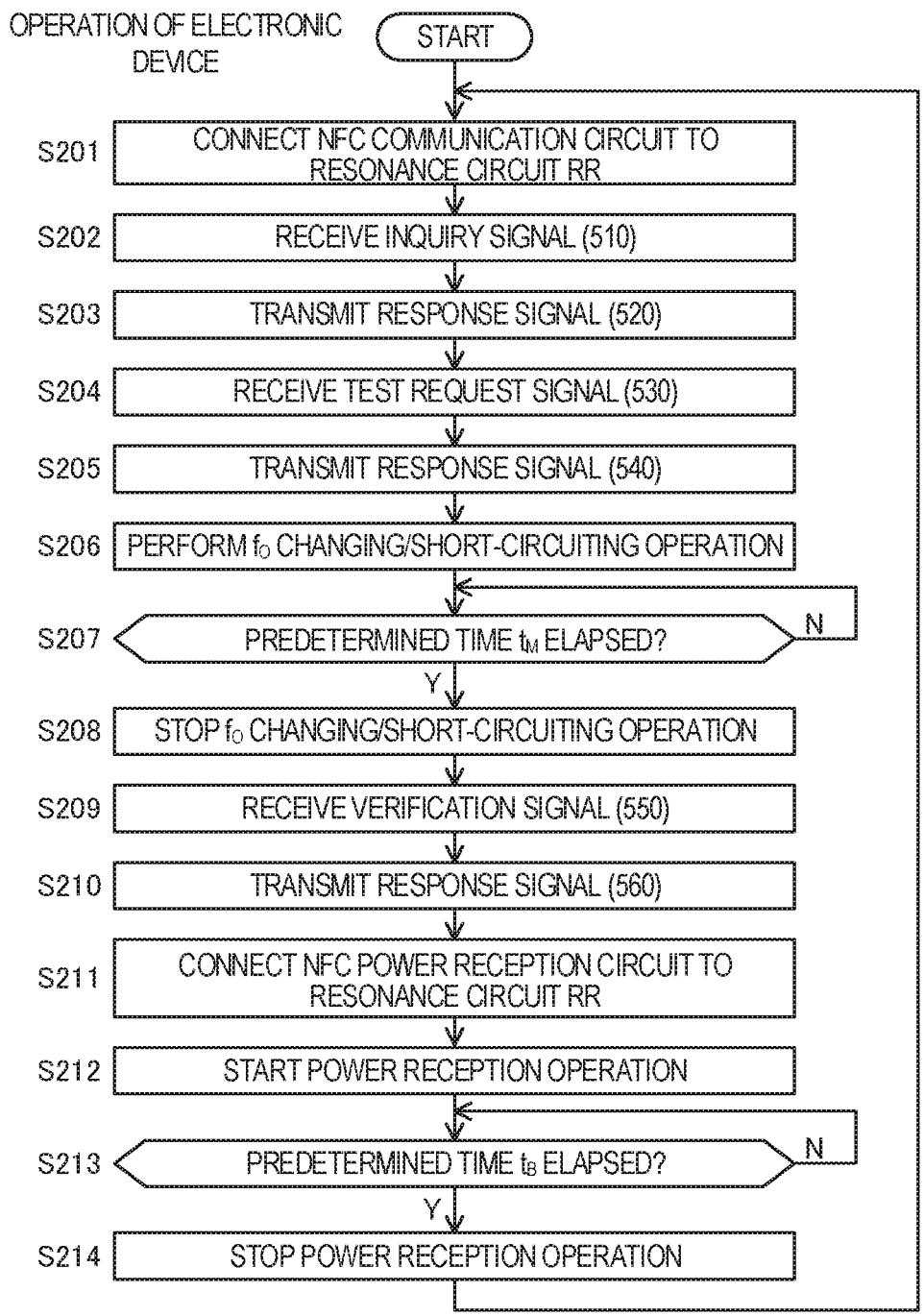
FIG. 22 is an operation flow chart of the electronic device according to the first embodiment of the present invention.

Next, the flow of the operation of the electronic device 2 will be described. FIG. 22 is an operation flow chart of the electronic device 2, and the procedure starting at step S201 is performed concurrently with the operation of the power feeding device 1 shown in FIG. 21. The operation of the communication circuit 220 and the power reception circuit 230 is performed under the control of the control circuit 250.

When the electronic device 2 starts up, first, at step S201, the control circuit 250 controls the switch circuit 210 such that the communication circuit 220 is connected to the resonance circuit RR. When the electronic device 2 starts up, the $f_O$ changing/short-circuiting operation remains unperformed. Subsequently, at step S202, the control circuit 250, by using the communication circuit 220, waits for the reception of an inquiry signal 510. When the communication circuit 220 receives the inquiry signal 510, then, at step S203, the control circuit 250 analyzes the inquiry signal 510 to generate a response signal 520, and transmits the response signal 520 to the power feeding device 1 by NFC communication using the communication circuit 220. At this point, the control circuit 250 checks the condition of the battery 21, and if the battery 21 is not in a fully charged state and in addition the battery 21 does not exhibit any abnormality, the control circuit 250 includes in the response signal 520 a signal indicating readiness to receive electric power or requesting transmission of electric power. On the other hand, if the battery 21 is in a fully charged state or the battery 21 exhibits an abnormality, the control circuit 250 includes in the response signal 520 a signal indicating unreadiness to receive electric power.

Thereafter, when, at step S204, the test request signal 530 is received by the communication circuit 220, an advance is made to step S205. At step S205, the control circuit 250 transmits a response signal 540 to the power feeding device 1 by NFC communication using the communication circuit 220, and subsequently, at step S206, the control circuit 250, by using the resonance state changing circuit 240, performs the $f_O$ changing/short-circuiting operation. Specifically, the control circuit 250 changes the resonance frequency $f_O$ from the reference frequency to the frequency $f_M$, or short-circuits the reception-side coil $R_L$. The control circuit 250 counts the time that elapses after the start of the execution of the $f_O$ changing/short-circuiting operation (step S207), and when the time elapsed reaches a predetermined time $t_M$, the control circuit 250 stops the $f_O$ changing/short-circuiting operation (step S208). Specifically, the control circuit 250 changes the resonance frequency $f_O$ back to the reference frequency, or ceases to short-circuit the reception-side coil $R_L$. Then, an advance is made to step S209. The time $t_M$ is determined beforehand such that, during the period in which the pFOD process is performed in the power feeding device 1 (that is, during the period in which the test magnetic field is being generated), the execution of the $f_O$ changing/short-circuiting operation is continued and, as soon as the period expires, the $f_O$ changing/short-circuiting operation is promptly stopped. The time $t_M$ may be specified in the test request signal 530.

At step S209, the control circuit 250 waits for the reception of a verification signal 550 by use of the communication circuit 220. When the communication circuit 220 receives the verification signal 550, then, at step S210, the control circuit 250 transmits a response signal 560 responding to the verification signal 550 to the power feeding device 1 by NFC communication using the communication circuit 220. If a foreign object is present on the power feeding stage 12, no verification signal 550 is transmitted from the power feeding device 1 (see step S110 in FIG. 21), and thus if, at step S209, no verification signal 550 is received for a predetermined time, a return can be made to step S201.

After the transmission of the response signal 560, at step S211, the control circuit 250 controls the switch circuit 210 such that the power reception circuit 230 is connected to the resonance circuit RR, and subsequently, at step S212, the control circuit 250 starts the power reception operation using the power reception circuit 230. The control circuit 250 counts the time that elapses after the start of the power reception operation, and compares the time elapsed with a predetermined time is (step S213). When the time elapsed reaches the time is (step S213, Y), then, at step S214, the control circuit 250 stops the power reception operation; a return is then made to step S201.

The time $t_B$ is previously determined or is specified in the verification signal 550 previously such that the period in which the power reception operation is performed generally coincides with the period in which the power transmission operation is performed in the power feeding device 1. A configuration is also possible where, after the start of the power reception operation, the control circuit 250 monitors the charge current to the battery 21, and when the charge current value becomes equal to or smaller than a predetermined value, the control circuit 250 judges that the power transmission operation has ended and stops the power reception operation, an advance then being made to step S201.

[mFOD Process]

It can happen that a foreign object is placed on the power feeding stage 12 after the start of power transmission operation. An mFOD process serves as a foreign object detection process during power transfer, and through the mFOD process, the presence or absence of a foreign object is constantly monitored during power transfer.

Figure 23:
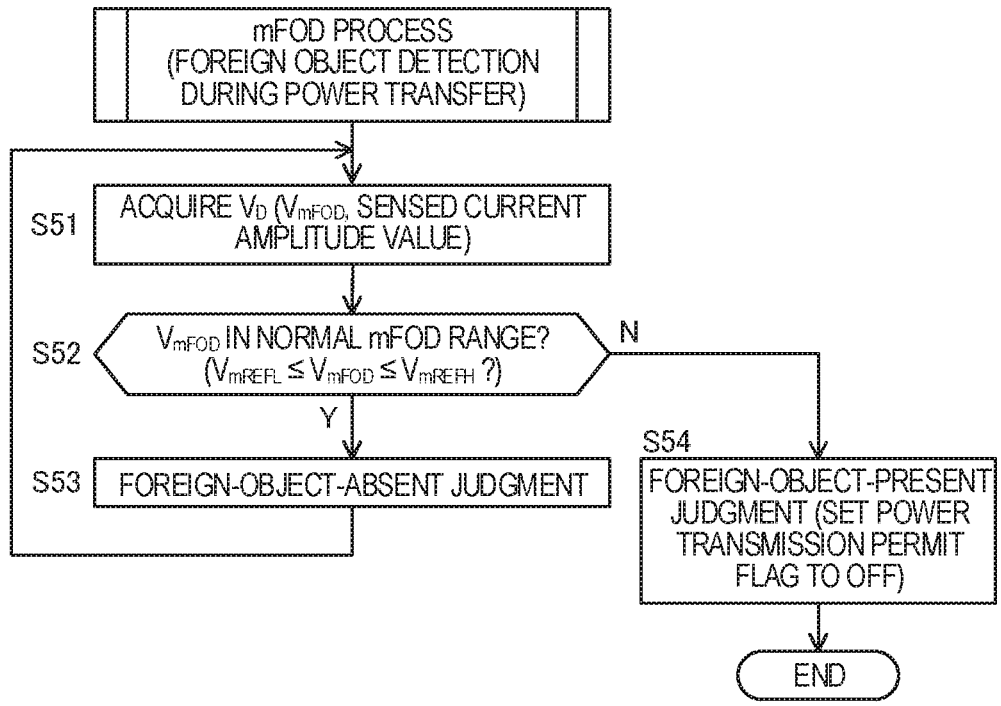
FIG. 23 is an operation flow chart of an mFOD process performed in the power feeding device according to the first embodiment of the present invention.

FIG. 23 is an operation flow chart of the mFOD process. During the period in which the power transmission operation is performed, the control circuit 160 performs the mFOD process in FIG. 23 repeatedly. In the mFOD process, first, at step S51, the control circuit 160 acquires the most recent voltage value $V_D$ as a sensed current amplitude value $V_{mFOD}$. The sensed current amplitude value $V_{mFOD}$ has a value commensurate with the amplitude of the current that passes in the transmission-side coil $T_L$ when a power transmission magnetic field is being generated in the transmission-side coil $T_L$. Subsequently, at step S52, the control circuit 160 checks whether or not the sensed current amplitude value $V_{mFOD}$ falls within a predetermined normal mFOD range. If the sensed current amplitude value $V_{mFOD}$ falls within the normal mFOD range, a foreign-object-absent judgment is made (step S53), and a return is made to step S51, so that steps S51 and S52 are repeated. On the other hand, if the sensed current amplitude value $V_{mFOD}$ falls outside the normal mFOD range, then, at step S54, a foreign-object-present judgment is made, and a power transmission permit flag is set to OFF. The power transmission permit flag is a flag that is controlled by the control circuit 160, and is set to ON or OFF. When the power transmission permit flag is set to ON, the control circuit 160 permits the execution of the power transmission operation; when the power transmission permit flag is set to OFF, the control circuit 160 inhibits the execution of the power transmission operation, or stops the power transmission operation.

The normal mFOD range is a range of values equal to or larger than a predetermined lower limit value $V_{mREFL}$ but equal to or smaller than a predetermined upper limit value $V_{mREFH}$ ($0<V_{mREFL}<V_{mREFH}$). Accordingly, when the check inequality "$V_{mREFL} \leq V_{mFOb} \leq V_{mREFH}$" is satisfied, a foreign-object-absent judgment is made, and otherwise a foreign-object-present judgment is made.

Figure 24A:
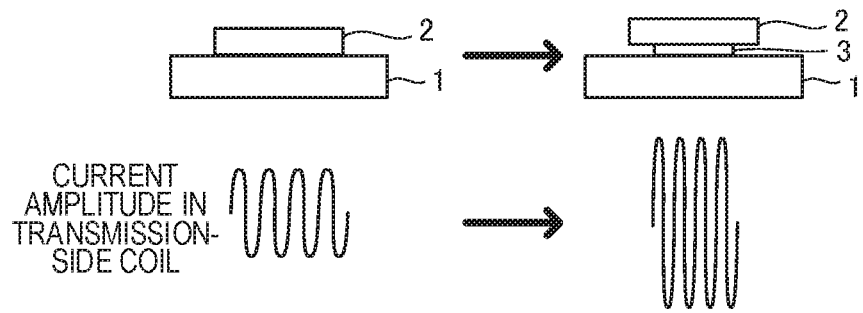
FIG. 24A and FIG. 24B are diagrams illustrating current amplitude variations in a transmission-side coil resulting from insertion of a foreign object during power transfer.

With reference to FIG. 24A, consider, for example, a case where, while the power transmission operation is being performed, a foreign object 3 configured as a non-contact IC card is inserted between the power feeding stage 12 of the power feeding device 1 and the electronic device 2. In this case, the reception-side coil $R_L$ in the electronic device 2 and the coil $J_L$ in the foreign object 3 magnetically couple, and, along with the resonance frequency of the resonance circuit JJ in the foreign object 3, the resonance frequency of the resonance circuit RR in the electronic device 2 deviates from the reference frequency (13.56 MHz). Then, the reception electric power in the reception-side coil $R_L$ lowers, and the power transmission load as observed from the transmission-side coil $T_L$ becomes lighter, with the result that the amplitude of the current passing in the transmission-side coil $T_L$ becomes larger (the upper limit value $V_{mREFH}$ can be determined such that "$V_{mREFH}<V_{mFOb}$" in this case).

Figure 24B:
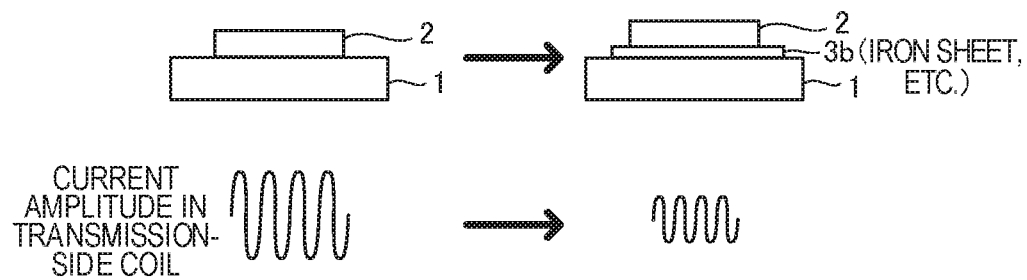

For another example, with reference to FIG. 24B, consider a case where, while the power transmission operation is being performed, a foreign object $3b$ configured as a sheet of iron or ferrite is inserted between the power feeding stage 12 of the power feeding device 1 and the electronic device 2. Then, due to electric and magnetic effects, an electric current passes in the foreign object $3b$, with the result that the amplitude of the current passing in the transmission-side coil $T_L$ becomes smaller (the lower limit value $V_{mREFL}$ can be determined such that "$V_{mFOD}<V_{mREFL}$" in this case).

Thus, the presence or absence of a foreign object like the foreign object 3 and the foreign object $3b$ causes a variation in the sensed current amplitude value $V_{mFOB}$. A lower limit value $V_{mREFL}$ and an upper limit value $V_{mREFH}$ that have been determined appropriately beforehand through experiments or the like with consideration given to every imaginable type of foreign object and every imaginable state of arrangement can be stored in the memory 150. Instead, how far the sensed current amplitude value $V_{mFOD}$ varies due to the presence of a foreign object during power transfer may be estimated by theoretic calculation so that, based on the results of the estimation, with no need for experiments, a lower limit value $V_{mREFL}$ and an upper limit value $V_{mREFH}$ can be determined and stored in the memory 150. In that case, for example, an object that causes the sensed current amplitude value $V_{mFOD}$ to vary by a predetermined factor of variation or more about the center value of the normal mFOD range can be defined as a foreign object.

The amplification factor of the amplifier 143 shown in FIG. 7 is variable. The amplitude of the current passing in the transmission-side coil $T_L$ is significantly larger when the power transmission operation and the mFOD process are preformed than when the pFOD process is performed. Accordingly, the control circuit 160 sets the amplification factor of the amplifier 143 lower when the mFOD process is performed than when the pFOD process is performed, and thereby keeps generally equal the input signal range of the A-D converter 144 between in the pFOD process and in the mFOD process.

For another example, between the envelope curve detector 142 and the A-D converter 144 (more specifically, between the envelope curve detector 142 and the amplifier 143, or between the amplifier 143 and the A-D converter 144), a high-range reduction circuit (unillustrated) may be inserted. In that case, amplitude information obtained by subjecting the voltage drop signal across the sense resistor 141 to high-range reduction (in other words, averaging or low-pass filtering) can be obtained as the voltage value $V_D$ from the A-D converter 144. The high-range reduction here is a process whereby, of the voltage drop signal across the sense resistor 141, comparatively low-frequency signal components are passed while comparatively high-frequency signal components are reduced (attenuated). Through the high-range reduction, inhibition of power transmission is prevented from occurring due to noise, slight vibration of the electronic device 2 on the power feeding stage 12, or the like.

For another example, instead of a high-range reduction circuit being provided between the envelope detector 142 and the A-D converter 144, high-range reduction by calculation may be applied to the voltage value $V_D$ based on the output signal of the A-D converter 144 so that the voltage value $V_D$ after the high-range reduction is used as the sensed current amplitude value $V_{mFOD}$ (similar handling is possible also for the sensed current amplitude value $V_{pFOD}$ in the pFOD process). High-range reduction by calculation is a process performed in the control circuit 160 whereby, of the output signal of the A-D converter 144, comparatively low-frequency signal components are passed while comparatively high-frequency signal components are reduced (attenuated).

The function of the mFOD process is not limited to foreign object presence/absence judgment. The mFOD process serves to turn the power transmission permit flag to OFF in any situation unsuitable to continue the power transmission operation such as when the sensed current amplitude value $V_{mFOD}$ falls outside the normal mFOD range. For example, after the start of the power transmission operation, when the electronic device 2 is removed off the power feeding stage 12, the load of power transmission as observed from the transmission-side coil $T_L$ becomes lighter and the sensed current amplitude value $V_{mFOD}$ exceeds the upper limit value $V_{mREFH}$; thus, the power transmission permit flag is turned to OFF (step S54 in FIG. 23).

Thus, in the first embodiment, an alternating-current voltage for generating a magnetic field is generated by use of the low-loss class-E amplifier 440, and this helps increase the efficiency of the entire system involved in power transfer. Moreover, the foreign object detection process makes it possible to prevent a foreign object from being damaged or otherwise affected. In the foreign object detection process (the pFOD process) before power transfer, the above-mentioned noise current amplitude variation may degrade the accuracy of foreign object presence/absence detection, but voltage division using the selective voltage division circuit 450 reduces the effect of the noise current amplitude variation, and this keeps the accuracy of foreign object presence/absence detection high.

[Operating Conditions for the Class-E Amplifier]

Next, the processes and results of experiments conducted to find out, in connection with the pFOD process, the optimal operating conditions of the class-E amplifier 440. FIG. 25 is a table showing at a glance the data obtained in the experiments.

In the experiments, the selective voltage division circuit 450 was kept in the divided-voltage state. In the experiments, the class-E amplifier 440 was brought into one of a first to a fourteenth output state. For a given integer i, the amplitude of the output voltage of the class-E amplifier 440 in the (i+1)th output state was larger than the amplitude of the output voltage of the class-E amplifier 440 in the ith output state. In the experiments, the direct-current voltage VIN was varied to obtain the different output states. Accordingly, the direct-current voltage VIN that yielded the (i+1)th output state was higher than the direct-current voltage VIN that yielded the ith output state.

In the experiments, a first and a second experimental condition were defined. In the first experimental condition, the initial setting environment mentioned above was maintained (accordingly, the experimental power reception board mentioned later was not placed in the predetermined power transmission region on the power feeding stage 12). In the second experimental condition, in contrast to the first experimental condition, the experimental power reception board was placed in the predetermined power transmission region on the power feeding stage 12. The experimental power reception board was a board on which the reception-side resonance circuit RR was mounted, and to the reception-side resonance circuit RR, the $f_O$ changing/short-circuiting operation was applied. Thus, a state that satisfied the second experimental condition can be taken to be equivalent to a state where an electronic device 2 in which the $f_O$ changing/short-circuiting operation was being performed was placed in the power transmission region on the power feeding stage 12.

The experiments gave a value VT1 representing the amplitude of the supply voltage to the resonance circuit TT (that is, the amplitude of the alternating-current voltage between the terminals TM3 and TM4; see FIG. 12). Here, it is assumed that the amplitude represented by VT1 was twice the crest value, given in volts, of the supply voltage to the resonance circuit TT. The values of VT1 obtained in the first and second experimental conditions are represented by $VT1_A$ and $VT1_B$ respectively. The experiments also gave a value VT2 representing the digital output value of the A-D converter 144 which indicates the voltage value $V_D$ (see FIG. 7). The values of VT2 obtained in the first and second experimental conditions are represented by $VT2_A$ and $VT2_B$ respectively. DELTA and $R_{VT2}$ are given by "DELTA=$VT2_B$–$VT2_A$" and "$R_{VT2}$=DELTA/$VT2_A$". It may also be that "$R_{VT2}$=DELTA/$VT2_B$".

Figure 26:
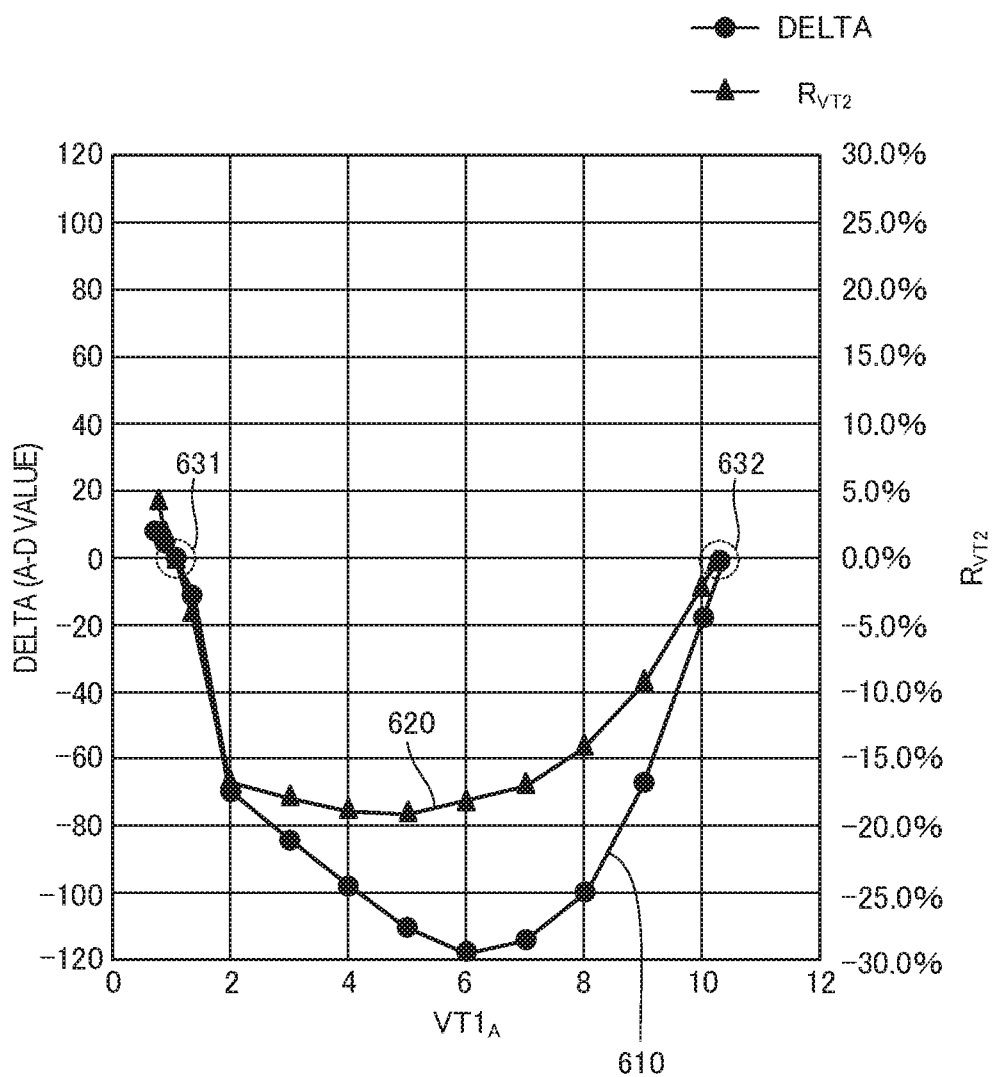
FIG. 26 is a diagram showing the results of experiments conducted with the non-contact power feeding system according to the first embodiment of the present invention.

In the experiments, for each of the first to fourteenth output states, a unit process was performed in which, with the class-E amplifier 440 in the ith output state, the values of $VT1_A$, $VT1_B$, $VT2_A$, $VT2_B$, DELTA, and $R_{VT2}$ were determined. The results are shown in FIG. 25. A graph based on those results is shown in FIG. 26. In FIG. 26, a segmented line 610 represents the relationship between $VT1_A$ and DELTA, and a segmented line 620 represents the relationship between $VT1_A$ and $R_{VT2}$.

So long as the $f_O$ changing/short-circuiting operation is performed properly on the experimental power reception board, ideally, the presence of the experimental power reception board has no effect on the impedance value of the resonance circuit TT as observed from the class-E amplifier 440, with the result that no variation is supposed to be observed in either VT1 or VT2 between the first and second experimental conditions. However, in reality, a slight effect appears through the magnetic coupling and the like between the transmission-side coil $T_L$ and the reception-side coil $R_L$ on the experimental power reception board. Here, how the effect appears depends on VT1; depending on the value of VT1, DELTA and $R_{VF2}$ can increase or decrease.

The experiments revealed the following.

With the class-E amplifier 440 in the third output state, "$VT1_A=1.06$". With "$VT1_A=1.06$", "DELTA=0" and "$R_{VT2}=0$". $VT1_A$ is in volts, and $R_{VT2}$ is in percent.

With the class-E amplifier 440 in the fourteenth output state, "$VT1_A=10.30$". With "$VT1_A=10.30$", "DELTA=−1" and "$R_{VT2}=0.1$".

With "$VT1_A<1.06$", as $VT1_A$ decreased from 1.06, DELTA increased from 0, and $R_{VT2}$ increased from 0.

With "$1.06<VT1_A<10.30$", as $VT1_A$ increased from 1.06, DELTA decreased from 0, and $R_{VT2}$ decreased from 0. As $VT1_A$ was increased from 1.06, when $VT1_A$ equaled 5 to 6, DELTA and $R_{VT2}$ took relative minima, and even after DELTA and $R_{VT2}$ took relative minima, as $VT1_A$ was increased toward 10.30, DELTA and $R_{VT2}$ decreased from their respective relative minima toward 0.

That is, it was found that, only at the singular point 631 corresponding to "$VT1_A=1.06$" and the singular point 632 corresponding to "$VT1_A=10.30$", DELTA and $R_{VT2}$ equaled generally zero, and that as $VT1_A$ deviated from the voltage at a singular point, DELTA and $R_{VF2}$ increased or decreased from zero.

The pFOD process is a process whereby foreign object presence/absence is judged by observing the presence or absence of a current amplitude variation (detection target current amplitude variation) in the transmission-side coil $T_L$ ascribable to the presence of a foreign object. During the observation, if a variation arises in the current amplitude in the transmission-side coil $T_L$ due to the presence of the electronic device 2, the variation becomes noise to foreign object presence/absence judgment. Therefore, when the pFOD process is performed, operating the class-E amplifier 440 under a condition that minimizes the current amplitude variation in the transmission-side coil $T_L$ due to the presence of the electronic device 2 leads to higher accuracy in foreign object detection. That is, based on the experiment results in FIG. 25, operating the class-E amplifier 440 at or near the singular point 631 corresponding to "$VT1_A=1.06$" or the singular point 632 corresponding to "$VT1_A=10.30$" lead to optimized or adequate accuracy of the foreign object detection through the pFOD process.

Out of these considerations, a preferable approach is as follows.

The magnitude (voltage value) of the direct-current voltage VIN can be determined such that, in the pFOD process, when the division voltage $V_E'$ (test alternating-current voltage) is being fed to the resonance circuit TT, the division voltage $V_E'$ (test alternating-current voltage) has such an amplitude ($VT1_A$ or $VT1_B$) as to make the absolute value (|DELTA|) of the difference between $VT2_A$ and $VT2_B$ equal to or smaller than a predetermined value, or has such an amplitude ($VT1_A$ or $VT1_B$) as to make the ratio of the absolute value to $VT2_A$ (|DELTA|/$VT2_A$) or the ratio of the absolute value to $VT2_B$ (|DELTA|/$VT2_B$) equal to or smaller than a predetermined value.

In other words, the magnitude (voltage value) of the direct-current voltage VIN can be determined such that, in the pFOD process, when the division voltage $V_E'$ (test alternating-current voltage) is being fed to the resonance circuit TT, the absolute value (|DELTA|) of the difference between $VT2_A$ and $VT2_B$ is equal to or smaller than a predetermined value, or the ratio of the absolute value to $VT2_A$ (|DELTA|/$VT2_A$) or the ratio of the absolute value to $VT2_B$ (|DELTA|/$VT2_B$) is equal to or smaller than a predetermined value. A magnitude of the direct-current voltage VIN as described above was, in the circuit used in the experiments, the magnitude of the direct-current voltage VIN observe in the third or fourteenth output state.

Figure 27:
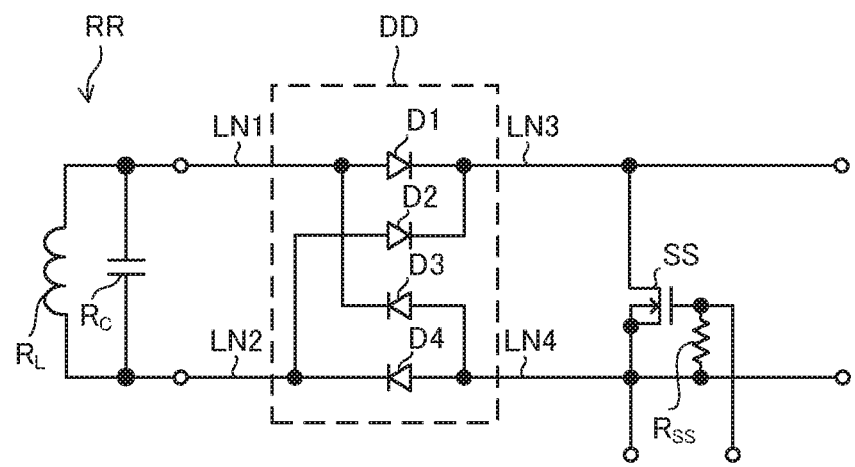
FIG. 27 is a diagram showing a part of a circuit provided on an experimental power reception board.

The experimental power reception board in the experiments is equivalent to the electronic device 2 in which the $f_O$ changing/short-circuiting operation is being performed, and thus $VT2_A$ corresponds to the sensed current amplitude value $V_D$ as observed when the division voltage $V_E'$ (test alternating-current voltage) is being fed to the resonance circuit TT and in addition the electronic device 2 is not present in the predetermined power transmission region for power transmission, and $VT2_B$ corresponds to the sensed current amplitude value $V_D$ as observed when the division voltage $V_E'$ (test alternating-current voltage) is being fed to the resonance circuit TT and in addition the electronic device 2 in a state where the $f_O$ changing/short-circuiting operation is being performed is present in the predetermined power transmission region for power transmission One factor due to which DELTA and $R_{VF2}$ depend on VT1 is the non-linearity of the circuit that is actually connected to the reception-side resonance circuit RR. FIG. 27 is a diagram showing the resonance circuit RR configured as a parallel resonance circuit along with circuits around it. The experiment data in FIG. 25 and FIG. 26 were obtained with the circuit in FIG. 27 assembled on the experimental power reception board. That is, on the experimental power reception board, in addition to the resonance circuit RR, there were mounted a rectification circuit DD, a transistor SS, and a resistor $R_{SS}$ as well as lines LN1 to LN4 as wiring. The experimental power reception board can be taken as the whole or a part of the electronic device 2, and any circuit that is mounted on the experimental power reception board can be taken as one that can be mounted also on the electronic device 2. The rectification circuit DD is a full-wave rectification circuit composed of diodes (rectifying devices) D1 to D4. The transistor SS is formed as an N-channel MOSFET.

In the circuit in FIG. 27, one end of the reception-side coil $R_L$ and one end of the reception-side capacitor $R_C$ are together connected to the line LN1. The other end of the reception-side coil $R_L$ and the other end of the reception-side capacitor $R_C$ are together connected to the line LN2. The line LN1 is connected to both the anode of the diode D1 and the cathode of the diode D3. The line LN2 is connected to both the anode of the diode D2 and the cathode of the diode D4. The cathodes of the diodes D1 and D2 are together connected to the line LN3. The anodes of the diodes D3 and D4 are together connected to the line LN4. Of the transistor SS, the drain is connected to the line LN3, the source is connected to the line LN4, and the gate is connected via the resistor $R_{SS}$ to line LN4.

A control circuit of the experimental power reception board, which corresponds to the control circuit 250 of the electronic device 2, controls the gate voltage of the transistor SS to turn ON or OFF the transistor SS. When the transistor SS is OFF, based on the magnetic field generated in the transmission-side coil $T_L$, an alternating current passes in the reception-side coil $R_L$, and electric power based on the alternating current is rectified by the rectification circuit DD and delivered to between the lines LN3 and LN4, so that a positive voltage appears on the line LN3 relative to the potential on the line LN4. On the experimental power reception board, and hence on the electronic device 2, the circuit composed of the rectification circuit DD, the transistor SS, and the resistor $R_{SS}$ can be provided between the resonance circuit RR and the communication circuit 220, or between the resonance circuit RR and the power reception circuit 230. Incidentally, the switch circuit 210 (see FIG. 5), which is supposed to be interposed between the resonance circuit RR and the rectification circuit DD, is omitted from illustration in FIG. 27.

On the other hand, when the transistor SS is ON, the reception-side coil $R_L$ is short-circuited via the rectification circuit DD (more precisely, via the combination of the diodes D1 and D4 or the combination of the diodes D2 and D3), and thus no voltage appears between the lines LN3 and LN4 (for simplicity's sake, the drain-source voltage of the transistor SS is assumed to be zero). In the experiments in FIG. 25 and FIG. 26, the transistor SS was ON. Thus, while the transistor SS in FIG. 27 corresponds to the switch 243 in FIG. 10, in the circuit in FIG. 27, between the resonance circuit RR and the transistor SS corresponding to the switch 243, there is interposed the circuit (DD) which is composed of semiconductor devices (D1 to D4) with non-linear characteristics.

Figure 28:
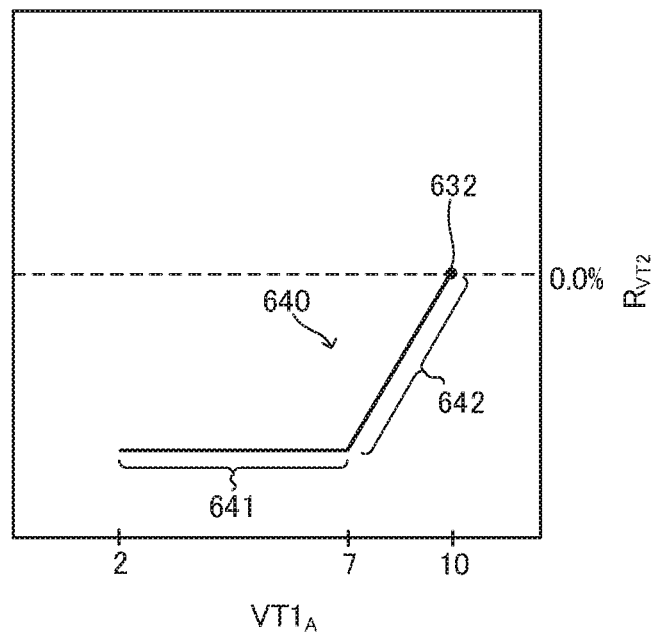
FIG. 28 is a diagram for a study of the results of experiments corresponding to FIG. 25 and FIG. 26.

A graph 640 that approximates a part (the region where $VT1_A$ is generally equal to or larger than 2) of the segmented line 620 representing the $VT1_A$ dependence of $R_{VF2}$ shown in FIG. 26 is shown in FIG. 28. In the graph 640, in a region 641 where "$2 \leq VT1_A < 7$" generally holds, $R_{VF2}$ is kept at a constant negative value; in a region 642 where "$7 \leq VT1_A$" generally holds, as $VT1_A$ increases, $R_{VF2}$ monotonically increases from the predetermined negative value toward zero until, at the singular point 632 (see also FIG. 26), it generally equals zero.

In the region 641 where $VT1_A$ is comparatively small, the voltage generated in the resonance circuit RR resulting from the magnetic field generated in the transmission-side coil $T_L$ is small, and thus the diodes D1 to D4 are in a non-conducting state. Then, even when the transistor SS is turned ON, the resonance circuit RR resonates at the reference frequency (13.56 MHz). That is, in the region 641 where $VT1_A$ is comparatively small, the resonance circuit RR acts as a load to the transmission-side coil $T_L$, and DELTA (hence $R_{VT2}$) has a comparatively large value.

As $VT1_A$ is increased starting with the diodes D1 to D4 in the non-conducting state, the diodes D1 to D4 turn from the non-conducting state to a conducting state; thus, the transistor SS, which is ON, brings, via the diodes D1 to D4, the reception-side coil $R_L$ toward a short-circuited state. This causes the transition from the region 641 to the region 642 in the graph 640. It is considered that, when $VT1_A$ increases until the reception-side coil $R_L$ comes into a state where it can be regarded as completely short-circuited, DELTA (hence $R_{VT2}$) substantially equals zero.

<<Studies on the Present Invention, Part 1>>

To follow are studies on the present invention as embodied as the first embodiment described above.

A power transmission device $W_1$ according to one aspect of the present invention is a power transmission device that can transmit electric power to a power reception device by magnetic resonance, and includes: a transmission-side resonance circuit (TT) which includes a transmission-side coil ($T_L$) for transmitting the electric power and which has a predetermined reference frequency as the resonance frequency; a class-E amplifier (440) which generates and outputs an alternating-current voltage ($V_E$) at the reference frequency by switching a direct-current voltage fed from a direct-current power source by using a periodic signal at the reference frequency; a selective voltage division circuit (450) which is inserted between the class-E amplifier and the transmission-side resonance circuit and which feeds the transmission-side resonance circuit selectively with either the output voltage of the class-E amplifier as a power transmission alternating-current voltage ($V_E$) or a voltage obtained by dividing the output voltage of the class-E amplifier as a test alternating-current voltage ($V_E'$); a sensing circuit (140) which senses the amplitude of the current passing through the transmission-side coil; and a control circuit (160) which controls the selective voltage division circuit and thereby controls the supply voltage to the transmission-side resonance circuit. The control circuit acquires, as an evaluation value ($V_{pFOD}$), the sensed amplitude value from the sensing circuit when the test alternating-current voltage is fed to the transmission-side resonance circuit, and controls, based on the evaluation value, whether or not to perform power transmission by feeding the power transmission alternating-current voltage to the transmission-side resonance circuit.

The use of the class-E amplifier permits high-efficiency power transfer. On the other hand, a property is observed such that, if a foreign object is present at a place where it responds to the magnetic field generated in the transmission-side coil, a variation appears in the current amplitude in the transmission-side coil. By utilizing this property, it is possible to detect the presence or absence of a foreign object based on a variation in the current amplitude; it is then possible to perform control such that, if a foreign object is detected being present, power transmission is inhibited from being performed.

However, when a foreign object is present, a variation may occur in the impedance value of the transmission-side resonance circuit as observed from the class-E amplifier; this variation in the impedance value causes a variation in the output of the class-E amplifier, and eventually causes a variation in the current amplitude in the transmission-side coil. A variation (noise current amplitude variation) in the current amplitude in the transmission-side coil ascribable to a variation in the impedance value interferes with the detection of the current amplitude variation (detection target current amplitude variation) that should rather be observed for foreign object detection.

As a solution, in the power transmission device $W_1$, the selective voltage division circuit is provided to alleviate the effect of the noise current amplitude variation. Specifically, the evaluation value used to control whether or not to perform power transmission is acquired in a state where a division voltage of the output of the class-E amplifier is being used; thus, the variation in the impedance value ascribable to the presence of a foreign object is reduced by a factor corresponding to the voltage division ratio. As a result, the effect of the noise current amplitude variation on the detection target current amplitude variation is reduced; it is thus possible, while receiving the benefits of high-efficiency power transfer owing to the class-E amplifier, to ensure high-accuracy foreign object detection (that is, to ensure proper power transmission permission/inhibition control). Since the test alternating-current voltage is lower than the power transmission alternating-current voltage for power transmission, the intensity of the magnetic field generated in the transmission-side coil when the evaluation value is acquired can be held low. It is thus possible to prevent a foreign object from being damaged or otherwise affected by the magnetic field generated when the evaluation value is acquired.

Specifically, for example, in the power transmission device $W_1$, the control circuit can judge, based on the evaluation value ($V_{pFOD}$), the presence or absence of a foreign object which differs from the power reception device and in which a current based on the magnetic field generated in the transmission-side coil can be generated, and can control, based on the result of the judgment, whether or not to perform the power transmission.

More specifically, for example, in the power transmission device $W_1$, the control circuit can, on judging that no foreign object is present, permit the power transmission and, on judging that a foreign object is present, inhibit the power transmission.

For another example, in the power transmission device $W_1$, the control circuit can judge the presence or absence of a foreign object by judging whether or not the evaluation value falls outside a predetermined range.

For another example, in the power transmission device $W_1$, the class-E amplifier (440) can include: a switching device (441) which performs switching operation according to the periodic signal; a first coil (442) which is interposed between the direct-current power source and the switching device; a first capacitor (443) which is connected in parallel with the switching device; and a resonance circuit which is connected to the connection node between the switching device and the first coil and which includes a second coil (445) and a second capacitor (444). The alternating-current voltage can be output via the resonance circuit.

For another example, in connection with the power transmission device $W_1$, the power reception device can include: a reception-side resonance circuit (RR) which includes a reception-side coil ($R_L$) for receiving the electric power and which has the reference frequency as the resonance frequency; and a changing/short-circuiting circuit (240) which either changes the resonance frequency of the reception-side resonance circuit from the reference frequency or short-circuits the reception-side coil. When the evaluation value is acquired, according to a signal communicated from the power transmission device, the resonance frequency of the reception-side resonance circuit can be changed or the reception-side coil can be short-circuited in the power reception device.

It is thus possible to suppress the influence of the reception-side resonance circuit on the current amplitude in the transmission-side coil, and thereby to ensure high accuracy in foreign object detection.

In that case, for example, in the power transmission device $W_1$, the direct-current voltage (VIN) can have a voltage value such that, when the test alternating-current voltage is fed to the transmission-side resonance circuit, the absolute value (|DELTA|) of the difference between a first value ($VT2_A$) and a second value ($VT2_B$), or the ratio (|DELTA|/$VT2_A$ or |DELTA|/$VT2_B$) of the absolute value to the first or second value, is equal to or lower than a predetermined value. The first value ($VT2_A$) can be the sensed amplitude value from the sensing circuit acquired when the test alternating-current voltage is fed to the transmission-side resonance circuit and in addition the power reception device is not present in a predetermined power transmission region for performing the power transmission. The second value ($VT2_B$) can be the sensed amplitude value from the sensing circuit acquired when the test alternating-current voltage is fed to the transmission-side resonance circuit and in addition the power reception device is present in the power transmission region in a state where the resonance frequency of the reception-side resonance circuit is changed or the reception-side coil is short-circuited.

It is thus possible to optimize, or make adequate, the accuracy of foreign object detection.

The power feeding device 1 itself in the first embodiment described above may function as a power transmission device according to the present invention, or a part of the power feeding device 1 in the first embodiment described above may function as a power transmission device according to the present invention. Likewise, the electronic device 2 itself in the first embodiment described above may function as a power reception device according to the present invention, or a part of the electronic device 2 in the first embodiment described above may function as a power reception device according to the present invention.

Second Embodiment

A second embodiment of the present invention will be described below. Like the first embodiment, the second embodiment deals with the details of a non-contact power feeding system including a power feeding device 1 and an electronic device 2 as shown FIG. 1A or 1B. The second embodiment is based on the first embodiment, and thus, for those features of the second embodiment which are not specifically mentioned, unless inconsistent, the relevant parts of the description given above in connection with the first embodiment apply similarly to the second embodiment. In the second embodiment, for those features of the second embodiment which contradict the corresponding features in the first embodiment, the description given in connection with the second embodiment prevails.

First, the parts of the description given in connection with the first embodiment with reference to FIG. 1A, FIG. 1B, FIG. 2 to FIG. 10, FIG. 11A, and FIG. 11B apply similarly to the second embodiment. It should however be noted that, in the second embodiment, the circuit configuration of the power transmission circuit differs from that shown in FIG. 12.

Figure 29:
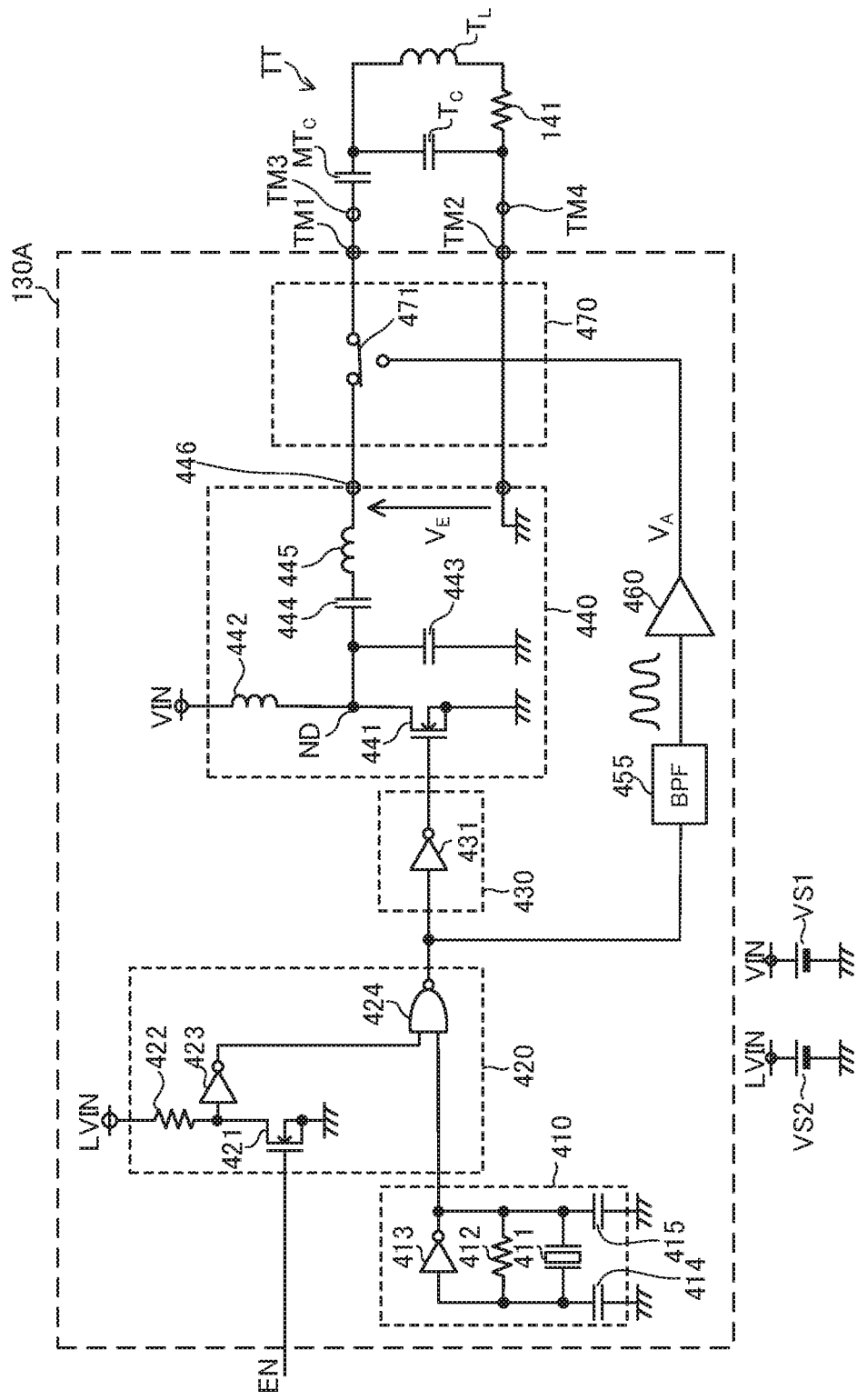
FIG. 29 is a circuit diagram of a part of a power feeding device, including a detailed circuit diagram of a power transmission circuit, according to a second embodiment of the present invention.

FIG. 29 shows a circuit diagram of the power transmission circuit 130A according to the second embodiment. In the second embodiment, the power transmission circuit 130A is used as the power transmission circuit 130 described previously. Like the power transmission circuit 130 in FIG. 12, the power transmission circuit 130A in FIG. 29 is suitable for foreign object presence/absence detection and achieves high-efficiency operation. FIG. 29 also shows some circuits other than the power transmission circuit 130A that are provided in the power feeding device 1. FIG. 29, like FIG. 7, assumes the power feeding-connected state. When any part of the description of the first embodiment is applied to the second embodiment, "power transmission circuit 130" in the description of the first embodiment is to be read as "power transmission circuit 130A".

The power transmission circuit 130A in FIG. 29 includes: an oscillation circuit 410 which generates and outputs a clock signal that is a square-wave signal at the reference frequency; an enable circuit 420 which switches whether or not to feed the circuit in the succeeding stage with a signal synchronous with the clock signal from the oscillation circuit 410; a drive circuit 430 which, when fed from the enable circuit 420 with the signal synchronous with the clock signal, feeds a class-E amplifier 440 with a drive signal synchronous with the clock signal and thereby drives the class-E amplifier 440; a class-E amplifier 440 which generates and outputs an alternating-current voltage $V_E$ at the reference frequency by switching a direct-current voltage VIN fed from a direct-current power source VS1 with the drive signal that is a square-wave signal at the reference frequency; a BPF (band-pass filter) 455 which, when fed with the signal synchronous with the clock signal from the enable circuit 420, extracts from the signal a signal component at the reference frequency and thereby outputs a sine-wave signal at the reference frequency; a class-A amplifier 460 which amplifies the output signal of the BPF 455 at a predetermined amplification factor and outputs the result; and a selection circuit 470 which is inserted between, at one end, the class-E amplifier 440 and the class-A amplifier 460 and, at the other end, the transmission-side resonance circuit TT and which feeds the resonance circuit TT selectively with either the output voltage $V_E$ of the class-E amplifier 440 or the output voltage VA of the class-A amplifier 460.

The circuit configuration of the power transmission circuit 130A will be described further. The oscillation circuit 410 includes blocks identified by the reference signs 411 to 415. An oscillator 411 is an oscillator which comprises a crystal oscillator or a ceramic oscillator and which yields an oscillation output at the reference frequency. A resistor 412 is connected in parallel with the oscillator 411. One end of the oscillator 411 is connected to the input terminal of an inverter circuit (logic NOT circuit) 413, and is also connected via a capacitor 414 to ground. The other end of the oscillator 411 is connected to the output terminal of the inverter circuit 413, and is also connected via a capacitor 415 to ground. Ground has a reference potential of 0 V (volts). The inverter circuit 413 yields, from its output terminal, a clock signal that is a square-wave signal at the reference frequency with a duty of 50%.

The enable circuit 420 includes blocks identified by the reference signs 421 to 424. A transistor 421 is formed as an N-channel MOSFET (metal-oxide-semiconductor field-effect transistor). Of the transistor 421, the gate is fed with an enable signal EN, the drain is connected to the input terminal of an inverter circuit 423 and is also connected via a resistor 422 to a terminal to which a direct-current voltage LVIN is applied, and the source is connected to ground. The direct-current voltages VIN and LVIN having predetermined positive direct-current voltage values are generated respectively by direct-current sources VS1 and VS2 provided in the power feeding device 1 (for example, in the IC 100). The logic circuits in the power transmission circuit 130A operate by using the direct-current voltage LVIN. A first and a second input terminal of a two-input NAND circuit (negative logical conjunction circuit) 424 are fed respectively with the output signals of the inverter circuits 413 and 423.

The drive circuit 430 comprises an inverter circuit 431. The input terminal of the inverter circuit 431 is fed with the output signal of the NAND circuit 424.

The class-E amplifier 440 includes blocks identified by the reference signs 441 to 445. A transistor 441 is formed as an N-channel MOSFET. Of the transistor 441, the gate is fed with the output signal of the inverter circuit 431, the drain is connected to a node ND, and the source is connected to ground. Of a choke coil 442, one end is connected to the node ND, and the other end is fed with the direct-current voltage VIN. Thus, the choke coil 442 is interposed in series between the direct-current voltage source VS1 and the transistor 441. The node ND is connected to one end of a capacitor 443, and the other end of the capacitor 443 is connected to ground. Thus, the capacitor 443 is connected in parallel with the transistor 441. In addition, the node ND is connected to one end of an LC resonance circuit composed of a capacitor 444 and a coil 445, so that between the other end of the LC resonance circuit, which is the output terminal 446 of the class-E amplifier 440, and ground, the output voltage $V_E$ of the class-E amplifier 440 appears. More specifically, the node ND is connected to one end of the capacitor 444, the other end of the capacitor 444 is connected to one end of the coil 445, and the other end of the coil 445 is connected to the terminal 446. The capacitor 444 and the coil 445 may be arranged the other way around.

The BPF 455 is a band-pass filter which extracts from the output signal of the NAND circuit 424 a signal component at the reference frequency and which then outputs the extracted signal.

The class-A amplifier 460 amplifies the output signal of the BPF 455 (the input signal from the BPF 455) at a predetermined amplification factor by class-A amplification, and outputs a voltage VA based on the amplified signal. The operating voltage of the class-A amplifier 460 may be the direct-current voltage VIN, or may be any other direct-current voltage.

The selection circuit 470 comprises a switch 471, and connects selectively either the output terminal 446 of the class-E amplifier 440 or the output terminal of the class-A amplifier 460 to the terminal TM1. FIG. 29 shows a state where the output terminal 446 of the class-E amplifier 440 is connected to the terminal TM1.

The control circuit 160 feeds selectively either a LOW-level or HIGH-level enable signal EN to the gate of the transistor 421.

When the level of the enable signal EN fed to the gate of the transistor 421 is HIGH, the transistor 421 is ON, and thus an inverse clock signal, which is the inverted signal of the clock signal, is output from the NAND circuit 424, with the result that a drive signal, which is a square-wave signal at the reference frequency with a duty of 50%, is fed from the inverter circuit 431 to the gate of the transistor 441. The drive signal is generally the same signal as the clock signal. When the NAND circuit 424 outputs the inverse clock signal as a square-wave signal at the reference frequency, the BPF 455 outputs a sine-wave signal at the reference frequency. Then, the class-A amplifier 460 outputs an alternating-current voltage VA with a sinusoidal waveform at the reference frequency.

When the level of the enable signal EN fed to the gate of the transistor 421 is LOW, the transistor 421 is OFF, and thus the output signal of the NAND circuit 424 is held at HIGH level, with the result that the potential at the gate of the transistor 441 is held at LOW level, and thus the transistor 441 remains OFF (accordingly, the class-E amplifier 440 stops operating, and ceases to output the alternating-current voltage). When the output signal of the NAND circuit 424 is held at HIGH level, the class-A amplifier 460 outputs no alternating-current voltage.

The transistor 441 may be configured as a parallel circuit of a plurality of transistors, in which case the inverter circuit 431 may be configured as a parallel circuit of a plurality of inverter circuits. Some of the components of the power transmission circuit 130A shown in FIG. 29 (for example, the oscillator 411 and the coil in the class-E amplifier 440) can be provided outside the IC 100.

The operation of the class-E amplifier 440 is as described in connection with the first embodiment with reference to FIG. 13.

Figure 30A:
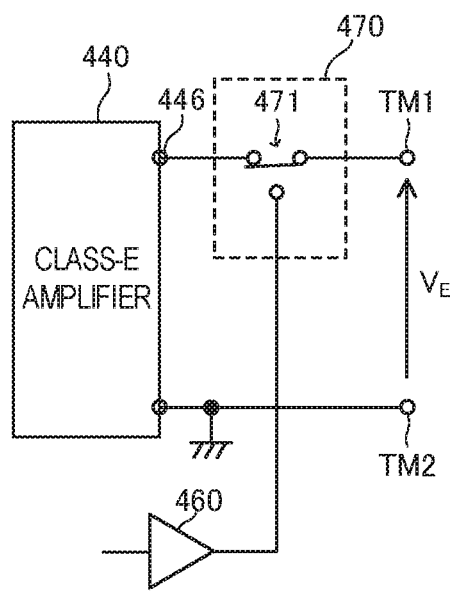
FIG. 30A and FIG. 30B are diagrams showing a first switch state and a second switch state, respectively, of a selection circuit according to the second embodiment of the present invention.
Figure 30B:
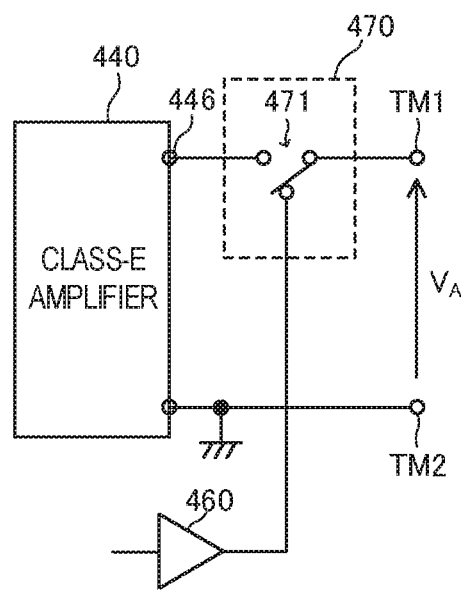

Referring to FIG. 30A and FIG. 30B, the control circuit 160 can control the switch 471 to switch the selection circuit 470 between a first switch state and a second switch state. FIG. 30A and FIG. 30B show the selection circuit 470 in the first and second switch states respectively. In the following description, unless otherwise stated, the first and second switch states refer to those as observed when the switch circuit 110 is in the power feeding-connected state.

In the first switch state, the output terminal 446 of the class-E amplifier 440 is connected to the terminal TM1, with the result that the output voltage (output alternating-current voltage) $V_E$ of the class-E amplifier 440 is fed to the resonance circuit TT. In the second switch state, the output terminal of the class-A amplifier 460 is connected to the terminal TM1, with the result that the output voltage (output alternating-current voltage) VA of the class-A amplifier 460 is fed to the resonance circuit TT. The amplitude of the alternating-current voltage VA is smaller than (for example, one out of several to several tens of parts of) the amplitude of the alternating-current voltage $V_E$. Accordingly, the intensity of the magnetic field generated in the transmission-side coil $T_L$ as a result of the resonance circuit TT being fed with the alternating-current voltage VA is significantly lower than the intensity of the magnetic field generated in the transmission-side coil $T_L$ as a result of the resonance circuit TT being fed with the alternating-current voltage $V_E$.

The power feeding device 1 can perform a foreign object detection process to detect the presence or absence of a foreign object. A foreign object detection process that is performed before power transfer is performed, in particular, is referred to as a pFOD process. When a magnetic field is being generated in the transmission-side coil $T_L$, placing a foreign object on the power feeding stage 12 causes an electric current based on the magnetic field generated in the transmission-side coil $T_L$ to pass in the foreign object; the current in the foreign object generates a voltage in the resonance circuit TT, and causes a variation in the current amplitude in the transmission-side coil $T_L$ (as mentioned earlier, this variation is referred to as a detection target current amplitude variation). By observing a detection target current amplitude variation, it is possible to judge the presence or absence of a foreign object. However, generating a strong magnetic field in the pFOD process may lead to, as mentioned earlier, the foreign object being damaged or otherwise affected.

One possible approach is, considering that the alternating-current voltage $V_E$ is used as a supply voltage to the resonance circuit TT not only in the power transmission operation but also in the pFOD process, to lower the direct-current voltage VIN in the pFOD process compared with that in the power transmission operation (in the second embodiment, this approach is referred to as the lowered VIN approach). The lowered VIN approach requires a configuration, different from that of the this embodiment, where the BPF 455, the class-A amplifier 460, and the selection circuit 470 are omitted from the power transmission circuit 130A and the output terminal 446 of the class-E amplifier 440 is connected directly to the terminal TM1. The lowered VIN approach may help avoid damaging or otherwise affecting a foreign object but, because of the use of the class-E amplifier 440 in the power transmission circuit 130A with a view to achieving high-efficiency operation, raises the following concerns.

If a foreign object is present at a position where it causes a detection target current amplitude variation, due to magnetic coupling and the like between the foreign object and the transmission-side coil $T_L$, the impedance value of the resonance circuit TT as observed from the class-E amplifier 440 deviates from 50Ω. The class-E amplifier 440 is designed to perform class-E amplification operation on the assumption that the impedance value of the resonance circuit TT as observed from the class-E amplifier 440 equals 50Ω, and thus a deviation in the impedance value from 50Ω produces a variation in the output of the class-E amplifier 440 compared with that when the impedance value equals 50Ω. The variation in the output here includes a variation in the amplitude of the output voltage $V_E$ of the class-E amplifier 440 and a variation in the waveform of the output voltage $V_E$. A variation in the output of the class-E amplifier 440 resulting from a deviation in the impedance value from 50Ω causes a variation in the current amplitude in the transmission-side coil $T_L$. This variation in the current amplitude in the transmission-side coil $T_L$ resulting from a variation in the output of the class-E amplifier 440 is referred to, for convenience' sake, as a noise current amplitude variation. The presence of a noise current amplitude variation interferes with the detection of a detection target current amplitude variation which should rather be observed for foreign object detection.

If, for discussion's sake, the amount and direction of a variation in current amplitude resulting from a noise current amplitude variation are determined unequivocally, it is possible, by taking what results from the noise current amplitude variation into consideration, to perform foreign object detection by the pFOD process with high accuracy. However, in reality, depending on factors such as the kind of the foreign object and how it is placed on the power feeding stage 12, the amount and direction of a variation in current amplitude resulting from a noise current amplitude variation vary (that is, a noise current amplitude variation may cause the current amplitude in the transmission-side coil $T_L$ to increase in some cases and decrease in other cases, and by varying amounts). Thus, a noise current amplitude variation lowers the accuracy of foreign object detection by the pFOD process.

Out of these considerations, in this embodiment, the lowered VIN approach is not adopted, but instead the effect of a noise current amplitude variation is eliminated by use of the class-A amplifier 460 and the selection circuit 470. Specifically, in this embodiment, the voltage value of the direct-current voltage VIN is fixed, and when the power transmission operation is performed, the selection circuit 470 is kept in the first switch state so that high-efficiency operation using the class-E amplifier 440 is achieved, while, in the pFOD process, the selection circuit 470 is kept in the second switch state so that the output voltage VA of the class-A amplifier 460 is fed to the resonance circuit TT. The class-A amplifier 460 functions, regardless of the impedance value of the circuit in the succeeding stage as observed from it, to amplify the signal fed to it at a predetermined amplification factor and then output the result; thus, the class-A amplifier 460 yields a constant output irrespective of the presence or absence of a foreign object, and does not produce a current amplitude variation that constitutes a noise current amplitude variation.

pFOD Process (pFOD Process Before Power Transfer)

Figure 31:
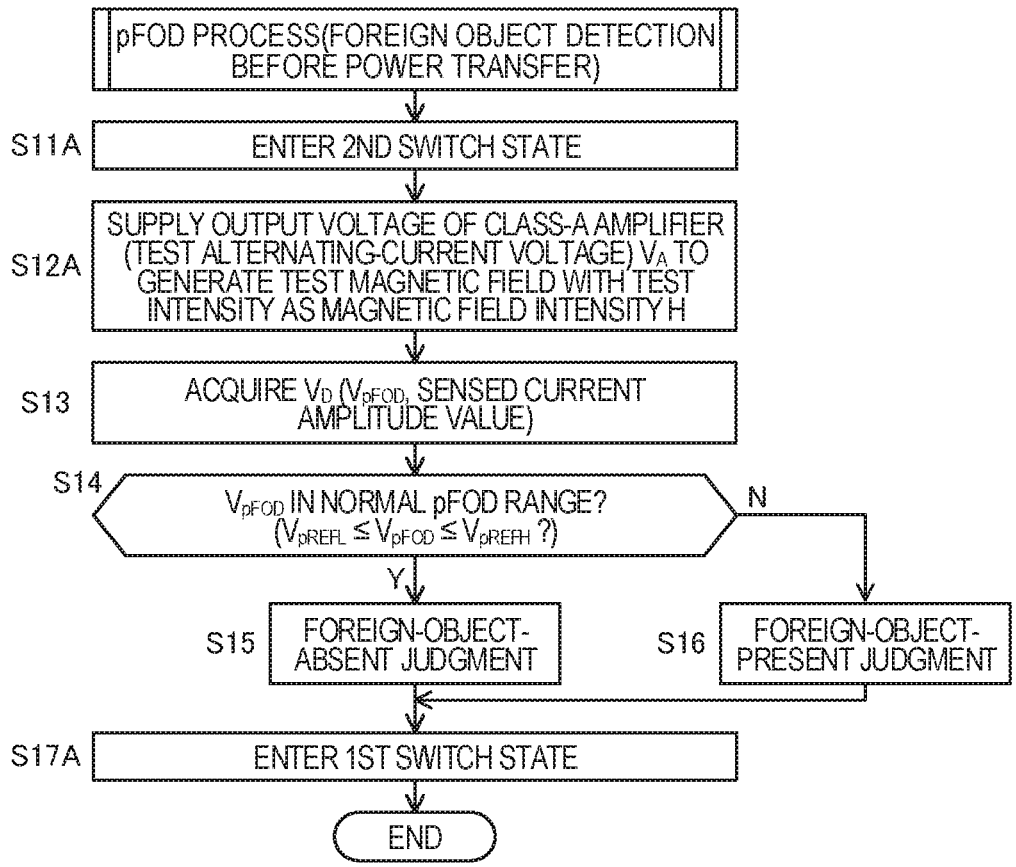
FIG. 31 is an operation flow chart of a pFOD process performed in the power feeding device according to the second embodiment of the present invention.

With reference to FIG. 31, a pFOD process based on what has been discussed above will be described. FIG. 31 is a flow chart of the pFOD process in the second embodiment.

When the pFOD process is performed, the power transmission circuit 130A is connected to the resonance circuit TT. Then, first, at step S11A, the second switch state is put into effect. Thus, at step S12A, the output voltage VA of the class-A amplifier 460 is, as a test alternating-current voltage, fed via the selection circuit 470 to the resonance circuit TT, with the result that a test magnetic field with a predetermined test intensity as its magnetic field intensity H is generated in the transmission-side coil $T_L$. The magnetic field intensity H is the intensity of the magnetic field generated in the transmission-side coil $T_L$, and more precisely it is the magnetic field intensity of the alternating magnetic field generated by the transmission-side coil $T_L$ and oscillating at the reference frequency. The test intensity, which is the magnetic field intensity of the test magnetic field, is significantly lower than the intensity of the magnetic field generated in the transmission-side coil $T_L$ in power transfer (that is, in the power transmission operation) (that is, the magnetic field intensity of the power transmission magnetic field; for example, 45 to 60 A/m), and falls, for example, within the range between the lower limit value, 1.5 A/m, and the upper limit value, 7.5 A/m, of communication magnetic field intensity. Thus, there is no or almost no danger of the test magnetic field damaging or otherwise affecting the foreign object 3.

Subsequently to step S12A, at step S13, by using the load sensing circuit 140, the control circuit 160 acquires, as a sensed current amplitude value $V_{pFOD}$, the voltage value $V_D$ as observed when the test magnetic field is being generated. The sensed current amplitude value $V_{pFOD}$ has a value commensurate with the amplitude of the current passing in the transmission-side coil $T_L$ when the test magnetic field is being generated in the transmission-side coil $T_L$. During the period in which the pFOD process is performed, according to an instruction from the power feeding device 1 via NFC communication, the $f_O$ changing/short-circuiting operation (resonance frequency changing operation or coil short-circuiting operation) is performed in the electronic device 2. Accordingly, the resonance circuit RR (reception-side coil $R_L$) generally does not act as a load to the transmission-side coil $T_L$, and thus causes no or almost no decrease in the sensed current amplitude value $V_{pFOD}$.

Subsequently to step S13, at step S14, the control circuit 160 checks whether or not the sensed current amplitude value $V_{pFOD}$ falls within a normal pFOD range. If the sensed current amplitude value $V_{pFOD}$ falls within the normal pFOD range, the control circuit 160 judges that no foreign object 3 is present on the power feeding stage 12 (step S15). This judgment is referred to as a foreign-object-absent judgment. On the other hand, if the sensed current amplitude value $V_{pFOD}$ falls outside the normal pFOD range, the control circuit 160 judges that a foreign object 3 is present on the power feeding stage 12 (step S16). This judgment is referred to as a foreign-object-present judgment. After a foreign-object-absent or foreign-object-present judgment, the selection circuit 470 is brought into the first switch state (step S17A), and the pFOD process is ended. On making a foreign-object-absent judgement, the control circuit 160 recognizes that the power transmission operation by the power transmission circuit 130A is permissible, and permits the power transmission circuit 130A to perform the power transmission operation (power transmission using the resonance circuit TT); on making a foreign-object-present judgment, the control circuit 160 recognizes that the power transmission operation by the power transmission circuit 130A is not permissible, and inhibits the power transmission circuit 130A from performing the power transmission operation. In the power transmission operation, the selection circuit 470 is kept in the first switch state; thus, the output voltage $V_E$ of the class-E amplifier 440 is, as a power transmission alternating-current voltage, fed via the selection circuit 470 to the resonance circuit TT, so that a predetermined power transmission magnetic field is generated in the transmission-side coil $T_L$.

The normal pFOD range is a range of values equal to or larger than a predetermined lower limit value $V_{pREFL}$ but equal to or smaller than a predetermined upper limit value $V_{pREFH}$ ($0<V_{pREFL}<V_{pREFH}$). Accordingly, when the check inequality "$V_{pREFL} \leq V_{pFOD} \leq V_{pREFH}$" is satisfied, a foreign-object-absent judgment is made, and otherwise a foreign-object-present judgment is made.

When the pFOD process is performed, if a foreign object 3 is present on the power feeding stage 12, the resonance circuit JJ (coil $J_L$) in the foreign object 3 acts as a load to the transmission-side coil $T_L$, with the result that a decrease is observed in the sensed current amplitude value $V_{pFOD}$ as compared with when no foreign object 3 is present on the power feeding stage 12.

A foreign object can be a foreign object 3a (unillustrated) different from the foreign object 3. The foreign object 3a is, for example, a metal body containing aluminum (a foil or sheet of aluminum) or a metal body containing copper. When the pFOD process is performed, if a foreign object 3a is present on the power feeding stage 12, due to electric and magnetic effects, an increase is observed in the sensed current amplitude value $V_{pFOD}$ as compared with when no foreign object 3a is present on the power feeding stage 12.

The lower limit value $V_{pREFL}$ and the upper limit value $V_{pREFH}$ are set beforehand through experiments or the like and stored in the memory 150 such that, before power transfer is performed: if a foreign object 3 is present on the power feeding stage 12, the sensed current amplitude value $V_{pFOD}$ is lower than the lower limit value $V_{pREFL}$; if a foreign object 3a is present on the power feeding stage 12, the sensed current amplitude value $V_{pFOD}$ is higher than the upper limit value $V_{pREFH}$; and if no foreign object (3 or 3a) is present on the power feeding stage 12, the sensed current amplitude value $V_{pFOD}$ falls within the normal pFOD range.

When a power transmission magnetic field is generated with a foreign object 3a present on the power feeding stage 12, the foreign object 3a may absorb electric power and heat up. In this embodiment, where the reference frequency as the carrier frequency for power transfer is assumed to be 13.56 MHz, it can be said that no such heating-up is likely. Accordingly, it is also possible, with no consideration given to the presence of the foreign object 3a, to make a foreign-object-present judgment only if the sensed current amplitude value $V_{pFOD}$ is lower than the lower limit value $V_{pREFL}$ and to make a foreign-object-absent judgment always if the sensed current amplitude value $V_{pFOD}$ is equal to or higher than the lower limit value $V_{pREFL}$ (that is, the upper limit value $V_{pREFH}$ may be omitted). However, in the invention according to this embodiment, the reference frequency is not limited to 13.56 MHz; when the reference frequency is set at, for example, about several hundred kilohertz, the foreign object 3a is likely to heat up, and therefore it is preferable to adopt the previously described method in which the normal pFOD range is defined by not only the lower limit value $V_{pREFL}$ but also the upper limit value $V_{pREFH}$.

Figure 32:
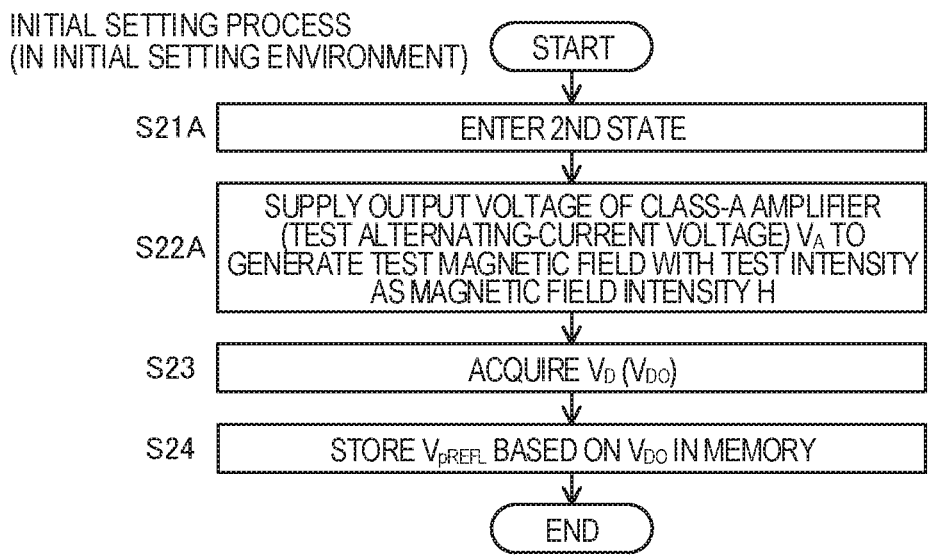
FIG. 32 is an operation flow chart of an initial setting process performed in the power feeding device according to the second embodiment of the present invention.

An additional description will now be given of how the lower limit value $V_{pREFL}$ is determined. The lower limit value $V_{pREFL}$ is determined in an initial setting process. FIG. 32 is an operation flow chart of the initial setting process according to the second embodiment. The initial setting process is performed by the IC 100 in an initial setting environment as described below. In the initial setting environment, the load to the transmission-side coil $T_L$ is null or negligibly small, and no object in which an electric current can be generated by the magnetic field generated in the transmission-side coil $T_L$ (including a coil that magnetically couples with the transmission-side coil $T_L$) is present except the components of the power feeding device 1. The detached state in FIG. 1A can be taken as satisfying the initial setting environment. To secure an initial setting environment, the initial setting process can be performed, for example, at the time of manufacture, shipment, or the like of the power feeding device 1. So long as an initial setting environment can be secured, the initial setting process can be performed at any time.

When the initial setting process is performed, the power transmission circuit 130A is connected to the resonance circuit TT. Then, first, at step S21A, the second switch state is put into effect. Thus, at step S22A, the output voltage VA of the class-A amplifier 460 is, as a test alternating-current voltage, fed via the selection circuit 470 to the resonance circuit TT, with the result that a test magnetic field with a predetermined test intensity as its magnetic field intensity H is generated in the transmission-side coil $T_L$. Subsequently to step S22A, at step S23, by using the load sensing circuit 140, the control circuit 160 acquires, as a voltage value $V_{DO}$, the voltage value $V_D$ as observed when the test magnetic field is being generated. Then, at step S24, a lower limit value $V_{pREFL}$ based on the voltage value $V_{DO}$ is stored in the memory 150. The lower limit value $V_{pREFL}$ is set at a value lower than the voltage value $V_{DO}$ so that, only when a foreign object 3 is present, the pFOD process yields a foreign-object-present judgment. For example, the setting may be such that "$V_{pREFL}=V_{DO}-\Delta V$" or "$V_{pREFL}=V_{DO}\times k$". Here, $\Delta V$ represents a predetermined positive minute value (it may also be that $\Delta V=0$); k represents a coefficient with a predetermined positive value smaller than 1. The voltage value $V_D$ that is expected to be obtained when the magnetic field intensity H is set at a predetermined test intensity in the initial setting environment can be estimated at the stage of designing. Based on the value derived from the estimation, it is possible, without performing the initial setting process, to determine the lower limit value $V_{pREFL}$ and store it in the memory 150.

The description given with reference to FIG. 17A to FIGS. 17D and 18 in connection with the first embodiment applies similarly to the second embodiment.

[Signal Exchange Before Power Transfer]

Though the exchange of signals between the devices 1 and 2 before power transfer is performed is similar to that shown in FIG. 19, the exchange of signals in the second embodiment will be described below. In connection with the second embodiment, unless otherwise stated, the following description assumes that the electronic device 2 is present on the power feeding stage 12 in the regularly placed state (FIG. 1B).

Referring to FIG. 19, first, with the power feeding device 1 on the transmitting side and the electronic device 2 on the receiving side, the power feeding device 1 (IC 100) transmits an inquiry signal 510 to a device on the power feeding stage 2 (hereinafter referred to also as the power feeding target device) by NFC communication. The power feeding target device includes the electronic device 2, and can include a foreign object 3. The inquiry signal 510 includes a signal inquiring individual identification information of the power feeding target device, a signal inquiring whether or not the power feeding target device is in a state enabled to perform NFC communication, and a signal inquiring whether or not the power feeding target device can receive electric power or is requesting transmission of electric power.

On receiving the inquiry signal 510, the electronic device 2 (IC 200) transmits a response signal 520 responding to the inquiry of the inquiry signal 510 to the power feeding device 1 by NFC communication. On receiving the response signal 520, the power feeding device 1 (IC 100) analyzes the response signal 520, and if the power feeding target device is enabled to perform NFC communication and in addition it can receive electric power or is requesting transmission of electric power, the power feeding device 1 (IC 100) transmits a test request signal 530 to the power feeding target device by NFC communication. On receiving the test request signal 530, the electronic device 2 (IC 200) as the power feeding target device transmits a response signal 540 responding to the test request signal 530 to the power feeding device 1 by NFC communication, and then promptly performs the $f_O$ changing/short-circuiting operation (resonance frequency changing operation or coil short-circuiting operation). The test request signal 530 is, for example, a signal requesting and indicating the execution of the $f_O$ changing/short-circuiting operation, and when triggered by the reception of the test request signal 530, the control circuit 250 in the electronic device 2 makes the resonance state changing circuit 240 perform the $f_O$ changing/short-circuiting operation. Before the reception of the test request signal 530, the $f_O$ changing/short-circuiting operation remains unperformed. The test request signal 530 may be any signal so long as it can trigger the execution of the $f_O$ changing/short-circuiting operation, and may be contained in the inquiry signal 510.

On receiving the response signal 540, the power feeding device 1 (IC 100) performs the above-described pFOD process. During the period in which the pFOD process is performed, the electronic device 2 (IC 200) continues performing the $f_O$ changing/short-circuiting operation. Specifically, the electronic device 2 (IC 200), by using an incorporated timer, continues performing the $f_O$ changing/short-circuiting operation for a time corresponding to the length of the period for which the pFOD process is performed, and then stops the $f_O$ changing/short-circuiting operation.

In the pFOD process, if it is judged that no foreign object is present on the power feeding stage 12, the power feeding device 1 (IC 100) transmits a verification signal 550 to the power feeding target device by NFC communication. The verification signal 550 includes, for example, a signal notifying the power feeding target device of the forthcoming power transmission. On receiving the verification signal 550, the electronic device 2 (IC 200) transmits a response signal 560 responding to the verification signal 550 to the power feeding device 1 by NFC communication. The response signal 560 includes, for example, a signal notifying recognition of what is conveyed by the verification signal 550 or a signal giving permission to what is conveyed by the verification signal 550. On receiving the response signal 560, the power feeding device 1 (IC 100) connects the power transmission circuit 130A to the resonance circuit TT to perform the power transmission operation, and thus power transfer 570 is achieved. As mentioned above, when the power transmission operation is performed, the selection circuit 470 is kept in the first switch state.

In the first case in FIG. 17A, power transfer 570 is performed through the procedure described above. However, in the second case in FIG. 17B, although the procedure proceeds up to the transmission and reception of the response signal 540, in the pFOD process, it is judged that a foreign object is present on the power feeding stage 12; thus, no power transfer 570 is performed. A single session of power transfer 570 may be performed for a predetermined time. The sequence of operation from the transmission of the inquiry signal 510 to power transfer 570 may be performed repeatedly. In practice, as shown in FIG. 20, NFC communication, a pFOD process, and power transfer (NFC power transfer) can be performed sequentially and repeatedly. That is, in the non-contact power feeding system, operation for performing NFC communication, operation for performing a pFOD process, and operation for performing power transfer (NFC power transfer) can be performed sequentially and repeatedly on a time-division basis.

[Operation Flow Chart of a Power Feeding Device and an Electronic Device]

The operation flow chart of the power feeding device 1 according to the second embodiment is similar to that shown in FIG. 21; the flow of the operation of the power feeding device 1 described in connection with the first embodiment applies similarly to the power feeding device 1 in the second embodiment. However, in the second embodiment, when the power transmission operation is performed, the selection circuit 470 is kept in the first switch state. Moreover, as mentioned above, when any part of the description of the first embodiment is applied to the second embodiment, "power transmission circuit 130" in the description of the first embodiment is to be read as "power transmission circuit 130A".

The operation flow chart of the electronic device 2 according to the second embodiment is similar to that shown in FIG. 22; the flow of the operation of the electronic device 2 described in connection with the first embodiment applies similarly to the electronic device 2 in the second embodiment.

[mFOD Process]

It can happen that a foreign object is placed on the power feeding stage 12 after the start of power transmission operation. An mFOD process serves as a foreign object detection process during power transfer, and through the mFOD process, the presence or absence of a foreign object is constantly monitored during power transfer. During the period in which the power transmission operation is performed, the control circuit 160 performs the mFOD process repeatedly. What is performed in the mFOD process, including how and at what specific values the lower and upper limit values $V_{mREFL}$ and $V_{mREFH}$ used in the mFOD process are set, is similar to what has been previously described in connection with the first embodiment with reference to FIG. 23, FIG. 24A, and FIG. 24B, and accordingly no overlapping description will be repeated.

The function of the mFOD process is not limited to foreign object presence/absence judgment. The mFOD process serves to turn the power transmission permit flag to OFF in any situation unsuitable to continue the power transmission operation such as when the sensed current amplitude value $V_{mFOB}$ falls outside the normal mFOD range. For example, after the start of the power transmission operation, when the electronic device 2 is removed off the power feeding stage 12, the load of power transmission as observed from the transmission-side coil $T_L$ becomes lighter and the sensed current amplitude value $V_{mFOD}$ exceeds the upper limit value $V_{mREFH}$; thus, the power transmission permit flag is turned to OFF (step S54 in FIG. 23).

Thus, in this embodiment, an alternating-current voltage for power transmission is generated by use of the low-loss class-E amplifier 440, and this helps increase the efficiency of the entire system involved in power transfer. Moreover, the foreign object detection process makes it possible to prevent a foreign object from being damaged or otherwise affected. In a case where also the foreign object detection process (the pFOD process) before power transfer is attempted by use of the class-E amplifier 440, the above-mentioned noise current amplitude variation may degrade the accuracy of foreign object presence/absence detection; however, in this embodiment, the foreign object detection process (the pFOD process) before power transfer is performed by use of the class-A amplifier 460, and this helps keep the accuracy of foreign object presence/absence detection high.

The amplifier (460) for feeding the alternating-current voltage VA to the resonance circuit TT in the pFOD process can be any amplifier other than a class-A amplifier, for example, a class-B push-pull amplifier, so long as it can amplify the input alternating-current signal at the reference frequency and output the result for both positive and negative signal components.

<<Studies on the Present Invention, Part 2>>

To follow are studies on the present invention as embodied as the second embodiment described above.

A power transmission device $W_2$ according to one aspect of the present invention is a power transmission device that can transmit electric power to a power reception device by magnetic resonance, and includes: a transmission-side resonance circuit (TT) which includes a transmission-side coil ($T_L$) for transmitting the electric power and which has a predetermined reference frequency as the resonance frequency; a class-E amplifier (440) which generates and outputs a power transmission alternating-current voltage ($V_E$) at the reference frequency by switching a direct-current voltage fed from a direct-current power source by using a periodic signal at the reference frequency; an input signal amplifier (460) which generates and outputs a test alternating-current voltage (VA) at the reference frequency by amplifying an input alternating-current voltage at the reference frequency; a selection circuit (470) which feeds the transmission-side resonance circuit selectively with either the power transmission alternating-current voltage or the test alternating-current voltage; a sensing circuit (140) which senses the amplitude of the current passing through the transmission-side coil; and a control circuit (160) which controls the selection circuit and thereby controls the supply voltage to the transmission-side resonance circuit. The control circuit acquires, as an evaluation value ($V_{pFOD}$), the sensed amplitude value from the sensing circuit when the test alternating-current voltage is fed to the transmission-side resonance circuit, and controls, based on the evaluation value, whether or not to perform power transmission by feeding the power transmission alternating-current voltage to the transmission-side resonance circuit.

The use of the class-E amplifier permits high-efficiency power transfer. On the other hand, a property is observed such that, if a foreign object is present at a place where it responds to the magnetic field generated in the transmission-side coil, a variation appears in the current amplitude in the transmission-side coil. By utilizing this property, it is possible to detect the presence or absence of a foreign object based on a variation in the current amplitude; it is then possible to perform control such that, if a foreign object is detected being present, power transmission is inhibited.

However, when a foreign object is present, a variation may occur in the impedance value of the transmission-side resonance circuit as observed from the class-E amplifier; this variation in the impedance value causes a variation in the output of the class-E amplifier, and eventually causes a variation in the current amplitude in the transmission-side coil. A variation (noise current amplitude variation) in the current amplitude in the transmission-side coil ascribable to a variation in the impedance value interferes with the detection of the current amplitude variation (detection target current amplitude variation) that should rather be observed for foreign object detection.

As a solution, in the power transmission device $W_2$, separately from the class-E amplifier, the input signal amplifier is provided so that, before power transmission is performed, the sensed current amplitude value (evaluation value) is acquired by use of the input signal amplifier. It is thus possible, while receiving the benefits of high-efficiency power transfer owing to the class-E amplifier, to ensure high-accuracy foreign object detection (that is, to ensure proper power transmission permission/inhibition control).

Specifically, for example, in the power transmission device $W_2$, the control circuit can judge, based on the evaluation value ($V_{pFOD}$), the presence or absence of a foreign object which differs from the power reception device and in which a current based on the magnetic field generated in the transmission-side coil can be generated, and can control, based on the result of the judgment, whether or not to perform the power transmission.

More specifically, for example, in the power transmission device $W_2$, the control circuit can, on judging that there is no foreign object, permit the power transmission and, on judging that there is a foreign object, inhibit the power transmission from being performed.

For another example, in the power transmission device $W_2$, the control circuit can judge the presence or absence of a foreign object by judging whether or not the evaluation value falls outside a predetermined range.

For another example, in the power transmission device $W_2$, the class-E amplifier (440) can include: a switching device (441) which performs switching operation according to the periodic signal; a first coil (442) which is interposed between the direct-current power source and the switching device; a first capacitor (443) which is connected in parallel with the switching device; and a resonance circuit which is connected to the connection node between the switching device and the first coil and which includes a second coil (445) and a second capacitor (444). The alternating-current voltage can be output via the resonance circuit.

For another example, in the power transmission device $W_2$, the amplitude of the test alternating-current voltage can be smaller than the amplitude of the power transmission alternating-current voltage.

It is thus possible to hold the intensity of the magnetic field generated in the transmission-side coil when the evaluation value is acquired relatively low, and thereby to prevent a foreign object from being damaged or otherwise affected by the magnetic field generated when the evaluation value is acquired.

For another example, in the power transmission device $W_2$, the periodic signal to the class-E amplifier and the input alternating-current voltage to the input signal amplifier can be generated based on a common signal having the reference frequency.

For another example, in connection with second power transmission device $W_2$, the power reception device can include: a reception-side resonance circuit (RR) which includes a reception-side coil ($R_L$) for receiving the electric power and which has the reference frequency as the resonance frequency; and a changing/short-circuiting circuit (240) which either changes the resonance frequency of the reception-side resonance circuit from the reference frequency or short-circuits the reception-side coil. When the evaluation value is acquired, according to a signal communicated from the power transmission device, the resonance frequency of the reception-side resonance circuit can be changed or the reception-side coil can be short-circuited in the power reception device.

It is thus possible to suppress the influence of the reception-side resonance circuit on the current amplitude in the transmission-side coil, and thereby to ensure high accuracy in foreign object detection.

The power feeding device 1 itself in the second embodiment described above may function as a power transmission device according to the present invention, or a part of the power feeding device 1 in the second embodiment described above may function as a power transmission device according to the present invention. Likewise, the electronic device 2 itself in the second embodiment described above may function as a power reception device according to the present invention, or a part of the electronic device 2 in the second embodiment described above may function as a power reception device according to the present invention.

Third Embodiment

A third embodiment of the present invention will be described below. Like the first embodiment, the third embodiment deals with the details of a non-contact power feeding system including a power feeding device 1 and an electronic device 2 as shown FIG. 1A or 1B. The third embodiment is based on the first embodiment, and thus, for those features of the third embodiment which are not specifically mentioned, unless inconsistent, the relevant parts of the description given above in connection with the first embodiment apply similarly to the third embodiment. In the third embodiment, for those features of the third embodiment which contradict the corresponding features in the first embodiment, the description given in connection with the third embodiment prevails. The third embodiment may instead be based on the second embodiment, and thus, for those features of the third embodiment which are not specifically mentioned, unless inconsistent, the relevant parts of the description given above in connection with the second embodiment apply similarly to the third embodiment. In that case, in the third embodiment, for those features of the third embodiment which contradict the corresponding features in the second embodiment, the description given in connection with the third embodiment prevails.

First, the parts of the description given in connection with the first embodiment with reference to FIG. 1A, FIG. 1B, FIG. 2, and FIG. 3 apply similarly to the third embodiment. It should however be noted that the transmission-side IC 100 in the third embodiment is referred to as the transmission-side IC 100B, or simply as the IC 100B, and that the reception-side IC 200 in the third embodiment is referred to as the transmission-side IC 200B, or simply as the IC 200B.

Accordingly (see FIG. 1B and FIG. 2), the power feeding device 1 according to the third embodiment includes: an AC-DC converter 13 which generates and yields, from a commercial alternating-current voltage fed to it via a power plug 11, a direct-current voltage with a predetermined voltage value; a transmission-side IC 100B which is an integrated circuit that operates by using the output voltage of the AC-DC converter 13; and a transmission-side resonance circuit TT which is connected to the IC 100B. The electronic device 2 according to the third embodiment includes: a reception-side IC 200B which is an integrated circuit; a reception-side resonance circuit RR which is connected to the IC 200B; a battery 21 which is a secondary battery; and a functional circuit 22 which operates based on the output voltage of the battery 21.

A regularly placed state and a detached state are defined as in the first embodiment; in the third embodiment, they may be defined also in the following manner.

A state where the electronic device 2 is placed in a predetermined range on the power feeding stage 12 so that NFC communication and power transfer as mentioned previously are possible is called the regularly placed state (see FIG. 1B). In a case where magnetic resonance is utilized, communication and power transfer are possible even over a comparatively large distance to the partner. However, once the electronic device 2 is significantly distant from the power feeding stage 12, NFC communication and power transfer are no longer possible. A state where the electronic device 2 is sufficiently away from the power feeding stage 12 so that NFC communication and power transfer are not possible is called the detached state (see FIG. 1A). Although the power feeding stage 12 shown in FIG. 1A has a flat surface, the power feeding stage 12 may have formed in it a depression or the like that fits the shape of the electronic device 2 to be placed on it.

Figure 33:
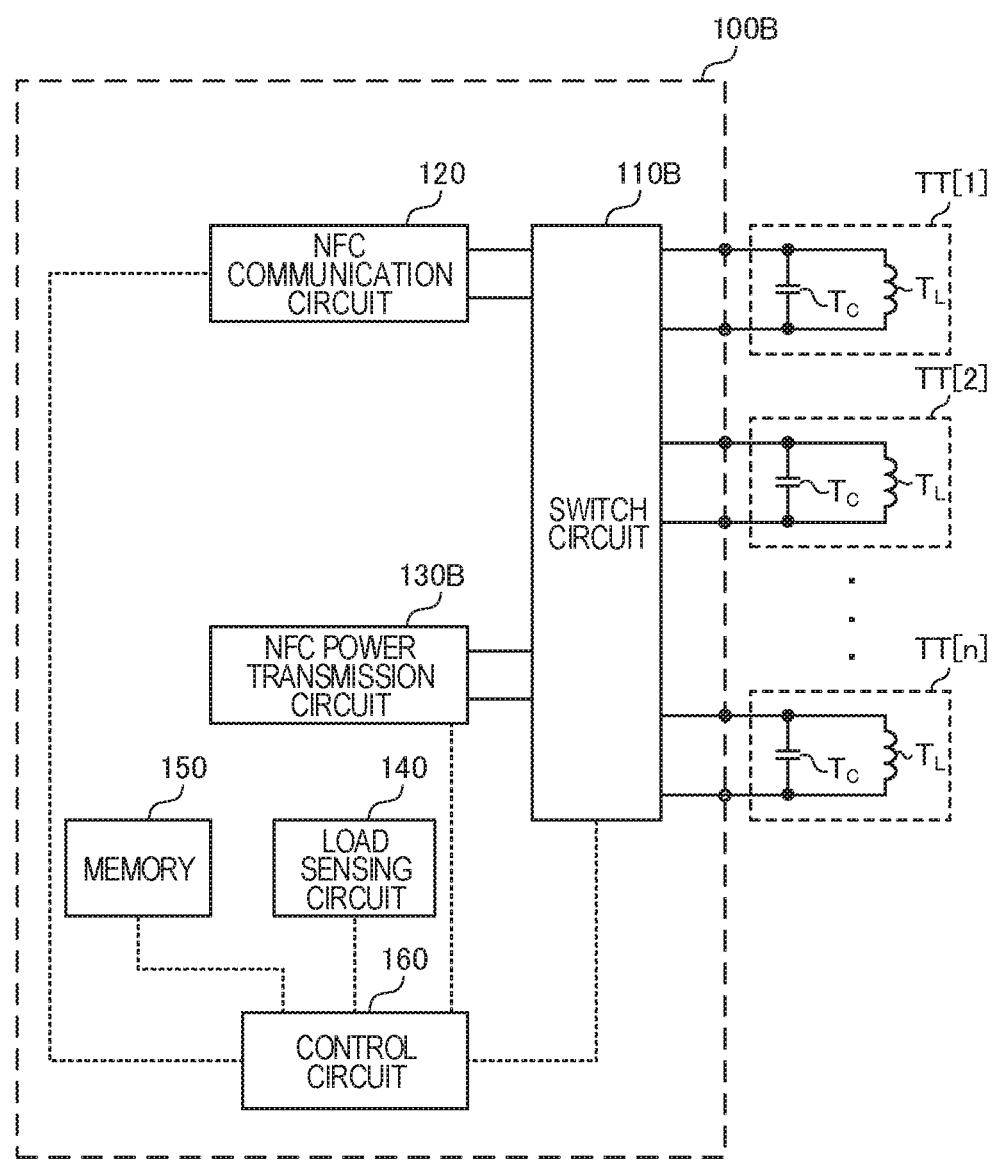
FIG. 33 is a configuration diagram of a part of a power feeding device, including an internal block diagram of an IC in the power feeding device, according to a third embodiment of the present invention.

FIG. 33 is a configuration diagram of a part of the power feeding device 1, including an internal block diagram of the IC 100B. The IC 100B includes blocks identified by the reference signs 110B, 120, 130B, 140, 150, and 160. The power feeding device 1 according to the third embodiment includes n resonance circuits TT, and these n resonance circuits TT are connected to the IC 100B. Wherever the n resonance circuits TT need to be distinguished from each other, they are referred to by reference signs TT[1] to TT[n]. Here, n is any integer equal to or larger than 2. The resonance circuits TT[1] to TT[n] each have the same configuration as the resonance circuit TT described in connection with the first embodiment. The resonance circuits TT[1] to TT[n] all have their respective resonance frequencies set at the reference frequency. In the following description, what is referred to simply as a transmission-side coil $T_L$ or transmission-side capacitor $T_C$ denotes the transmission-side coil $T_L$ or transmission-side capacitor $T_C$ in any of the resonance circuits TT[1] to TT[n].

Figure 34:
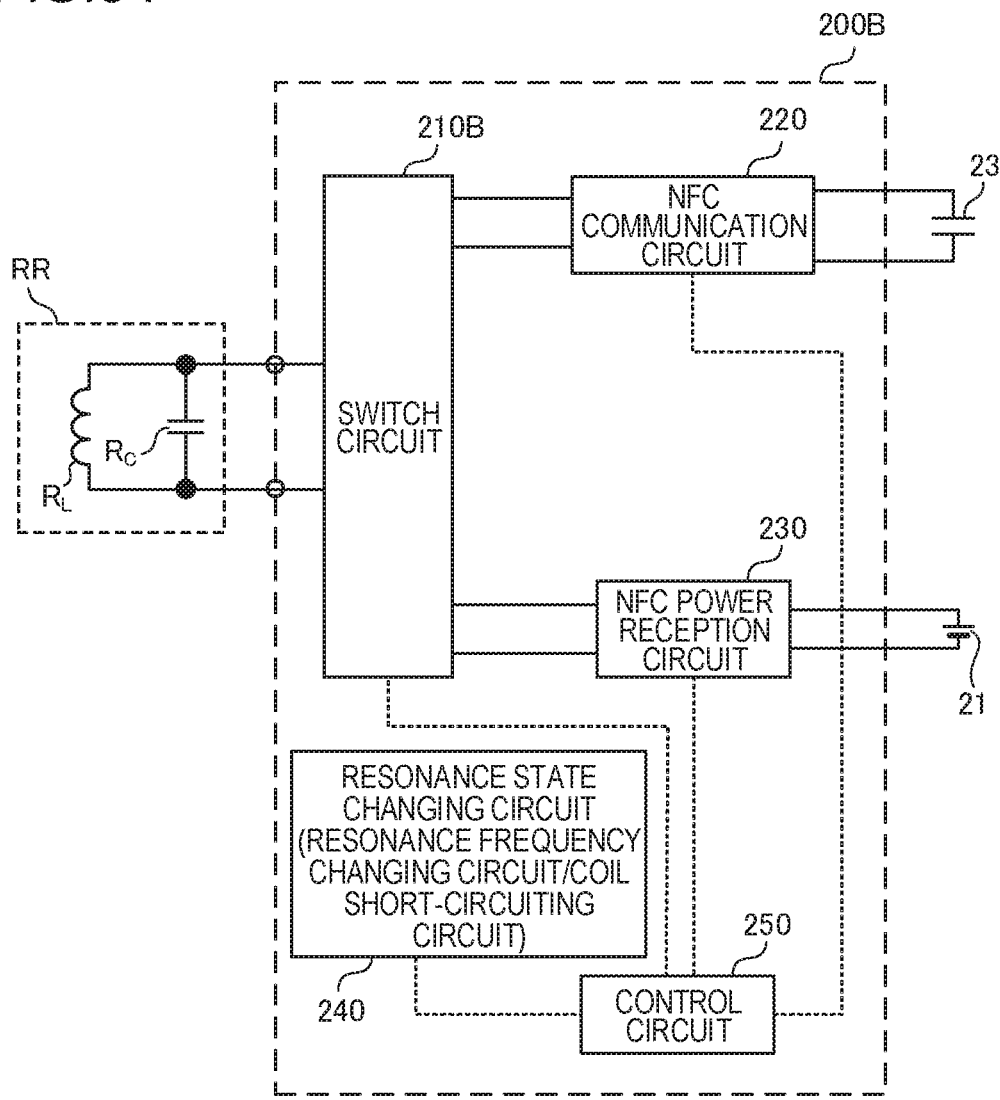
FIG. 34 is a configuration diagram of a part of an electronic device, including an internal block diagram of an IC in the electronic device, according to the third embodiment of the present invention.

FIG. 34 is a configuration diagram of a part of the electronic device 2, including an internal block diagram of the IC 200B. The IC 200B includes blocks identified by the reference signs 210B, 220, 230, 240, and 250. The IC 200B may have connected to it a capacitor 23 which outputs the operating voltage for the IC 200B. The capacitor 23 can output a direct-current voltage obtained by rectifying a signal for NFC communication received from the power feeding device 1.

A switch circuit 110B, under the control of a control circuit 160, connects one or more of the resonance circuits TT[1] to TT[n] to either an NFC communication circuit 120 or an NFC power transmission circuit 130B. The switch circuit 110B can comprise a plurality of switches provided between the resonance circuits TT[1] to TT[n] and the circuits 120 and 130B. Any switch mentioned in the present description can comprise a semiconductor switching device such as a field-effect transistor.

A switch circuit 210B, under the control of a control circuit 250, connects the resonance circuit RR to either an NFC communication circuit 220 or an NFC power reception circuit 230. The switch circuit 210B can comprise a plurality of switches provided between the resonance circuit RR and the circuits 220 and 230.

In the third embodiment, a state where the resonance circuit TT[1] is connected via the switch circuit 110B to the NFC communication circuit 120 and in addition the resonance circuit RR is connected via the switch circuit 210B to the NFC communication circuit 220 is called a communication-connected state. In the communication-connected state, NFC communication is possible. In the communication-connected state, the NFC communication circuit 120 can feed an alternating-current signal (alternating current) at the reference frequency to the resonance circuit TT[1]. The NFC communication between the devices 1 and 2 is carried out by half-duplex operation.

In the communication-connected state, when the power feeding device 1 is on the transmitting side, the alternating-current signal that the NFC communication circuit 120 feeds to the resonance circuit TT[1] can be superimposed with any information signal so that the information signal will be transmitted from the coil $T_L$ in the resonance circuit TT[1] as a power feeding device-side antenna coil and received by the coil $R_L$ in the resonance circuit RR as an electronic device-side antenna coil. The information signal received by the coil $R_L$ is extracted in the NFC communication circuit 220. In the communication-connected state, when the electronic device 2 is on the transmitting side, the NFC communication circuit 220 can transmit any information signal (response signal) from the coil $R_L$ in the resonance circuit RR to the coil $T_L$ in the resonance circuit TT[1]. The transmission here is carried out, as is well known, in conformity with an ISO standard (for example, the ISO 14443 standard), by load modulation which involves varying the impedance of the coil $R_L$ in the resonance circuit RR (electronic device-side antenna coil) as observed from the coil $T_L$ in the resonance circuit TT[1] (power feeding device-side antenna coil). The information signal delivered from the electronic device 2 is extracted in the NFC communication circuit 120.

In the third embodiment, a state where the resonance circuits TT[1] to TT[n] are connected via the switch circuit 110B to the NFC power transmission circuit 130B and in addition the resonance circuit RR is connected via the switch circuit 210B to the NFC power reception circuit 230 is called a power feeding-connected state. How the resonance circuits TT[1] to TT[n] are connected to the NFC power transmission circuit 130B in the power feeding-connected state will be described in detail later.

In the power feeding-connected state, the NFC power transmission circuit 130B can perform power transmission operation, and the NFC power reception circuit 230 can perform power reception operation. The power transmission operation and the power reception operation together achieve power transfer. In the power transmission operation, the power transmission circuit 130B feeds the resonance circuits TT[1] to TT[n] with a power transmission alternating-current voltage (power transmission alternating-current signal) at the reference frequency to make the transmission-side coils $T_L$ in the resonance circuits TT[1] to TT[n] generate a power transmission magnetic field (power transmission alternating magnetic field) at the reference frequency, and thereby transmits electric power by magnetic resonance from the transmission-side coils $T_L$ in the resonance circuits TT[1] to TT[n] to the resonance circuit RR. The power transmission magnetic field in the power transmission operation is a composite magnetic field generated by all of the transmission-side coils $T_L$ in the resonance circuits TT[1] to TT[n]. However, as will be described in detail later, power transmission is achieved chiefly by the resonance circuit TT[1], and the chief generation source of the power transmission magnetic field is the transmission-side coil $T_L$ in the resonance circuit TT[1]. Accordingly, in the power transmission operation, the amplitude of the power transmission alternating-current voltage fed to the resonance circuit TT[1] is set significantly larger than the amplitudes of the power transmission alternating-current voltages fed to the resonance circuits TT[2] to TT[n]. The electric power received in the reception-side coil $R_L$ as a result of the power transmission operation is delivered to the power reception circuit 230 so that, in the power reception operation, the power reception circuit 230 generates and yields desired direct-current electric power from the received electric power. With the output power of the power reception circuit 230, the battery 21 can be charged.

Also when NFC communication is performed in the communication-connected state, a magnetic field is generated in the coil $T_L$ or $R_L$; however, the intensity of the magnetic field generated in NFC communication falls within a predetermined range. The lower limit value and the upper limit value of the range are prescribed in the NFC standard, being 1.5 A/m and 7.5 A/m, respectively. By contrast, the magnetic field intensity of the power transmission magnetic field is higher than the just-mentioned upper limit value, being, for example, about 45 to 60 A/m. In the non-contact power feeding system including the devices 1 and 2, NFC communication and power transfer (NFC power transfer) can be performed alternately, and how the magnetic field intensity behaves in such a case is shown in FIG. 6.

A load sensing circuit 140 senses the magnitude of the load of each transmission-side coil $T_L$, that is, the magnitude of the load to each transmission-side coil $T_L$ as observed when each transmission-side coil $T_L$ is fed with an alternating-current signal (alternating current) from the power transmission circuit 130B. To a transmission-side coil $T_L$ which generates a magnetic field, a coil that magnetically couples with it, such as the reception-side coil $R_L$, can be considered a load, and depending on the magnitude of the load, the amplitude of the current passing in the transmission-side coil $T_L$ (hereinafter also referred to simply as the current amplitude) varies. The load sensing circuit 140 according to the third embodiment can, for each of the resonance circuits TT[1] to TT[n], sense the current amplitude in the transmission-side coil $T_L$ and thereby sense the magnitude of the load to the transmission-side coil $T_L$.

Figure 35:
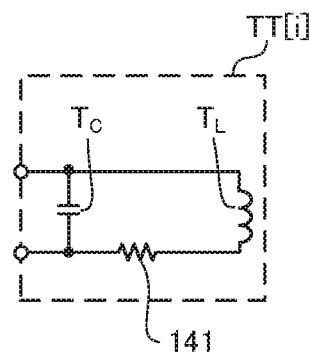
FIG. 35 is a diagram showing a sense resistor inserted in a transmission-side resonance circuit according to the third embodiment of the present invention.
Figure 36A:
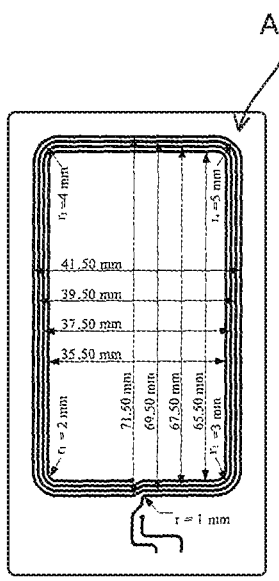
FIG. 36A to FIG. 36F are diagrams showing examples of antenna coils to be incorporated in a non-contact IC card according to the third embodiment of the present invention.
Figure 36B:
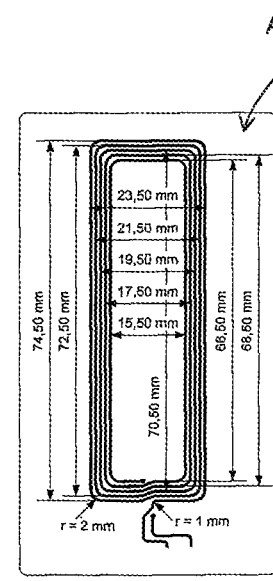
Figure 36C:
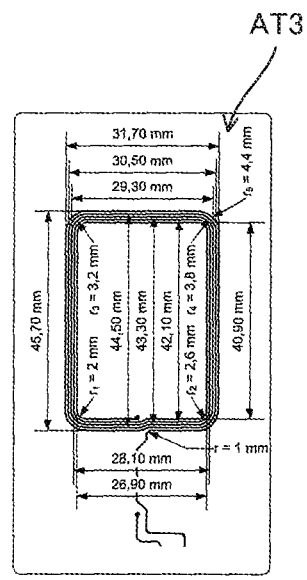
Figure 36D:
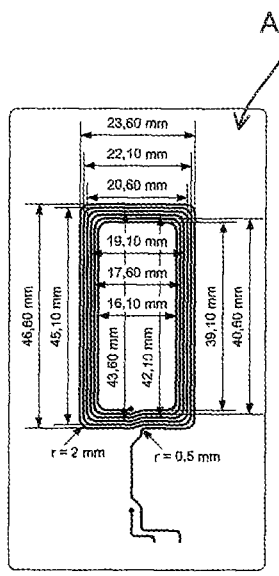
Figure 36E:
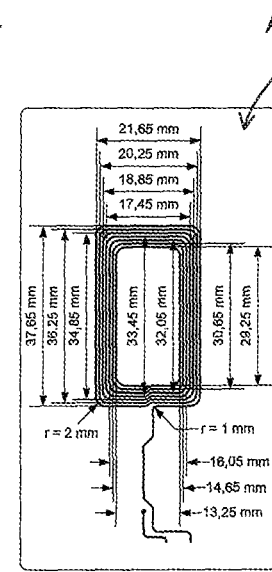
Figure 36F:
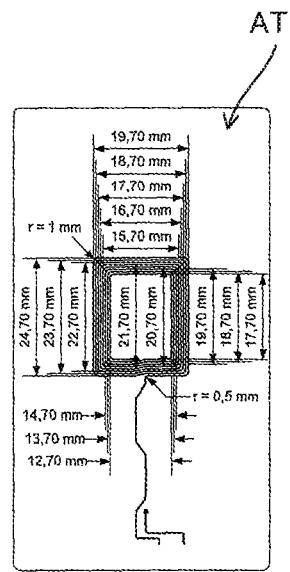

As shown in FIG. 35, for example, in the resonance circuit TT[i] (where i is any integer), a sense resistor 141 can be connected in series with the transmission-side coil $T_L$ such that the same current that passes in the transmission-side coil $T_L$ passes in the sense resistor 141; it is then possible, by sensing a voltage drop across the sense resistor 141 to sense the current amplitude in the transmission-side coil $T_L$. In the third embodiment, the solid-line waveform in FIG. 8 indicates the waveform of the voltage drop across the sense resistor 141 for the resonance circuit TT[i]. With respect to the resonance circuit TT[i], while the intensity of the magnetic field generated in the transmission-side coil $T_L$ is constant, as the electronic device 2 is brought closer to the power feeding stage 12, on one hand, a current based on the magnetic field generated in the transmission-side coil $T_L$ passes in the reception-side coil $R_L$, and on the other hand, a back electromotive force based on the current passing in the reception-side coil $R_L$ appears in the transmission-side coil $T_L$, the back electromotive force acting to reduce the current passing in the transmission-side coil $T_L$. Thus, as shown in FIG. 8, the amplitude of the voltage drop across the sense resistor 141 (corresponding to v in FIG. 8) in the regularly placed state is smaller than that in the detached state. That is, by sensing the voltage drop across the sense resistor 141 which corresponds to the current amplitude in the transmission-side coil $T_L$, it is possible to sense the magnitude of the load to the transmission-side coil $T_L$.

A memory 150 (see FIG. 33) comprises a non-volatile memory, and stores any information on a non-volatile basis. The control circuit 160 controls the operation of the individual blocks in the IC 100B in a comprehensive manner. The control performed by control circuit 160 includes, for example: controlling the switching operation of the switch circuit 110B, controlling what to perform in, and whether or not to perform, the communication operation and power transfer operation by the communication circuit 120 and the power transmission circuit 130B; controlling the operation of the load sensing circuit 140; and controlling writing to and reading from the memory 150. The control circuit 160 incorporates a timer (unillustrated), and can count the length of time between any time points.

In the electronic device 2, a resonance state changing circuit 240 (see FIG. 34) is a resonance frequency changing circuit which can change the resonance frequency of the resonance circuit RR from the reference frequency to another predetermined frequency $f_M$ or a coil short-circuiting circuit which can short-circuit the reception-side coil $R_L$ in the resonance circuit RR.

FIG. 9 shows a resonance frequency changing circuit 240A as an example of a resonance frequency changing circuit as the resonance state changing circuit 240A. The configuration and operation of the circuit 240A are as described in connection with the first embodiment. Here, it is assumed that the frequency $f_M$ is deviated from the reference frequency to such a degree that, when the switch 242 is ON, the resonance circuit RR does not act as a load to the transmission-side coil $T_L$ (that is, to such a degree that no sufficient magnetic resonance occurs between the resonance circuit TT[i] and the resonance circuit RR, where i is any integer). For example, the resonance frequency of the resonance circuit RR with the switch 242 ON (that is, the frequency $f_M$) is set at several hundred kilohertz to one megahertz. However, as mentioned in connection with the first embodiment, so long as the resonance frequency of the resonance circuit RR can be changed to the frequency $f_M$, the resonance frequency changing circuit as the changing circuit 240 is not limited to the resonance frequency changing circuit 240A; the frequency $f_M$ may be higher than the reference frequency.

FIG. 10 shows a coil short-circuiting circuit 240B as an example of a coil short-circuiting circuit as the resonance state changing circuit 240. The configuration and operation of the circuit 240B are as described in connection with the first embodiment. So long as the reception-side coil $R_L$ can be short-circuited, the coil short-circuiting circuit as the changing circuit 240 is not limited to the coil short-circuiting circuit 240B.

As in the first embodiment, the operation of changing the resonance frequency $f_O$ of the reception-side resonance circuit RR from the reference frequency to the predetermined frequency $f_M$ is called resonance frequency changing operation, and the operation of short-circuiting the reception-side coil $R_L$ by use of the coil short-circuiting circuit is called coil short-circuiting operation. For simplicity's sake, resonance frequency changing operation or coil short-circuiting operation is occasionally referred to as $f_O$ changing/short-circuiting operation.

The control circuit 250 (see FIG. 34) controls the operation of the individual blocks in the IC 200B in a comprehensive manner. The control performed by the control circuit 250 includes, for example: controlling the switching operation of the switch circuit 210B; controlling what to perform in, and whether or not to perform, the communication operation and reception operation by the communication circuit 220 and the power reception circuit 230; and controlling the operation of the changing circuit 240. The control circuit 250 incorporates a timer (unillustrated), and can count the length of time between any time points. For example, the timer in the control circuit 250 can count the time for which the resonance frequency $f_O$ is kept changed to the predetermined frequency $f_M$, or the time for which the reception-side coil $R_L$ is kept short-circuited, by $f_O$ changing/short-circuiting operation (that is, it can count the time $T_M$ mentioned later; see step S207B in FIG. 44).

The control circuit 160 in the power feeding device 1 can check the presence or absence of a foreign object on the power feeding stage 12 and control the power transmission circuit 130B to perform the power transmission operation only if no foreign object is present. In the third embodiment, a foreign object can be an object which is different from the electronic device 2 or its component (such as the reception-side coil $R_L$) and in addition in which, when it is brought close to the power feeding device 1, an electric current (an electric current inside the foreign object) can be generated based on the magnetic field generated in the transmission-side coils $T_L$ in resonance circuits TT. In this embodiment, the presence of a foreign object can be understood to denote the presence of a foreign object at a position where a non-negligible electric current based on the magnetic field generated in the transmission-side coils $T_L$ in the resonance circuits TT passes in the foreign object. The electric current that passes in the foreign object based on the magnetic field generated in the transmission-side coil $T_L$ generates an electromotive force (or back electromotive force) in a coil (such as $T_L$ or $R_L$) located opposite and coupled with the foreign object; thus, it can exert a non-negligible effect on the characteristics of the circuit that includes that coil.

The foreign object 3 shown in FIG. 11A and FIG. 11B is a kind of foreign object in the third embodiment.

In a state where a foreign object 3 as mentioned above is placed on the power feeding stage 12, if the power feeding device 1 performs the power transmission operation, the strong magnetic field generated by the transmission-side coil $T_L$ (for example, a magnetic field with a magnetic field intensity of 12 A/m or more) may damage the foreign object 3. For example, the strong magnetic field in the power transmission operation can raise the terminal voltage of the coil $J_L$ in the foreign object 3 on the power feeding stage 12 to as high as 100 V to 200 V, and if the foreign object 3 is not designed to withstand such a high voltage, it is damaged.

When the foreign object 3 is present, the coil $J_L$ in the foreign object 3 magnetically couples with the transmission-side coil $T_L$ and/or the reception-side coil $R_L$, with the result that a variation is observed in the current amplitude in the transmission-side coil $T_L$. This behavior can be utilized to perform foreign object presence/absence judgment based on the current amplitude. However, the shape of the antenna coil (coil $J_L$) differs from one foreign object 3 to another, and depending on the shape, the presence of the foreign object 3 produces different variations in the current amplitude.

This will now be explained with reference to FIG. 36A to FIG. 36F. AT1 to AT6 respectively represent reference antenna coils prescribed in ISO 14443 as antenna coils to be incorporated in non-contact IC cards. A non-contact IC card including any of the antenna coils AT1 to AT6 as the coil $J_L$ in FIG. 11B can be the foreign object 3. The antenna coils AT1 to AT6 have different shapes from each other, and basically, from AT1 to AT6, the antenna coils have increasingly small sizes. In the present description, the shape of a coil is a concept that includes the size of the coil. Accordingly, even if a first and a second coil are geometrically similar, if they are different sizes, the first and second coils have different shapes. For a given coil, the size of the coil can be taken as the area occupied by the circumference of the coil in the direction perpendicular to the center axis of the coil. In a case where a coil forms a loop antenna, the area of that part of the loop plane (the plane on which the winding of the coil is arranged) of the loop antenna which is surrounded by the winding of the coil corresponds to the size of the coil.

Though the transmission-side coil $T_L$ in the resonance circuit TT[1] used in NFC communication and power transfer may be any of the antenna coils AT1 to AT6 or any antenna coil different from the antenna coils AT1 to AT6, it is here assumed that the same antenna coil as the antenna coil AT6 is used as the transmission-side coil $T_L$ in the resonance circuit TT[1]. Accordingly, the same antenna coil as the antenna coil AT6 or an antenna coil similar to the antenna coil AT6 can be used as the reception-side coil $R_L$ in the electronic device 2.

In a case where the same antenna coil as the antenna coil AT6 is used as the transmission-side coil $T_L$ in the resonance circuit TT[1], when the coil $J_L$ in the foreign object 3 is the antenna coil AT6, the degree of magnetic coupling between the transmission-side coil $T_L$ in the resonance circuit TT[1] and the coil $J_L$ in the foreign object 3 is comparatively high; thus, the sensitivity of presence/absence detection of the foreign object 3 using the current amplitude in the transmission-side coil $T_L$ of the resonance circuit TT[1] in sufficiently high (according to whether a foreign object 3 is present or absent, a comparatively large variation occurs in the voltage v in FIG. 8). However, when the coil $J_L$ in the foreign object 3 is the antenna coil AT1, the degree of magnetic coupling between the transmission-side coil $T_L$ in the resonance circuit TT[1] and the transmission-side coil $T_L$ is comparatively low; thus, the sensitivity of presence/absence detection of the foreign object 3 using the current amplitude in the transmission-side coil $T_L$ of the resonance circuit TT[1] is low (according to whether a foreign object 3 is present or absent, a comparatively small variation occur in the voltage v in FIG. 8), resulting in lower accuracy of presence/absence detection of the foreign object 3.

With this taken into consideration, in this embodiment, in addition to the resonance circuit TT[1], resonance circuits TT[2] to TT[n] are provided in the power feeding device 1, and the presence or absence of a foreign object is checked by use of the resonance circuits TT[1] to TT[n]. The n transmission-side coils $T_L$ in the resonance circuits TT[1] to TT[n] have different shapes (including sizes as mentioned above) from each other. For example, in a case where n=6, the transmission-side coils $T_L$ in the resonance circuits TT[2] to TT[6] may have the same shapes as the antenna coils AT1 to AT5 respectively.

In the following description, for concreteness' sake, suppose, chiefly, that "n=2". Here it is assumed that, while the transmission-side coil $T_L$ in the resonance circuit TT[1] has the same shape as the antenna coil AT6, the transmission-side coil $T_L$ in the resonance circuit TT[2] has the same shape as the antenna coil AT3. Accordingly, the size of the transmission-side coil $T_L$ in the resonance circuit TT[1] is smaller than the size of the transmission-side coil $T_L$ in the resonance circuit TT[2].

Figure 37:
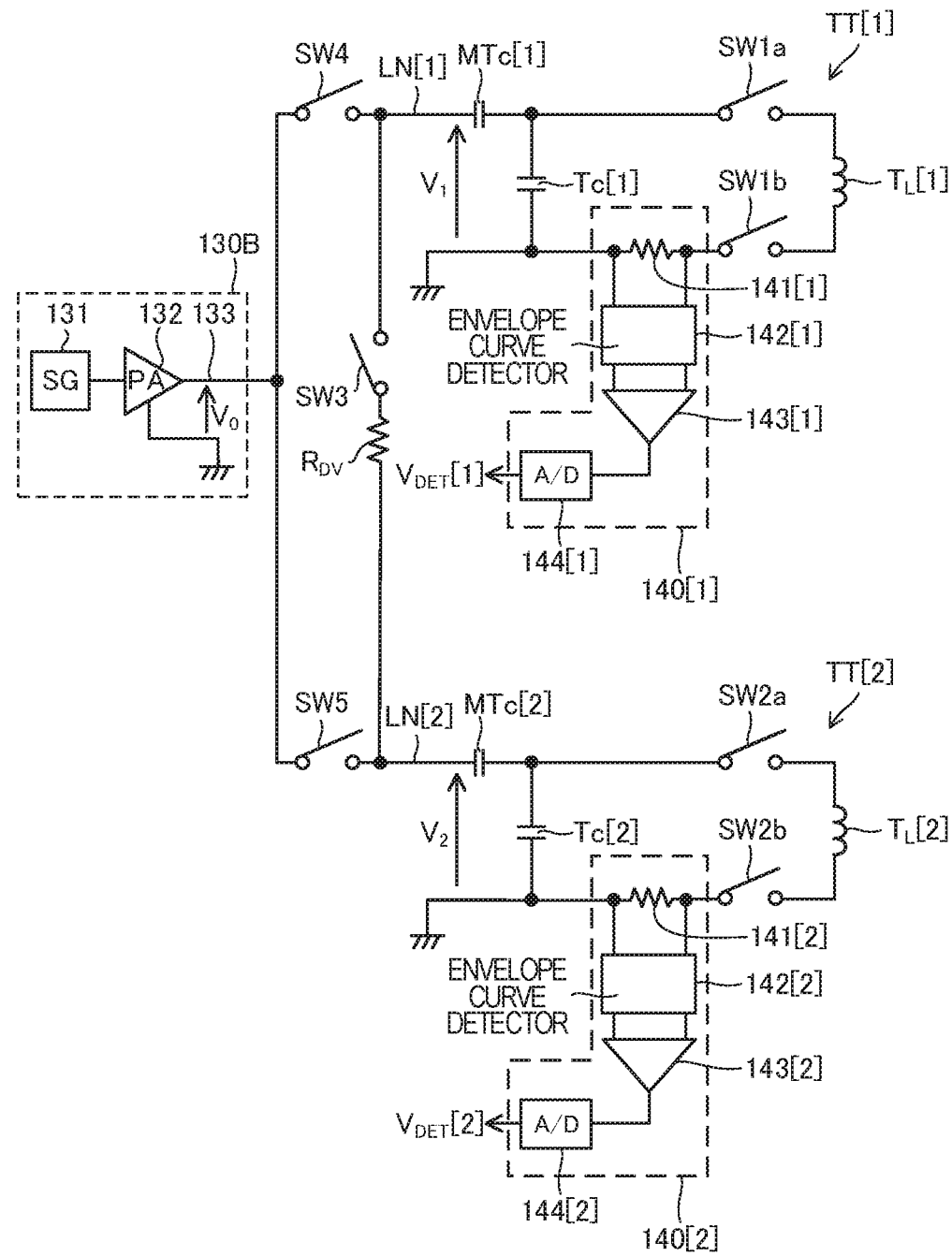
FIG. 37 is a circuit diagram of a power transmission circuit and two resonance circuits in the power feeding device according to the third embodiment of the present invention.

FIG. 37 is a circuit diagram of the power transmission circuit 130B and the resonance circuits TT[1] and TT[2]. The circuits and components shown in FIG. 37 are provided in the power feeding device 1. In FIG. 37, the power feeding-connected state is assumed, and the switch circuit 110B is omitted from illustration. For a given integer i, the coil $T_L$ and the capacitor $T_C$ in the resonance circuit TT[i] are referred to by the reference signs $T_L$[i] and $T_C$[i].

For a given integer i, the resonance circuit TT[i] includes an impedance matching capacitor $MT_C$[i]. The load sensing circuit 140 includes unit sensing circuits which are provided one for each of the resonance circuits TT. The unit sensing circuit provided for the resonance circuit TT[i] is identified by the reference sign 140[i]. For a given integer i, the unit sensing circuit 140[i] includes blocks identified by reference signs 141[i] to 144[i], and outputs a voltage value $V_{DET}$[i]. Moreover, a switch circuit comprising switches SW1a, SW1b, SW2a, SW2b, SW3, SW4, and SW5 is provided in the power feeding device 1, and the individual switches that constitute the switch circuit are controlled by the control circuit 160 to be turned ON and OFF. The whole or a part of the switch circuit may be taken as a constituent element of the switch circuit 110B. Moreover, the power feeding device 1 includes a voltage division resistor $R_{DV}$ in series with the switch SW3.

The power transmission circuit 130B includes: a signal generator 131 which generates a sine-wave signal at the reference frequency; and an amplifier (power amplifier) 132 which amplifies the sine-wave signal generated by the signal generator 131 and which outputs the resulting alternating-current voltage $V_O$ with a sinusoidal waveform to a line 133 relative to a predetermined ground potential. While the signal strength of the sine-wave signal generated by the signal generator 131 is fixed at a constant value, the amplification factor of the amplifier 132 is set variably by the control circuit 160. That is, the magnitude (amplitude) of the alternating-current voltage $V_O$ is variably controlled by the control circuit 160.

In the power feeding-connected state, the line 133 is connected to one end of the switch SW4 and to one end of the switch SW5; the other end of the switch SW4 and the other end of the switch SW5 are connected to lines LN[1] and LN[2] respectively. To the line LN[1], one end of the switch SW3 is connected, and the other end of the switch SW3 is connected via the voltage division resistor $R_{DV}$ to the line LN[2]

In the resonance circuit TT[1], one end of the capacitor $T_C[1]$ is connected via the capacitor $MT_C[1]$ to the line LN[1], and is also connected via the switch SW1a to one end of the coil $T_L[1]$. The other end of the capacitor $T_C[1]$ is connected via a serial circuit of a sense resistor 141[1] and the switch SW1b to the other end of the coil $T_L[1]$. To the connection node between the other end of the capacitor $T_C[1]$ and the sense resistor 141[1], a ground potential is applied.

In the resonance circuit TT[2], one end of the capacitor $T_C[2]$ is connected via the capacitor $MT_C[2]$ to the line LN[2], and is also connected via the switch SW2a to one end of the coil $T_L[2]$. The other end of the capacitor $T_C[2]$ is connected via a serial circuit of a sense resistor 141[2] and the switch SW2b to the other end of the coil $T_L[2]$. To the connection node between the other end of the capacitor $T_C[2]$ and the sense resistor 141[2], a ground potential is applied.

The unit sensing circuits 140[1] and 140[2] have the same circuit configuration, and carry out the same operation. In the circuit 140[i], that is, in the unit sensing circuit 140[1] or 140[2], an envelope curve detector 142[i] detects the envelope curve of the signal of the voltage drop across the sense resistor 141[i], and thereby yields an analog voltage signal that is proportional to the voltage v in FIG. 8; an amplifier 143[i] amplifies and then yields the output signal of the envelope curve detector 142; and an A-D converter 144[i] coverts the output voltage signal of the amplifier 143[i] into a digital signal, and thereby yields a digital voltage value $V_{DET}[i]$. As will be understood from what has been discussed, the voltage value $V_{DET}[i]$ has a value that is proportional to the amplitude of the current passing in the sense resistor 141[i] (hence, the amplitude of the current passing in the transmission-side coil $T_L$) (as the amplitude increases, the voltage value $V_{DET}[i]$ increases). Accordingly, the load sensing circuit 140[i] can be taken as a current amplitude sensing circuit which senses the amplitude of the current passing in the transmission-side coil $T_L[i]$, and its sensed amplitude value can be taken as the voltage value $V_{DET}[i]$.

The envelope curve detector 142[i] may be provided in the stage succeeding the amplifier 143[i]. However, providing the envelope curve detector 142[i] in the stage preceding the amplifier 143[i] as shown in FIG. 37 is more advantageous because it is then possible to adopt, as the amplifier 143[i], one with lower response at high frequencies.

$V_1$ represents the voltage that is present on the line LN[1] and that is the supply voltage to the resonance circuit TT[1]. $V_2$ represents the voltage that is present on the line LN[2] and that is the supply voltage to the resonance circuit TT[2]. The capacitor $MT_C[i]$ is an impedance matching capacitor for making the impedance value of the resonance circuit TT[i] as observed from the power transmission circuit 130B equal to the desired value. Here, the desired value is assumed to be 50Ω. In this embodiment, unless otherwise stated, an impedance is that at the reference frequency.

FIG. 38 shows the ON/OFF states of the switches SW1a, SW1b, SW2a, SW2b, SW3, SW4, and SW5 along with the states of the supply voltages from the power transmission circuit 130B to the resonance circuits TT[1] and TT[2]. The power feeding device 1 can take one of a first to a third voltage supply state. The first to third voltage supply states are respectively different forms of the power feeding-connected state. The switches SW1a, SW1b, SW2a, SW2b, SW3, SW4, and SW5 are controlled such that, in the first voltage supply state, only the switches SW1a, SW1b, and SW4 are ON (thus, the other switches are OFF); in the second voltage supply state, only the switches SW2a, SW2b, and SW5 are ON (thus, the other switches are OFF); and in the third voltage supply state, only the switches SW1a, SW1b, SW2a, SW2b, SW3, and SW4 are ON (thus, the switch SW5 is OFF).

In the first and second voltage supply states, the output alternating-current voltage $V_O$ of the amplifier (power amplifier) 132 is an alternating-current voltage $V_{OL}$ with a predetermined amplitude. Accordingly, in the first voltage supply state, the alternating-current voltage $V_{OL}$ is, as the voltage $V_1$, fed to the resonance circuit TT[1], while the supply voltage $V_2$ to the resonance circuit TT[2] is zero; in the second voltage supply state, the alternating-current voltage $V_{OL}$ is, as the voltage $V_2$, fed to the resonance circuit TT[2], while the supply voltage $V_1$ to the resonance circuit TT[1] is zero.

In the third voltage supply state, the output alternating-current voltage $V_O$ of the amplifier (power amplifier) 132 is an alternating-current voltage $V_{OH}$ with a predetermined amplitude. Here, the alternating-current voltage $V_{OH}$ is an alternating-current voltage higher than the alternating-current voltage $V_{OL}$. That is, the amplitude of the alternating-current voltage $V_{OH}$ is larger than the amplitude of the alternating-current voltage $V_{OL}$. For example, the amplitude of the alternating-current voltage $V_{OH}$ is set at about several times the amplitude of the alternating-current voltage $V_{OL}$. In the third voltage supply state, the alternating-current voltage $V_{OH}$ is, as the voltage $V_1$, fed to the resonance circuit TT[1], while an alternating-current voltage ($k_{DV} \times V_{OH}$) is, as the voltage $V_2$, fed to the resonance circuit TT[2]. In the third voltage supply state, the supply voltage ($k_{DV} \times V_{OH}$) to the resonance circuit TT[2] corresponds to a division voltage of the supply voltage $V_{OH}$ to the resonance circuit TT[1]. The symbol $k_{DV}$ represents the voltage division ratio which is determined based on the ratio of the impedance value of the voltage division resistor $R_{DV}$ and the impedance value of the resonance circuit TT[2] both as observed from the power transmission circuit 130B, and is naturally smaller than one. For example, the resistance value of the voltage division resistor $R_{DV}$ can be set such that $k_{DV}$ is about one out of several to several tens of parts. The amplitude of the voltage ($k_{DV} \times V_{OH}$) may be equal to, or similar to, the amplitude of the voltage $V_{OL}$.

In the non-contact power feeding system according to this embodiment, a foreign object detection process can be performed by which the presence or absence of a foreign object is detected by using $V_{DET}[1]$ and $V_{DET}[2]$ which are the output values of the load sensing circuit 140. The foreign object detection process includes a pFOD process and a mFOD process. The pFOD process is a foreign object detection process that is performed before power transfer, and the mFOD process is a foreign object detection process that is performed during power transfer.

pFOD Process (Foreign Object Detection Process Before Power Transfer)

With reference to FIG. 39, a pFOD process according to the third embodiment will be described. FIG. 39 is a flow chart of the pFOD process according to the third embodiment. In the pFOD process in FIG. 39, first, at step S11B, the control circuit 160 puts the first voltage supply state into effect, and thereby feeds a comparatively low alternating-current voltage $V_{OL}$ only to the resonance circuit TT[1]. Thus, a test magnetic field is generated in the transmission-side coil $T_L[1]$. The test magnetic field is an alternating magnetic field that has as its magnetic field intensity a predetermined test intensity and that oscillates at the reference frequency. The test intensity is significantly lower than the magnetic field intensity (for example, 45 to 60 A/m) of the power transmission magnetic field generated in power transfer (that is, in the power transmission operation), and falls within the range between the lower limit value, 1.5 A/m, and the upper limit value, 7.5 A/m, of communication magnetic field intensity. Thus, there is no or almost no danger of the test magnetic field damaging or otherwise affecting the foreign object 3.

Subsequently to step S11B, at step S12B, the control circuit 160 acquires, as a sensed current amplitude value $V_{pFOD}[1]$, the voltage value $V_{DET}[1]$ as observed when the test magnetic field is being generated in the transmission-side coil $T_L[1]$. The sensed current amplitude value $V_{pFOD}[1]$ has a value commensurate with the current amplitude in the transmission-side coil $T_L[1]$ when the test magnetic field is being generated in the transmission-side coil $T_L[1]$. During the period in which the pFOD process is performed, according to an instruction from the power feeding device 1 via NFC communication, the $f_O$ changing/short-circuiting operation (resonance frequency changing operation or coil short-circuiting operation) is performed in the electronic device 2. Accordingly, the resonance circuit RR (reception-side coil $R_L$) generally does not act as a load to the transmission-side coil $T_L[1]$, and thus causes no or almost no decrease in the sensed current amplitude value $V_{pFOD}[1]$.

Subsequently to step S12B, at step S13B, the control circuit 160 checks whether or not the sensed current amplitude value $V_{pFOD}[1]$ falls within a predetermined first normal pFOD range. If the sensed current amplitude value $V_{pFOD}[1]$ falls within the first normal pFOD range, an advance is made to step S14B (the first normal pFOD range will be described later).

At step S14B, the control circuit 160 puts the second voltage supply state into effect, and thereby feeds a comparatively low alternating-current voltage $V_{OL}$ only to the resonance circuit TT[2]. Thus, a test magnetic field is generated in the transmission-side coil $T_L[2]$.

Subsequently to step S14B, at step S15B, the control circuit 160 acquires, as a sensed current amplitude value $V_{pFOD}[2]$, the voltage value $V_{DET}[2]$ as observed when the test magnetic field is being generated in the transmission-side coil $T_L[2]$. The sensed current amplitude value $V_{pFOD}[2]$ has a value commensurate with the current amplitude in the transmission-side coil $T_L[2]$ when the test magnetic field is being generated in the transmission-side coil $T_L[2]$. As mentioned above, during the period in which the pFOD process is performed, according to an instruction from the power feeding device 1 via NFC communication, the $f_O$ changing/short-circuiting operation (resonance frequency changing operation or coil short-circuiting operation) is performed in the electronic device 2. Accordingly, the resonance circuit RR (reception-side coil $R_L$) generally does not act as a load to the transmission-side coil $T_L[2]$, and thus causes no or almost no decrease in the sensed current amplitude value $V_{pFOD}[2]$.

Subsequently to step S15B, at step S16B, the control circuit 160 checks whether or not the sensed current amplitude value $V_{pFOD}[2]$ falls within a second normal pFOD range. If the sensed current amplitude value $V_{pFOD}[2]$ falls within the second normal pFOD range, an advance is made to step S17B.

At step S17B, to which an advance is made only if the sensed current amplitude value $V_{pFOD}[1]$ falls within the first normal pFOD range and in addition the sensed current amplitude value $V_{pFOD}[2]$ falls within the second normal pFOD range, the control circuit 160 judges that no foreign object is present on the power feeding stage 12. This judgment is referred to as a foreign-object-absent judgment. On the other hand, if the sensed current amplitude value $V_{pFOD}[1]$ falls outside the first normal pFOD range or the sensed current amplitude value $V_{pFOD}[2]$ falls outside the second normal pFOD range, an advance is made to step S18B. At step S18B, the control circuit 160 judges that a foreign object is present on the power feeding stage 12. This judgment is referred to as a foreign-object-present judgment. On making a foreign-object-absent judgement, the control circuit 160 recognizes that the power transmission operation by the power transmission circuit 130B is permissible, and permits the power transmission circuit 130B to perform the power transmission operation; on making a foreign-object-present judgment, the control circuit 160 recognizes that the power transmission operation by the power transmission circuit 130B is not permissible, and inhibits (restricts) the power transmission circuit 130B from performing the power transmission operation.

The first normal pFOD range is a range of values equal to or larger than a predetermined lower limit value $V_{pREFL}[1]$ but equal to or smaller than a predetermined upper limit value $V_{pREFH}[1]$ ($0 < V_{pREFL}[1] < V_{pREFH}[1]$). The second normal pFOD range is a range of values equal to or larger than a predetermined lower limit value $V_{pREFL}[2]$ but equal to or smaller than a predetermined upper limit value $V_{pREFH}[2]$ ($0 < V_{pREFL}[2] < V_{pREFH}[2]$). Accordingly, only when the check inequalities "$V_{pREFL}[1] \leq V_{pFOD}[1] \leq V_{pREFH}[1]$" and "$V_{pREFL}[2] \leq V_{pFOD}[2] \leq V_{pREFH}[2]$" are both satisfied, a foreign-object-absent judgment is made, and otherwise a foreign-object-present judgment is made. The first and second normal pFOD ranges may be identical, or may have different lower and/or upper limit values.

When the pFOD process is performed, if a foreign object 3 is present on the power feeding stage 12, the resonance circuit JJ (coil $J_L$) in the foreign object 3 acts as a load to the transmission-side coil $T_L[i]$, with the result that a decrease is observed in the sensed current amplitude value $V_{pFOD}[i]$ as compared with when no foreign object 3 is present on the power feeding stage 12. In this embodiment, the presence or absence of the foreign object 3 is judged by use of sensed current amplitude values in a plurality of transmission-side coils with varying sizes, and this allows detection of the foreign object 3 with improved accuracy.

A foreign object can be a foreign object 3a (unillustrated) different from the foreign object 3. The foreign object 3a is, for example, a metal body containing aluminum (a foil or sheet of aluminum) or a metal body containing copper. When the pFOD process is performed, if a foreign object 3a is present on the power feeding stage 12, due to electric and magnetic effects, an increase is observed in the sensed current amplitude value $V_{pFOD}[i]$ as compared with when no foreign object 3a is present on the power feeding stage 12.

The lower limit value $V_{pREFL}[i]$ and the upper limit value $V_{pREFH}[i]$ are set beforehand through experiments or the like and stored in the memory 150 such that, before power transfer is performed: if a foreign object 3 is present on the power feeding stage 12, the sensed current amplitude value $V_{pFOD}[i]$ is lower than the lower limit value $V_{pREFL}[i]$; if a foreign object 3a is present on the power feeding stage 12, the sensed current amplitude value $V_{pFOD}[i]$ is higher than the upper limit value $V_{pREFH}[i]$; and if no foreign object (3 or 3a) is present on the power feeding stage 12, the sensed current amplitude value $V_{pFOD}[i]$ falls within the ith normal pFOD range.

When a power transmission magnetic field is generated with a foreign object 3a present on the power feeding stage 12, the foreign object 3a may absorb electric power and heat up. In this embodiment, where the reference frequency as the carrier frequency for power transfer is assumed to be 13.56 MHz, it can be said that no such heating-up is likely. Accordingly, it is also possible, with no consideration given to the presence of the foreign object 3a, to omit the upper limit values of the first and second normal pFOD ranges (in that case, $V_{pREFH}[1]$ and $V_{pREFH}[2]$ can be taken as infinitely great). However, in the invention according to this embodiment, the reference frequency is not limited to 13.56 MHz; when the reference frequency is set at, for example, about several hundred kilohertz, the foreign object 3a is likely to heat up, and therefore it is preferable to adopt the previously described method in which the ith normal pFOD range is defined by not only the lower limit value $V_{pREFL}[i]$ but also the upper limit value $V_{pREFH}[i]$.

In the first voltage supply state, when the sensed value $V_{pFOD}[1]$ as to the resonance circuit TT[1] is acquired, the switches SW2a and SW2b are OFF, and the resonance circuit TT[2] is practically not formed. This prevents the transmission-side coil $T_L[2]$ from behaving like the coil $T_J$ in the foreign object 3. The same applies similarly to the second voltage supply state.

Figure 40:
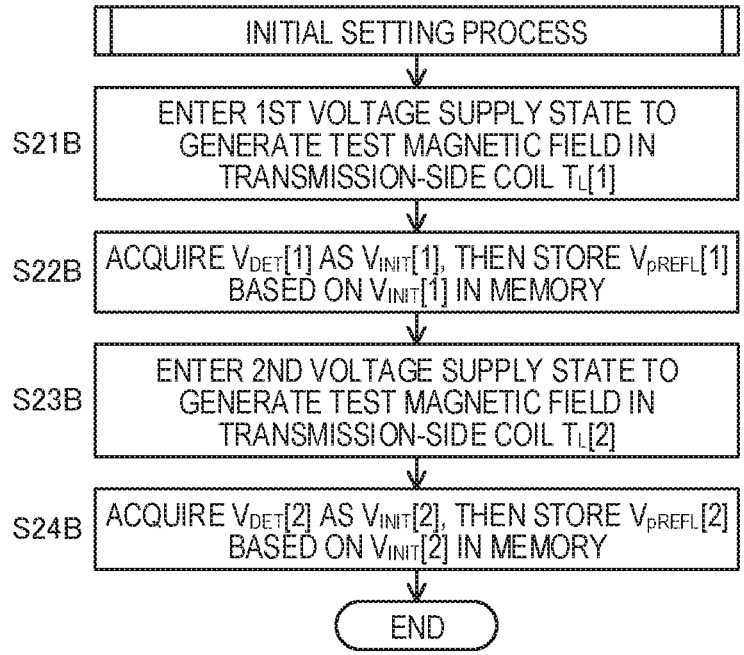
FIG. 40 is an operation flow chart of an initial setting process performed in the power feeding device in the third embodiment of the present invention.

An additional description will now be given of how the lower limit value $V_{pREFL}[i]$ is determined. The lower limit value $V_{pREFL}[i]$ is determined in an initial setting process. FIG. 40 is an operation flow chart of the initial setting process according to the third embodiment. The initial setting process according to the third embodiment is performed by the IC 100B in an initial setting environment as described below. In the initial setting environment, the load to each transmission-side coil $T_L[i]$ is null or negligibly small, and no object in which an electric current can be generated by the magnetic field generated in any transmission-side coil $T_L[i]$ (including a coil that magnetically couples with the transmission-side coil $T_L[i]$) is present except the components of the power feeding device 1. The detached state in FIG. 1A can be taken as satisfying the initial setting environment. To secure an initial setting environment, the initial setting process can be performed, for example, at the time of manufacture, shipment, or the like of the power feeding device 1. So long as an initial setting environment can be secured, the initial setting process can be performed at any time.

In the initial setting process, first, at step S21B, the control circuit 160 puts the first voltage supply state into effect, and thereby feeds a comparatively low alternating-current voltage $V_{OL}$ only to the resonance circuit TT[1]. Thus, a test magnetic field is generated in the transmission-side coil $T_L[1]$. Subsequently to step S21B, at step S22B, the control circuit 160 acquires, as a voltage value $V_{INIT}[1]$, the voltage value $V_{DET}[1]$ as observed when the test magnetic field is being generated in the transmission-side coil $T_L[1]$, and stores a lower limit value $V_{pREFL}[1]$ based on the voltage value $V_{INIT}[1]$ in the memory 150. Subsequently, at step S23B, the control circuit 160 puts the second voltage supply state into effect, and thereby feeds a comparatively low alternating-current voltage $V_{OL}$ only to the resonance circuit TT[2]. Thus, a test magnetic field is generated in the transmission-side coil $T_L[2]$. Subsequently to step S23B, at step S24B, the control circuit 160 acquires, as a voltage value $V_{INIT}[2]$, the voltage value $V_{DET}[2]$ as observed when the test magnetic field is being generated in the transmission-side coil $T_L[2]$, and stores a lower limit value $V_{pREFL}[2]$ based on the voltage value $V_{INIT}[2]$ in the memory 150.

The lower limit value $V_{pREFL}[i]$ is set at a value lower than the voltage value $V_{INIT}[1]$ so that the pFOD process yields a foreign-object-present judgment only when a foreign object 3 is present. The setting can be made, for example, such that "$V_{pREFL}[i]=V_{INIT}[i]-\Delta V$" or "$V_{pREFL}[i]=V_{INIT}[i] \times k$". Here, $\Delta V$ is a predetermined positive minute value (it may also be that $\Delta V=0$); k is a coefficient with a predetermined positive value smaller than one. The voltage value $V_{INIT}[i]$ that is expected to be obtained when the test magnetic field is generated in the transmission-side coil $T_L[i]$ in the initial setting environment can be estimated at the stage of designing. Based on the value derived from the estimation, it is possible, without performing the initial setting process, to determine the lower limit value $V_{pREFL}[i]$ and store it in the memory 150.

With reference to FIG. 17A to FIG. 17D, a first to a fourth case will be considered. In the first case, only the electronic device 2 is present on the power feeding stage 12. In the second case, the electronic device 2 and a foreign object 3 are present on the power feeding stage 12. In the third case, only a foreign object 3 is present on the power feeding stage 12. In the fourth case, neither the electronic device 2 nor a foreign object 3 is present on the power feeding stage 12.

As mentioned earlier, during the period in which the pFOD process is performed, the $f_O$ changing/short-circuiting operation is performed in the electronic device 2. Thus, in the first case, the load to the transmission-side coil $T_L$ is sufficiently light (a state as if no electronic device 2 were present on the power feeding stage 12), and the sensed values $V_{pFOD}[1]$ and $V_{pFOD}[2]$ fall within their respective normal pFOD ranges, with the result that a foreign-object-absent judgment is made. On the other hand, in the second case, though the resonance frequency of the resonance circuit RR is changed to the above-mentioned frequency $f_M$, or the reception-side coil $R_L$ is short-circuited, the foreign object 3 remains a load to the transmission-side coil $T_L[i]$ (the resonance frequency of the resonance circuit JJ in the foreign object 3 remains at the reference frequency), and thus one or both of the sensed values $V_{pFOD}[1]$ and $V_{pFOD}[2]$ are sufficiently small, with the result that a foreign-object-present judgment is made.

In the third and fourth cases, no electronic device 2 that responds to NFC communication is present on the power feeding stage 12, and thus in the first place, no power transmission operation is necessary; accordingly, the pFOD process itself is not performed. The power feeding device 1 can, by NFC communication, check whether or not an electronic device 2 compatible with power transfer is present on the power feeding stage 12. A state where a foreign object 3 is present on the power feeding stage 12 is not limited to a state where the foreign object 3 is in direct contact with the power feeding stage 12. For example, as shown in FIG. 18, a state where the electronic device 2 is present on the power feeding stage 12 in direct contact with it and a foreign object 3 is present on the electronic device 2 also counts, so long as a foreign-object-present judgment is made, as a state where a foreign object 3 is present on the power feeding stage 12.

mFOD Process (Foreign Object Detection Process During Power Transfer)

Next, an mFOD process according to the third embodiment will be described. The mFOD process is performed repeatedly during power transfer unless, during the process, a foreign-object-present judgment is made. In the third embodiment, the third voltage supply state is maintained during power transfer, and thus the mFOD process is performed in the third voltage supply state. In the third voltage supply state, the resonance circuit TT[1] is fed with the alternating-current voltage $V_{OH}$, and the resonance circuit TT[2] is fed with the alternating-current voltage $(k_{DV} \times V_{OH})$; thus, a power transmission magnetic field is generated in the transmission-side coils $T_L[1]$ and $T_L[2]$. While this power transmission magnetic field is a composite magnetic field generated by both of the transmission-side coils $T_L[1]$ and $T_L[2]$, the chief generator of the power transmission magnetic field is the transmission-side coil $T_L[1]$ in the resonance circuit TT[1] which is fed with a relatively high voltage. That is, between the transmission-side coils $T_L[1]$ and $T_L[2]$, a large part of transmission electric power is output from the transmission-side coil $T_L[1]$, and the transmission electric power from the transmission-side coil $T_L[2]$ is significantly lower than that from the transmission-side coil $T_L[1]$.

The shape of the reception-side coil $R_L$ in the electronic device 2 is the same as that of the transmission-side coil $T_L[1]$, or is more similar to that of the transmission-side coil $T_L[1]$ than to that of the transmission-side coil $T_L[2]$. Since the shape of a coil is a concept including its size, in other words, the size of the reception-side coil $R_L$ is equal to the size of the transmission-side coil $T_L[1]$, or is closer to the size of the transmission-side coil $T_L[1]$ than to the size of the transmission-side coil $T_L[2]$. As a result, magnetic coupling is stronger between the coil $T_L[1]$ and the coil $R_L$ than between the coil $T_L[2]$ and the coil $R_L$; thus, transmitting electric power by using chiefly the coil $T_L[1]$ results in higher power transfer efficiency. Moreover, feeding a high voltage to the coil $T_L[2]$ which exhibits a comparatively lower degree of magnetic coupling with the coil $R_L$ may lead to excessive unnecessary radiation from the coil $T_L[2]$; by contrast, feeding a comparatively low voltage to the resonance circuit TT[2] helps suppress an increase in such unnecessary radiation.

Figure 41:
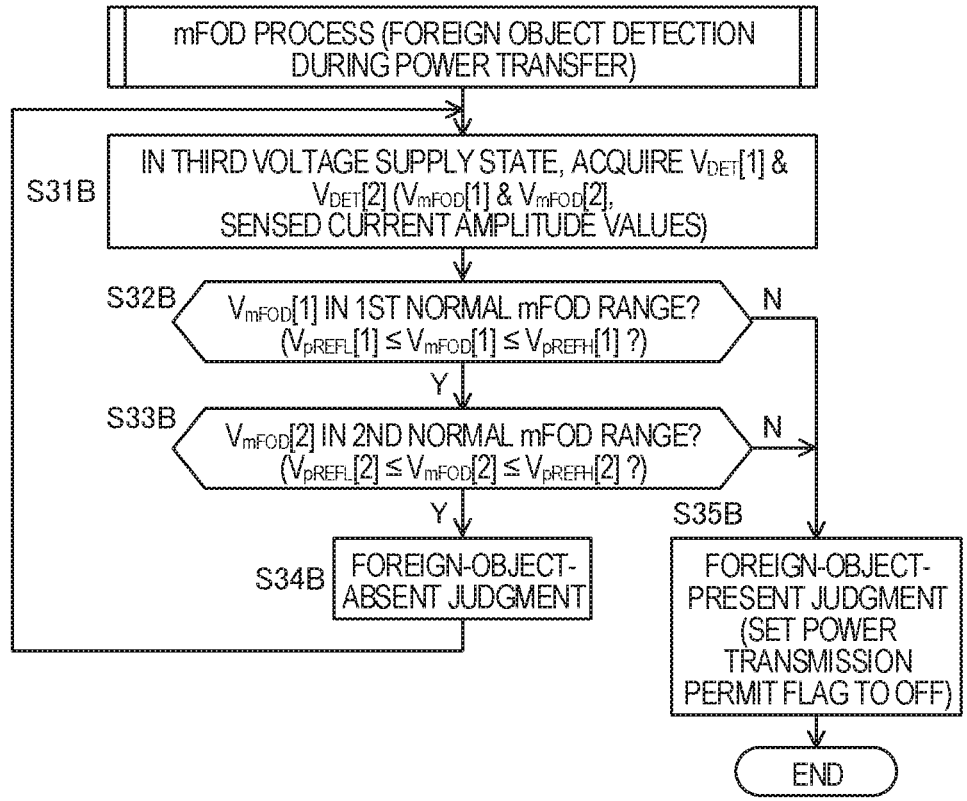
FIG. 41 is an operation flow chart of an mFOD process performed in the power feeding device in the third embodiment of the present invention.

FIG. 41 is a flow chart of the mFOD process according to the third embodiment. In the mFOD process according to the third embodiment, first, at step S31B, the control circuit 160 acquires the most recent voltage values $V_{DET}[1]$ and $V_{DET}[2]$ as sensed current amplitude values $V_{mFOD}[1]$ and $V_{mFOD}[2]$ respectively. The sensed current amplitude value $V_{mFOD}[i]$ has a value commensurate with the current amplitude in the transmission-side coil $T_L[i]$ as observed when power transfer is being performed in the third voltage supply state. Subsequently to step S31B, at steps S32B and 33B, the control circuit 160 checks whether or not the sensed current amplitude value $V_{mFOD}[1]$ falls within a first normal mFOD range, and checks whether or not the sensed current amplitude value $V_{mFOD}[2]$ falls within a second normal mFOD range. Only if the sensed value $V_{mFOD}[1]$ falls within the first normal mFOD range and the sensed value $V_{mFOD}[2]$ falls within the second normal mFOD range, a foreign-object-absent judgment is made (step S34B), and a return is made to step S31B, so that the process is repeated starting at step S31B. On the other hand, if at least one of the sensed values $V_{mFOD}[1]$ and $V_{mFOD}[2]$ falls outside the corresponding normal mFOD range, a foreign-object-present judgment is made at step S35B, and the power transmission permit flag is set to OFF. The power transmission permit flag is a flag that is controlled by the control circuit 160, and is set to ON or OFF. When the power transmission permit flag is set to ON, the control circuit 160 permits the execution of the power transmission operation; when the power transmission permit flag is set to OFF, the control circuit 160 inhibits the execution of the power transmission operation (or, if the power transmission operation is underway, it is stopped).

The first normal mFOD range is a range of values equal to or larger than a predetermined lower limit value $V_{mREFL}[1]$ but equal to or smaller than a predetermined upper limit value $V_{mREFH}[1]$ $(0<V_{mREFL}[1]<V_{mREFH}[1])$. The second normal mFOD range is a range of values equal to or larger than a predetermined lower limit value $V_{mREFL}[2]$ but equal to or smaller than a predetermined upper limit value $V_{mREFH}[2]$ $(0<V_{mREFL}[2]<V_{mREFH}[2])$. Accordingly, only when the check inequalities "$V_{mREFL}[1] \leq V_{mFOD}[1] \leq V_{mREFH}[1]$" and "$V_{mREFL}[2] \leq V_{mFOD}[2] \leq V_{mREFH}[2]$" are both satisfied, a foreign-object-absent judgment is made, and otherwise a foreign-object-present judgment is made.

With reference to FIG. 24A, consider, for example, a case where, while the power transmission operation is being performed, a foreign object 3 configured as a non-contact IC card is inserted between the power feeding stage 12 of power feeding device 1 and the electronic device 2. In this case, the reception-side coil $R_L$ in the electronic device 2 and the coil $J_L$ in the foreign object 3 magnetically couple, and, along with the resonance frequency of the resonance circuit JJ in the foreign object 3, the resonance frequency of the resonance circuit RR in the electronic device 2 deviates from the reference frequency (13.56 MHz). Then, the reception electric power at the reception-side coil $R_L$ lowers, and the power transmission load as observed from the transmission-side coil $T_L[i]$ becomes lighter, with the result that the current amplitude in the transmission-side coil $T_L[i]$ becomes larger (the upper limit value $V_{mREFH}[i]$ can be determined such that "$V_{mREFH}[i]<V_{mFOD}[i]$" in this case).

Considered above has been the effect on the current amplitude in the transmission-side coil $T_L[i]$ from the perspective of the magnetically coupled relationship between the reception-side coil $R_L$ and the coil $J_L$ in the foreign object 3. In the example in FIG. 24A, also the transmission-side coil $T_L[i]$ itself magnetically couples with the reception-side coil $R_L$ and the coil $J_L$, and the magnetic coupling between the coil $T_L[1]$ and the coil $J_L$ depends on the relationship between the shape of the coil $T_L[i]$ and the shape of the coil $J_L$. Thus, in the case in FIG. 24A, for example, according to whether the coil $J_L$ in the foreign object 3 is the antenna coil AT6 or the antenna coil AT3, the amount of variation in the current amplitude in the transmission-side coil $T_L[1]$ differs. As a result, for example, suppose that the mFOD process is performed without acquiring the sensed value $V_{mFOD}[2]$ but depending only on the sensed value $V_{mFOD}[1]$, then if the coil $J_L$ in the foreign object 3 is the antenna coil AT6, a deviation of the sensed value $V_{mFOD}[1]$ from the first normal mFOD range is observed, but if the coil $J_L$ in the foreign object 3 is the antenna coil AT3, it can happen that no such deviation is observed. Reversely, for example, suppose that the mFOD process is performed without acquiring the sensed value $V_{mFOD}[1]$ but depending only on the sensed value $V_{mFOD}[2]$, then if the coil $J_L$ in the foreign object 3 is the antenna coil AT3, a deviation of the sensed value $V_{mFOD}[2]$ from the second normal mFOD range is observed, but if the coil $J_L$ in the foreign object 3 is the antenna coil AT6, it can happen that no such deviation is observed. In the mFOD process according to this embodiment, foreign object presence/absence detection is performed by use of the current amplitudes in the transmission-side coils $T_L[1]$ and $T_L[2]$ with different sizes, improved foreign object detection accuracy is expected. That is, detection of a foreign object that is difficult to detected by use of the sensed value $V_{mFOD}[1]$ in the coil $T_L[1]$ can be complemented by use of the sensed value $V_{mFOD}[2]$ in the coil $T_L[2]$.

For another example, with reference to FIG. 24B, consider a case where, while the power transmission operation is being performed, a foreign object 3b configured as a sheet of iron or ferrite is inserted between the power feeding stage 12 of the power feeding device 1 and the electronic device 2. Then, due to electric and magnetic effects, an electric current passes in the foreign object 3b, with the result that the current amplitude in the transmission-side coil $T_L[i]$ becomes smaller (the lower limit value $V_{mREFL}[i]$ can be determined such that "$V_{mFOD}[i]<V_{mREFL}[i]$" in this case).

Thus, the presence or absence of a foreign object like the foreign object 3 and the foreign object 3b causes a variation in the sensed current amplitude value $V_{mFOD}[i]$. A lower limit value $V_{mREFL}[i]$ and an upper limit value $V_{mREFH}[i]$ that have been determined appropriately beforehand through experiments or the like with consideration given to every imaginable type of foreign object and every imaginable state of arrangement can be stored in the memory 150. Instead, how far the sensed current amplitude value $V_{mFOD}[i]$ varies due to the presence of a foreign object during power transfer may be estimated by theoretic calculation so that, based on the results of the estimation, with no need for experiments, a lower limit value $V_{mREFL}[i]$ and an upper limit value $V_{mREFH}[i]$ can be determined and stored in the memory 150. In that case, for example, an object that causes the sensed current amplitude value $V_{mFOD}[i]$ to vary by a predetermined factor of variation or more about the center value of the ith normal mFOD range can be defined as a foreign object.

The lower limit value $V_{mREFH}[i]$ and the upper limit value $V_{mREFH}[i]$ can be determined also in the following manner. When power transfer is underway, the control circuit 160 acquires one sensed current amplitude value $V_{mFOD}[i]$ after another periodically in the third voltage supply state; then, of the sensed current amplitude values $V_{mFOD}[i]$ acquired periodically, one moving average after another can be calculated. Here, it is assumed that the moving average of 16 consecutive sensed values $V_{mFOD}[i]$ is calculated.

After the start of power transfer, the control circuit 160 takes the moving average of the most recently obtained 16 sensed values $V_{mFOD}[i]$ as a reference value $V_{mREF}[i]$. Then, based on the reference value $V_{mREF}[i]$, the control circuit 160 sets a lower limit value $V_{mREFH}[i]$ and a upper limit value $V_{mREFH}[i]$. Specifically, $(V_{mREF}[i]-\Delta V_{mREF})$ and $(V_{mREF}[i]+\Delta V_{mREF})$ are taken as the lower limit value $V_{mREFH}[i]$ and the upper limit value $V_{mREFH}[i]$ respectively. Or $(V_{mREF}[i]-k_{mREF}\cdot V_{mREF}[i])$ and $(V_{mREF}[i]k_{mREF}\cdot V_{mREF}[i])$ are taken as the lower limit value $V_{mREFH}[i]$ and the upper limit value $V_{mREFH}[i]$ respectively. $\Delta V_{mREF}$ is a predetermined positive value, and $k_{mREF}$ is a predetermined positive coefficient smaller than one. After the reference value $V_{mREF}[i]$ is set for the first time, every time a sensed value $V_{mFOD}[i]$ is newly acquired, the reference value $V_{mREF}[i]$ is updated with the moving average of 16 sensed values $V_{mFOD}[i]$ including that new sensed value $V_{mFOD}[i]$. While, after the start of power transfer, the number of sensed values $V_{mFOD}[i]$ acquired is less than 16, the average of all the sensed values $V_{mFOD}[i]$ acquired after the start of power transfer can be taken as the reference value $V_{mREF}[i]$. For the sensed value $V_{mFOD}[i]$ acquired first after the start of power transfer, the operation at steps S32B through S35B in FIG. 41 is not performed (because the reference value $V_{mREF}[i]$ has not been set yet).

With this method, $V_{mREFH}[i]$ and $V_{mREFH}[i]$ are set by use of one or more sensed current amplitude values $V_{mFOD}[i]$ acquired in the past. The purpose of the mFOD process is to check the presence or absence of a foreign object that can be inserted after the start of power transfer, in the middle of power transfer, and this check can be achieved by monitoring the change from the reference value $V_{mREF}[i]$ based on past sensed values $V_{mFOD}[i]$. Moreover, using the moving average helps suppress malfunction due to an abrupt change such as noise. After the moving average of the 16 sensed values $V_{mFOD}[i]$ acquired immediately after the start of power transfer is taken as the reference value $V_{mREF}[i]$, the reference value $V_{mREF}[i]$ may be kept constant throughout that session of power transfer (that is, the reference value $V_{mREF}[i]$ may be left unupdated).

Of the amplifiers 143[1] and 143[2] (see FIG. 37), at least the amplifier 143[1] has a variable amplification factor. The current amplitude in the transmission-side coil $T_L[1]$ is significantly larger when the sensed value $V_{mFOD}[1]$ is acquired in the mFOD process, where the supply voltage $V_1$ is relatively high, than when the sensed value $V_{pFOD}[1]$ is acquired in the pFOD process, where the supply voltage $V_1$ is relatively low. Accordingly, when performing the mFOD process, the control circuit 160 can set the amplification factor of the amplifier 143[1] smaller than when performing the pFOD process and thereby make the range of the input signal to the A-D converter 144[1] about equal between in the pFOD process and in the mFOD process. Also in a case where the current amplitude in the transmission-side coil $T_L[2]$ is larger when the sensed value $V_{mFOD}[2]$ is acquired in the mFOD process than when the sensed value $V_{pFOD}[2]$ is acquired in the pFOD process (that is, in a case where "$(k_{DV}\times V_{0H})>V_{0L}$"), the control circuit 160 can set the amplification factor of the amplifier 143[2] lower when performing the mFOD process than when performing the pFOD process and thereby make the range of the input signal to the A-D converter 144[2] about equal between in the pFOD process and in the mFOD process.

For another example, in the load sensing circuit 140[i], between the envelope curve detector 142[i] and the A-D converter 144[i] (more specifically, between the envelope curve detector 142[i] and the amplifier 143[i], or between the amplifier 143[i] and the A-D converter 144[i]), a high-range reduction circuit (unillustrated) may be inserted. In that case, amplitude information obtained by subjecting the voltage drop signal across the sense resistor 141[i] to high-range reduction (in other words, averaging or low-pass filtering) can be obtained as the voltage value $V_{DET}[i]$ from the A-D converter 144[i]. The high-range reduction here is processing whereby, of the voltage drop signal across the sense resistor 141[i], comparatively low-frequency signal components are passed while comparatively high-frequency signal components are reduced (attenuated). Through the high-range reduction, inhibition of power transmission is prevented from occurring due to noise, slight vibration of the electronic device 2 on the power feeding stage 12, or the like.

For another example, instead of a high-range reduction circuit being provided between the envelope curve detector 142[i] and the A-D converter 144[i], high-range reduction by calculation may be applied to the voltage value $V_{DET}$[i] based on the output signal of the A-D converter 144[i] so that the voltage value $V_{DET}$[i] after the high-range reduction is used as the sensed current amplitude value $V_{mFOD}$[i] (similar handling is possible also for the sensed current amplitude value $V_{pFOD}$[i] in the pFOD process). High-range reduction by calculation is processing performed in the control circuit 160 whereby, of the output signal of the A-D converter 144[i], comparatively low-frequency signal components are passed while comparatively high-frequency signal components are reduced (attenuated).

The function of the mFOD process is not limited to foreign object presence/absence judgment. The mFOD process serves to turn the power transmission permit flag to OFF in any situation unsuitable to continue the power transmission operation such as when the sensed current amplitude value $V_{mFOD}$[i] falls outside the ith normal mFOD range. For example, after the start of the power transmission operation, when the electronic device 2 is removed off the power feeding stage 12, the load of power transmission as observed from the transmission-side coil $T_L$[i] becomes lighter and the sensed current amplitude value $V_{mFOD}$[i] exceeds the upper limit value $V_{mREFH}$[i]; thus, the power transmission permit flag is turned to OFF (step S35B in FIG. 41).

[Signal Exchange Before Power Transfer]

Though the exchange of signals between the devices 1 and 2 before power transfer is performed is similar to that shown in FIG. 19, the exchange of signals in the third embodiment will be described below. In connection with the third embodiment, unless otherwise stated, the following description assumes that the electronic device 2 is present on the power feeding stage 12 in the regularly placed state (FIG. 1B).

Referring to FIG. 19, first, with the power feeding device 1 on the transmitting side and the electronic device 2 on the receiving side, the power feeding device 1 (IC 100B) transmits an inquiry signal 510 to a device on the power feeding stage 2 (hereinafter referred to also as the power feeding target device) by NFC communication. The power feeding target device includes the electronic device 2, and can include a foreign object 3. The inquiry signal 510 includes a signal inquiring individual identification information of the power feeding target device, a signal inquiring whether or not the power feeding target device is in a state enabled to perform NFC communication, and a signal inquiring whether or not the power feeding target device can receive electric power or is requesting transmission of electric power.

On receiving the inquiry signal 510, the electronic device 2 (IC 200B) transmits a response signal 520 responding to the inquiry of the inquiry signal 510 to the power feeding device 1 by NFC communication. On receiving the response signal 520, the power feeding device 1 (IC 100B) analyzes the response signal 520, and if the power feeding target device is enabled to perform NFC communication and in addition it can receive electric power or is requesting transmission of electric power, the power feeding device 1 (IC 100B) transmits a test request signal 530 to the power feeding target device by NFC communication. On receiving the test request signal 530, the electronic device 2 (IC 200B) as the power feeding target device transmits a response signal 540 responding to the test request signal 530 to the power feeding device 1 by NFC communication, and then promptly performs the $f_O$ changing/short-circuiting operation (resonance frequency changing operation or coil short-circuiting operation). The test request signal 530 is, for example, a signal requesting and indicating the execution of the $f_O$ changing/short-circuiting operation, and when triggered by the reception of the test request signal 530, the control circuit 250 in the electronic device 2 makes the resonance state changing circuit 240 perform the $f_O$ changing/short-circuiting operation. Before the reception of the test request signal 530, the $f_O$ changing/short-circuiting operation remains unperformed. The test request signal 530 may be any signal so long as it can trigger the execution of the $f_O$ changing/short-circuiting operation, and may be contained in the inquiry signal 510.

On receiving the response signal 540, the power feeding device 1 (IC 100B) performs the above-described pFOD process. During the period in which the pFOD process is performed, the electronic device 2 (IC 200B) continues performing the $f_O$ changing/short-circuiting operation. Specifically, the electronic device 2 (IC 200), by using an incorporated timer, continues performing the $f_O$ changing/short-circuiting operation for a time corresponding to the length of the period in which the pFOD process is performed, and then stops the $f_O$ changing/short-circuiting operation.

In the pFOD process, if it is judged that no foreign object is present on the power feeding stage 12, the power feeding device 1 (IC 100B) transmits a verification signal 550 to the power feeding target device by NFC communication. The verification signal 550 includes, for example, a signal notifying the power feeding target device of the forthcoming power transmission. On receiving the verification signal 550, the electronic device 2 (IC 200B) transmits a response signal 560 responding to the verification signal 550 to the power feeding device 1 by NFC communication. The response signal 560 includes, for example, a signal notifying recognition of what is conveyed by the verification signal 550 and a signal giving permission to what is conveyed by the verification signal 550. On receiving the response signal 560, the power feeding device 1 (IC 100B) connects the power transmission circuit 130B to the resonance circuit TT (more specifically, puts the third voltage supply state into effect) to perform power transmission operation, and thus power transfer 570 is achieved.

Figure 42:
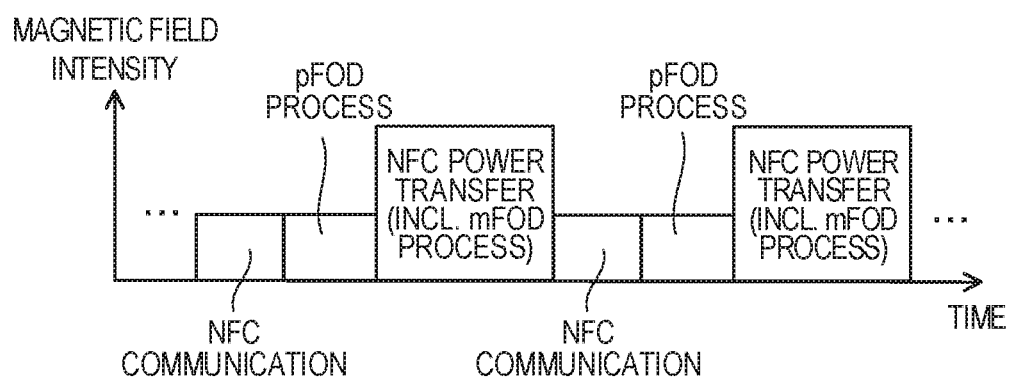
FIG. 42 is a diagram showing how NFC communication, the pFOD process, and power transfer are performed sequentially and repeatedly according to the third embodiment of the present invention.

In the first case in FIG. 17A, power transfer 570 is performed through the procedure described above. However, in the second case in FIG. 17B, although the procedure proceeds up to the transmission and reception of the response signal 540, in the pFOD process, it is judged that a foreign object is present on the power feeding stage 12; thus, no power transfer 570 is performed. A single session of power transfer 570 may be performed for a predetermined time. The sequence of operation from the transmission of the inquiry signal 510 to power transfer 570 may be performed repeatedly. In practice, as shown in FIG. 42, NFC communication, a pFOD process, and power transfer (NFC power transfer) can be performed sequentially and repeatedly. That is, in the non-contact power feeding system, operation for performing NFC communication, operation for performing a pFOD process, and operation for performing power transfer (NFC power transfer) can be performed sequentially and repeatedly on a time-division basis.

[Operation Flow Chart of a Power Feeding Device and an Electronic Device]

Figure 43:
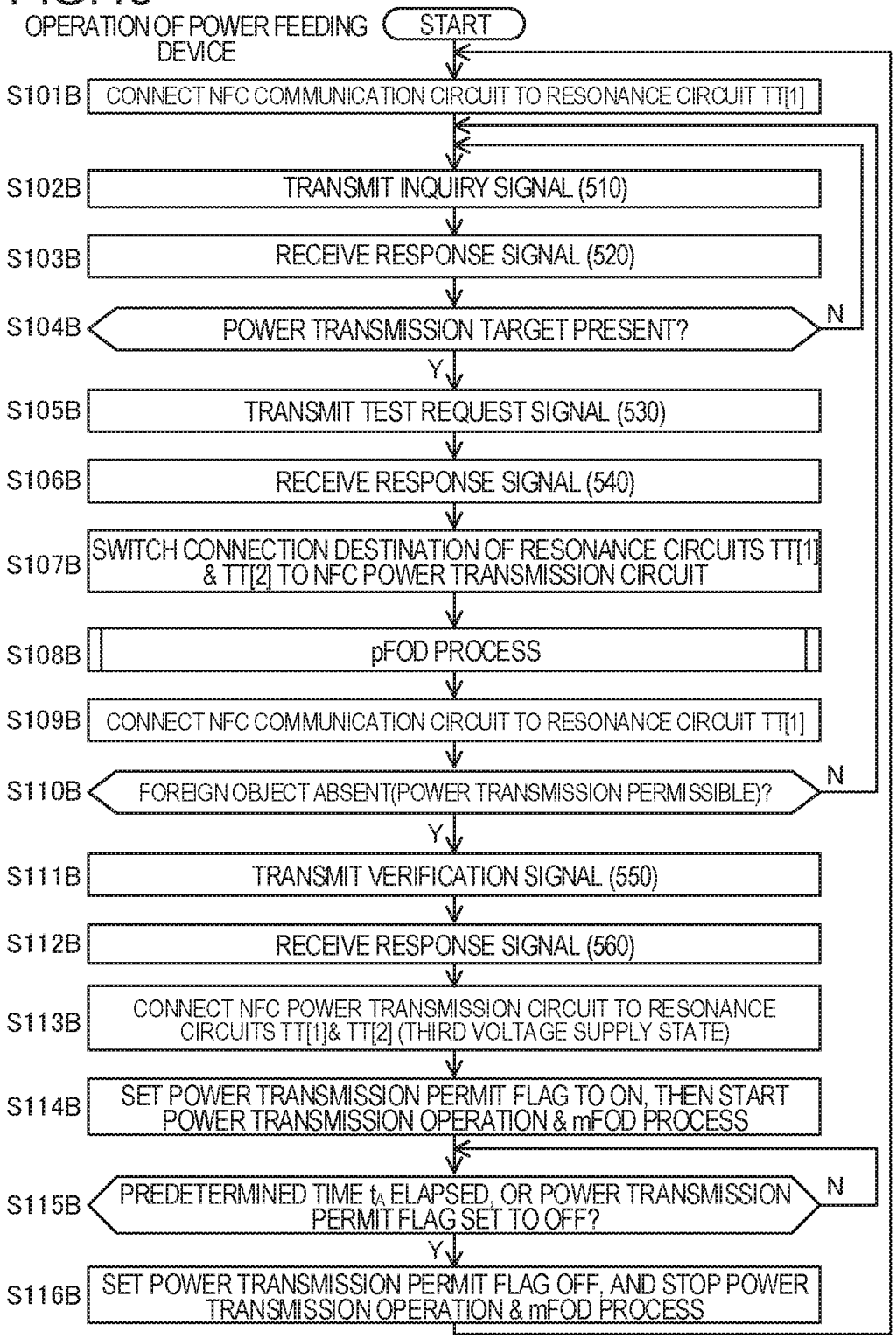
FIG. 43 is an operation flow chart of the power feeding device according to the third embodiment of the present invention.

Next, the flow of the operation of the power feeding device 1 will be described. FIG. 43 is an operation flow chart of the power feeding device 1. The operation of the communication circuit 120 and the power transmission circuit 130B is performed under the control of the control circuit 160.

When the power feeding device 1 starts up, first, at step S101B, the control circuit 160 controls the switch circuit 110B such that the communication circuit 120 is connected to the resonance circuit TT [1]. Subsequently, at step S102B, the control circuit 160 transmits an inquiry signal 510 to the power feeding target device by NFC communication using the communication circuit 120 and the resonance circuit TT[1], and then, at step S103B, the control circuit 160 waits for the reception of a response signal 520. When the communication circuit 120 receives the response signal 520, the control circuit 160 analyzes the response signal 520, and if the power feeding target device is enabled to perform NFC communication and in addition it can receive electric power or is requesting transmission of electric power, it is judged that a power transmission target is present (step S104B, Y), and an advance is made to step S105B; otherwise (step S104B, N), a return is made to step S102B.

At step S105B, the control circuit 160 transmits a test request signal 530 to the power feeding target device by NFC communication using the communication circuit 120 and the resonance circuit TT[1], and then, at step S106B, the control circuit 160 waits for the reception of a response signal 540. When the communication circuit 120 receives the response signal 540, then, at step S107B, the control circuit 160 controls the switch circuit 110B such that the connection destination to the resonance circuits TT[1] and TT[2] is switched from the communication circuit 120 to the power transmission circuit 130B, and subsequently, at step S108B, the above-described pFOD process is performed.

After the pFOD process, at step S109B, the control circuit 160 controls the switch circuit 110B such that the communication circuit 120 is connected to the resonance circuit TT[1], and an advance is made to step S110B. If, in the pFOD process at step S108B, a foreign-object-present judgment has been made, a return is made from step S110B to step S102B; if a foreign-object-absent judgment has been made, an advance is made from step S110B to step S111B.

At step S111B, the control circuit 160 transmits a verification signal 550 to the power feeding target device by NFC communication using the communication circuit 120 and the resonance circuit TT[1], and then, at step S112B, the control circuit 160 waits for the reception of a response signal 560. When the communication circuit 120 receives the response signal 560, then, at step S113B, the control circuit 160 controls the switch circuit 110B such that connection destination to the resonance circuits TT[1] and TT[2] is switched from the communication circuit 120 to the power transmission circuit 130B, and in addition puts the above-described third voltage supply state into effect (see FIG. 37 and FIG. 38). Thereafter, an advance is made to step S114B.

At step S114B, the control circuit 160 sets a power transmission permit flag to ON, and starts the power transmission operation and the mFOD process, and then an advance is made to step S115B. As mentioned above, through the mFOD process, the presence or absence of a foreign object during power transfer is checked, and if a foreign object is detected, the power transmission permit flag is set to OFF (see FIG. 41). The control circuit 160 counts the time that has elapsed from the start of the power transmission operation, and, at step S115B, the control circuit 160 compares the time elapsed with a predetermined time $t_A$ (for example, 10 minutes) and checks the status of the power transmission permit flag. When the time elapsed reaches the predetermined time $t_A$, or when through the mFOD process the power transmission permit flag is set to OFF, an advance is made to step S116B. At step S116B, the control circuit 160 turns the power transmission permit flag from ON to OFF, or keeps the power transmission permit flag set to OFF, and stops the power transmission operation and the mFOD process. Thereafter, a return is made to step S101B.

Figure 44:
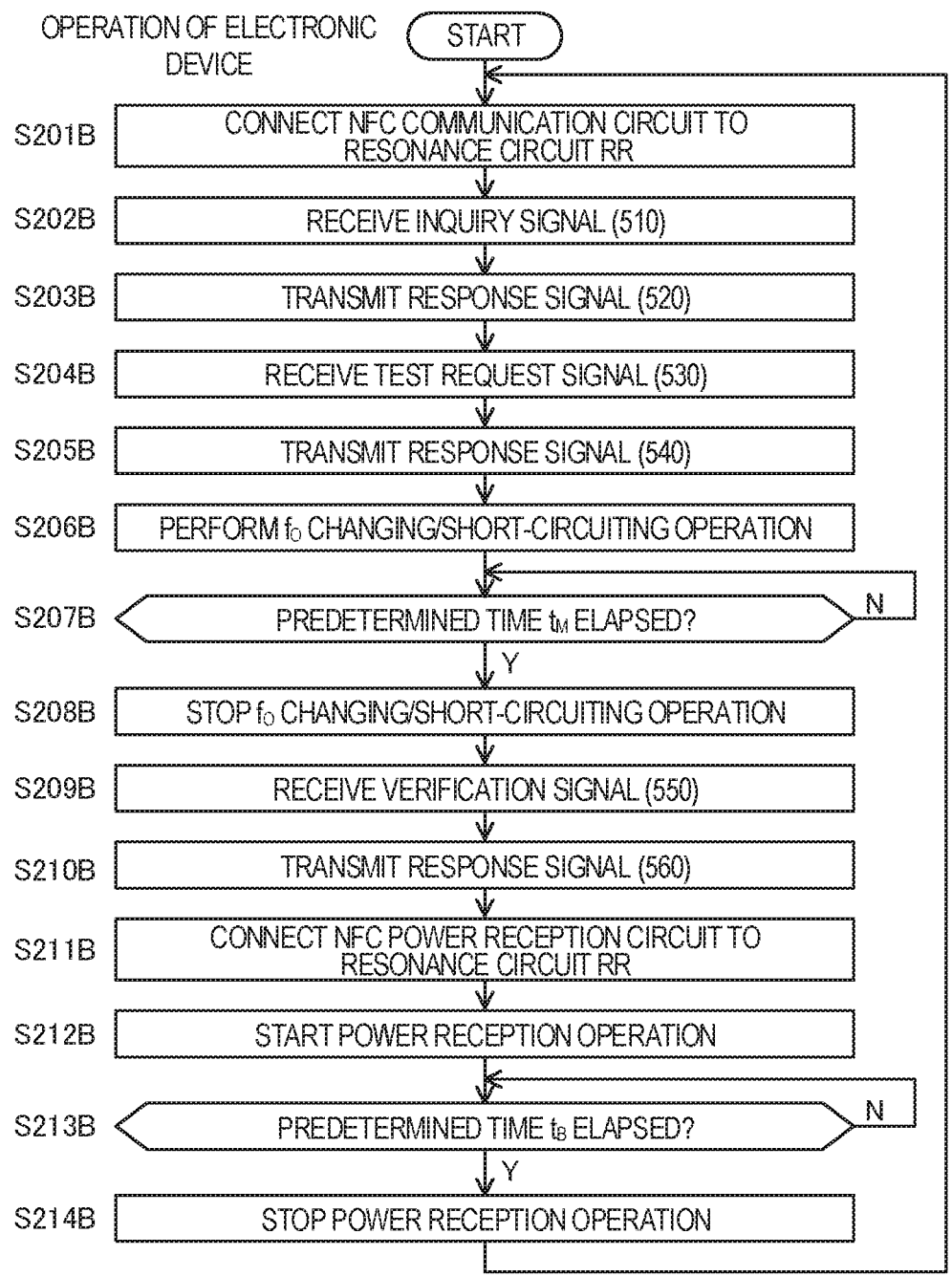
FIG. 44 is an operation flow chart of the electronic device according to the third embodiment of the present invention.

Next, the flow of the operation of the electronic device 2 will be described. FIG. 44 is an operation flow chart of the electronic device 2, and the procedure starting at step S201B is performed concurrently with the operation of the power feeding device 1 shown in FIG. 43. The operation of the communication circuit 220 and the power reception circuit 230 is performed under the control of the control circuit 250.

When the electronic device 2 starts up, first, at step S201B, the control circuit 250 controls the switch circuit 210B such that the communication circuit 220 is connected to the resonance circuit RR. When the electronic device 2 starts up, the $f_O$ changing/short-circuiting operation remains unperformed. Subsequently, at step S202B, the control circuit 250, by using the communication circuit 220, waits for the reception of an inquiry signal 510. When the communication circuit 220 receives the inquiry signal 510, then, at step S203B, the control circuit 250 analyzes the inquiry signal 510 to generate a response signal 520, and transmits the response signal 520 to the power feeding device 1 by NFC communication using the communication circuit 220. At this point, the control circuit 250 checks the condition of the battery 21, and if the battery 21 is not in a fully charged state and in addition the battery 21 does not exhibit any abnormality, the control circuit 250 includes in the response signal 520 a signal indicating readiness to receive electric power or requesting transmission of electric power. On the other hand, if the battery 21 is in a fully charged state or the battery 21 exhibits an abnormality, the control circuit 250 includes in the response signal 520 a signal indicating unreadiness to receive electric power.

Thereafter, when, at step S204B, the test request signal 530 is received by the communication circuit 220, an advance is made to step S205B. At step S205B, the control circuit 250 transmits a response signal 540 to the power feeding device 1 by NFC communication using the communication circuit 220, and subsequently, at step S206B, the control circuit 250, by using the resonance state changing circuit 240, performs the $f_O$ changing/short-circuiting operation. Specifically, the control circuit 250 changes the resonance frequency $f_O$ from the reference frequency to the frequency $f_M$, or short-circuits the reception-side coil $R_L$. The control circuit 250 counts the time that elapses after the start of the execution of the $f_O$ changing/short-circuiting operation (step S207B), and when the time elapsed reaches a predetermined time $t_M$, the control circuit 250 stops the $f_O$ changing/short-circuiting operation (step S208B). Specifically, the control circuit 250 changes the resonance frequency $f_O$ back to the reference frequency, or stops short-circuiting the reception-side coil $R_L$. Then, an advance is made to step S209B. The time $t_M$ is determined beforehand such that, during the period in which the pFOD process is performed in the power feeding device 1 (that is, during the period in which the test magnetic field is generated), the execution of the $f_O$ changing/short-circuiting operation is continued and, as soon as the period expires, the $f_O$ changing/short-circuiting operation is promptly stopped. The time $t_M$ may be specified in the test request signal 530.

At step S209B, the control circuit 250, by using the communication circuit 220, waits for the reception of a verification signal 550. When the communication circuit 220 receives the verification signal 550, then, at step S210B, the control circuit 250 transmits a response signal 560 responding to the verification signal 550 to the power feeding device 1 by NFC communication using the communication circuit 220. If a foreign object is present on the power feeding stage 12, no verification signal 550 is transmitted from the power feeding device 1 (see step S110B in FIG. 43), and thus if, at step S209B, no verification signal 550 is received for a predetermined time, a return can be made to step S201B.

After the transmission of the response signal 560, at step S211B, the control circuit 250 controls the switch circuit 210B such that the power reception circuit 230 is connected to the resonance circuit RR, and subsequently, at step S212B, the control circuit 250 starts the power reception operation using the power reception circuit 230. The control circuit 250 counts the time that elapses after the start of the power reception operation, and compares the time elapsed with a predetermined time is (step S213B). When the time elapsed reaches the time is (step S213B, Y), then, at step S214B, the control circuit 250 stops the power reception operation, and a return is then made to step S201B.

The time $t_B$ is previously determined or is specified in the verification signal 550 such that the period in which the power reception operation is performed generally coincides with the period in which the power transmission operation is performed in the power feeding device 1. A configuration is also possible where, after the start of the power reception operation, the control circuit 250 monitors the charge current to the battery 21, and when the charge current value becomes equal to or smaller than a predetermined value, the control circuit 250 judges that the power transmission operation has ended and stops the power reception operation, an advance then being made to step S201B.

As described above, when electric power is being transmitted in the power transmission operation, the control circuit 160 performs the mFOD process to monitor whether or not the sensed current amplitude value falls outside the normal mFOD range, and thereby controls whether or not continue power transmission. Thus, in a situation unsuitable to continue the power transmission operation such as when a foreign object is placed on the power feeding stage 12 after the start of the power transmission operation, the power transmission operation is stopped through the mFOD process; it is thus possible to prevent the foreign object from being damaged or otherwise affected as a result of the power transmission operation being continued. This is achieved by use of sensed current amplitude values in a plurality of transmission-side coils with mutually different sizes, and this helps improve the accuracy (sensibility) of foreign object detection.

[Examples of Arrangement of Transmission-Side Coils]

Figure 45:
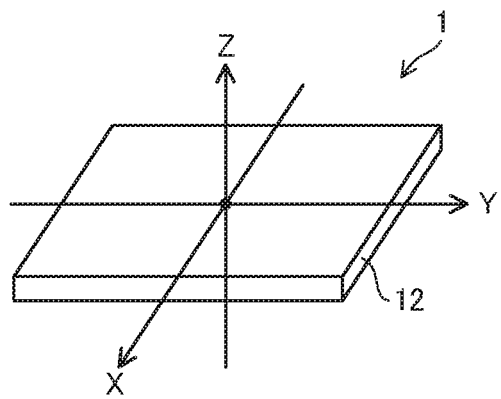
FIG. 45 is a diagram showing the relationship between the X, Y, and Z axes and a power feeding stage according to the third embodiment of the present invention.

Examples of the arrangement of transmission-side coils $T_L[1]$ and $T_L[2]$ will be described below. Prior to the description of examples of arrangement, an X axis, a Y axis, and a Z axis that are perpendicular to each other are defined as shown in FIG. 45. The X and Y axes are parallel to the placement surface of the power feeding stage 12, and accordingly the Z axis is perpendicular to the placement surface of the power feeding stage 12. The placement surface of the power feeding stage 12 is the surface on which an electronic device 2 is to be placed, and on that placement surface, an electronic device 2 and a foreign object can be placed.

Figure 46A:
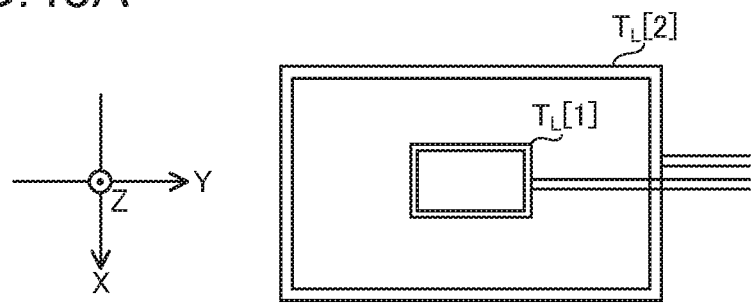
FIG. 46A to FIG. 46C are a schematic top view, a schematic perspective view, and a schematic sectional view, respectively, of two transmission-side coils according to the third embodiment of the present invention.
Figure 46B:
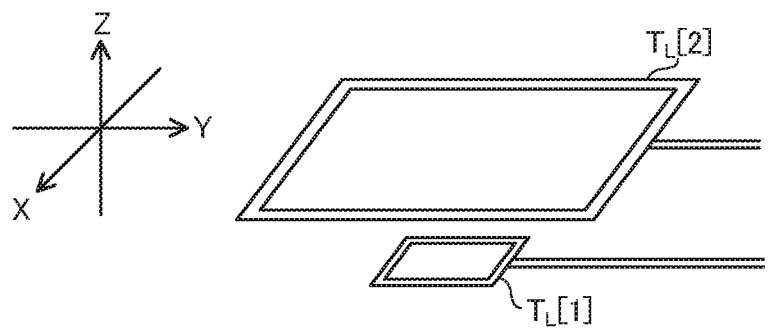
Figure 46C:
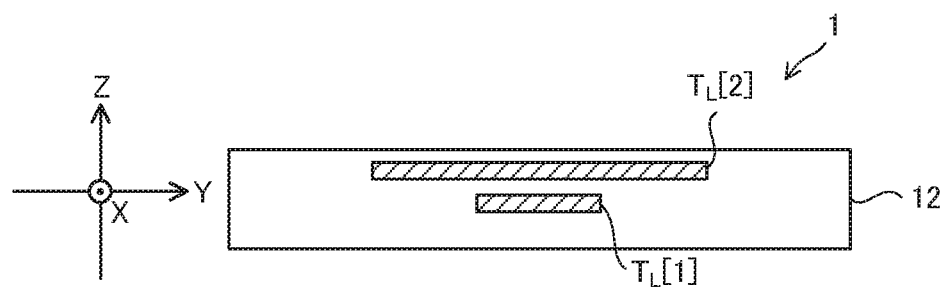

FIG. 46A is a schematic top view of the transmission-side coils $T_L[1]$ and $T_L[2]$, and FIG. 46B is a schematic perspective view of the transmission-side coils $T_L[1]$ and $T_L[2]$. FIG. 46C is a schematic sectional view of the transmission-side coils $T_L[1]$ and $T_L[2]$ across a sectional plane parallel to the Y and Z axes. In FIG. 46A and FIG. 46B, to keep illustration simple and avoid complication, the winding of each transmission-side coil $T_L[i]$ is represented by a double rectangular frame. In any diagram illustrating a coil, line segments extending sideways from the double rectangular representing the coil represent leads leading from the coil.

The transmission-side coils $T_L[1]$ and $T_L[2]$ each form a loop antenna, and the loop planes of those loop antennas (that is the planes on which the windings of the transmission-side coils $T_L[1]$ and $T_L[2]$ are arranged) are parallel to the X and Y axes. The size of the transmission-side coil $T_L[1]$ is smaller than the size of the transmission-side coil $T_L[2]$. As mentioned above, for example, the transmission-side coil $T_L[1]$ is the same as the antenna coil AT6, and the transmission-side coil $T_L[2]$ is the same as the antenna coil AT3 (see FIG. 36F and FIG. 36C).

For example, the center axis of the transmission-side coil $T_L[1]$ as a loop antenna and the center axis of the transmission-side coil $T_L[2]$ as a loop antenna coincide with each other, and as seen from the Z-axis direction, the winding of the transmission-side coil $T_L[1]$ is arranged inward of the arrangement position of the winding of the transmission-side coil $T_L[2]$. However, as shown in FIG. 46C, while the plane on which the winding of the transmission-side coil $T_L[2]$ is arranged and the plane on which the winding of the transmission-side coil $T_L[1]$ is arranged are parallel to each other, they are a predetermined distance apart from each other in the Z-axis direction. In a structure different from that shown in FIG. 46B and FIG. 46C, the winding of the transmission-side coil $T_L[2]$ and the winding of the transmission-side coil $T_L[1]$ can be arranged on the identical plane. In that case, only the leads from the winding of the transmission-side coil $T_L[2]$ and the leads from the winding of the transmission-side coil $T_L[1]$ can be arranged apart from each other in the up-down direction (Z-axis direction).

The shape of the reception-side coil $R_L$ in the electronic device 2 is supposed to be the same as that of the antenna coil AT6; thus, when the electronic device 2 is place on the placement surface of the power feeding stage 12 (that is, in the regularly placed state), the loop plane of the loop antenna as the reception-side coil $R_L$ (that is, the plane on which the winding of the reception-side coil $R_L$ is arranged) is parallel to the X and Y axes. This increases the degree of magnetic coupling between the transmission-side coil $T_L[i]$ and the reception-side coil $R_L$. When a foreign object 3 as exemplified by a non-contact IC card is placed on the placement surface of the power feeding stage 12, the loop plane of the loop antenna as the coil $J_L$ of the foreign object 3 (that is, the plane on which the winding of the coil $J_L$ is arranged) is also parallel to the X and Y axes.

Although it is above assumed that the size of the transmission-side coil $T_L[2]$ is larger than the size of the transmission-side coil $T_L[1]$, their size relationship may be the other way around.

As mentioned above, the number of transmission-side coils $T_L$ (that is, the value of n) may be three or more. In a case where "n=3", there can be additionally provided a unit sensing circuit 140[3] which connects a resonance circuit TT[3] having the same configuration as the resonance circuit TT[2] in FIG. 37 via a switch similar to the switch SW5 to the line 133 and which senses the current amplitude in the transmission-side coil $T_L[3]$ in the resonance circuit TT[3] to output the sensed value as $V_{DET}[3]$. Then, in the pFOD process, the alternating-current voltage $V_{OL}$ from the amplifier (power amplifier) 132 can be fed to the resonance circuits TT[1] to TT[3] one after another to acquire $V_{DET}[i]$ from each unit sensing circuit 140[i] as $V_{pFOD}[i]$, and based on $V_{pFOD}[1]$ to $V_{pFOD}[3]$, a foreign-object-absent or foreign-object-present judgment can be made to permit or restrict the start of power transmission. After the start of the power transmission operation, the alternating-current voltage $V_{OH}$ can be fed from the amplifier (power amplifier) 132 to the resonance circuit TT[1], and in addition a division voltage ($k_{DV} \times V_{OH}$) of the alternating-current voltage $V_{OH}$ can be fed to each of the resonance circuits TT[2] and TT[3]. In the mFOD process performed in this state, $V_{DET}[i]$ from each unit sensing circuit 140[i] is acquired as $V_{mFOD}[i]$, and based on $V_{mFOD}[1]$ to $V_{mFOD}[3]$, a foreign-object-absent or foreign-object-present judgment can be made to control whether or not continue power transmission.

<<Studies on the Present Invention, Part 3>>

To follow are studies on the present invention as embodied as the third embodiment described above.

A power transmission device $W_3$ according to one aspect of the present invention is a power transmission device that can transmit electric power to a power reception device by magnetic resonance, and includes: a plurality of transmission-side resonance circuits (TT[1] to TT[n]) which include a plurality of transmission-side coils respectively; a power transmission circuit (130B) which can feed an alternating-current voltage to each of the transmission-side resonance circuits; a sensing circuit (140) which senses the current passing through each of the transmission-side coils; and a control circuit (160) which controls transmission of the electric power by controlling the supply state of the alternating-current voltage to each of the transmission-side resonance circuits. The plurality of transmission-side coils ($T_L[1]$ to $T_L[n]$) included in the plurality of transmission-side resonance circuits have different sizes from each other. The control circuit starts the power transmission by feeding the alternating-current voltage to the plurality of transmission-side resonance circuits and thereafter controls whether or not to continue the power transmission based on a plurality of sensed amplitude values ($V_{mFOB}[1]$ to $V_{mFOD}[n]$) sensed by the sensing circuit with respect to the plurality of transmission-side coils.

With the power transmission device $W_3$, in a situation unsuitable to continue power transmission operation such as when a foreign object comes to be present at a position within the reach of the magnetic field generated in the transmission-side coil after the start of power transmission operation, it is possible, for example, to stop the power transmission operation. It is thus possible to prevent the foreign object from being damaged or otherwise affected as a result of power transmission being continued. This is achieved by use of sensed current amplitude values in a plurality of transmission-side coils with mutually different sizes, and this helps improve the accuracy (sensibility) of foreign object detection.

Specifically, for example, in the power transmission device $W_3$, when the power transmission is being performed, the control circuit can control whether or not to continue the power transmission by monitoring, for the transmission-side coils respectively, whether or not the sensed amplitude values fall outside a reference range (normal mFOD range).

More specifically, for example, in the power transmission device $W_3$, when the power transmission is being performed, the control circuit can stop the power transmission if the sensed amplitude value from at least one transmission-side coil out of the plurality of transmission-side coils falls outside the reference range.

A situation where a sensed amplitude value from the sensing circuit falls outside the reference range is considered to correspond to a situation unsuitable to continue power transmission operation such as when a foreign object comes to be present at a position within the reach of the magnetic field generated in the transmission-side coil. In such a situation, by stopping power transmission, it is possible, for example, to prevent the foreign object from being damaged or otherwise affected as a result of power transmission being continued.

Specifically, for another example, in the power transmission device $W_3$, when the power transmission is being performed, the control circuit can judge, for the transmission-side coils respectively, whether or not the sensed amplitude values fall outside the reference range and thereby judge the presence or absence of a foreign object which differs from the power reception device and in which a current based on the magnetic field generated in the transmission-side coils can be generated, and can stops the power transmission on judging that a foreign object is present.

In that case, for example, in the power transmission device $W_3$, when the power transmission is being performed, the control circuit can judge, for the transmission-side coils respectively, whether or not the sensed amplitude values exceed the upper limit value of the reference range and thereby judge whether or not, as the foreign object, a foreign object including a coil is present.

For another example, in the power transmission device $W_3$, the reference range can be set for each of the transmission-side coils.

For another example, in the power transmission device $W_3$, the plurality of transmission-side resonance circuits can include at least a first transmission-side resonance circuit (TT[1]) and a second transmission-side resonance circuit (TT[2]). When the power transmission is being performed, from the power transmission circuit, a predetermined first alternating-current voltage ($V_{OH}$) can be fed to the first transmission-side resonance circuit and a second alternating-current voltage ($k_{DV} \times V_{OH}$) lower than the first alternating-current voltage can be fed to the second transmission-side resonance circuit.

Thus, electric power is transmitted chiefly from, of the first and second transmission-side resonance circuits, the first transmission-side resonance circuit. Making the size of the transmission-side coil in the first transmission-side resonance circuit equal to, or close to, the size of the reception-side coil in the power reception device helps improve power transfer efficiency.

Specifically, for example, in the power transmission device $W_3$, when the power transmission is being performed, a division voltage of the first alternating-current voltage can be fed, as the second alternating-current voltage, to the second transmission-side resonance circuit.

A non-contact power feeding system $W_{3A}$ according to one aspect of the present invention is a non-contact power feeding system that includes the power transmission device $W_3$ and a power reception device, and enables transmission and reception of the electric power between the power transmission device and the power reception device by magnetic resonance.

For example, in the non-contact power feeding system $W_{3A}$, the power reception device can include: a reception-side resonance circuit (RR) which includes a reception-side coil ($R_L$) for receiving the electric power; and a changing/short-circuiting circuit (240) which can, prior to reception of the electric power from the power transmission device, either change the resonance frequency of the reception-side resonance circuit from the reference frequency during the power reception or short-circuit the reception-side coil. The control circuit (160) can, in a state where the resonance frequency of the reception-side resonance circuit is changed or the reception-side coil is short-circuited in the power reception device according to a signal communicated from the power transmission device, prior to the power transmission, have a third alternating-current voltage ($V_{OL}$) lower than the first alternating-current voltage ($V_{OH}$) fed to the plurality of transmission-side resonance circuits sequentially to acquire from the sensing circuit a plurality of pre-transmission sensed amplitude values ($V_{pFOD}[1]$ to $V_{pFOD}[n]$) with respect to the plurality of transmission-side coils, and can permit or restrict the start of the power transmission based on the plurality of pre-transmission sensed amplitude values.

With this configuration, in a situation unsuitable to start power transmission operation such as when a foreign is present at a position within the reach of the magnetic field generated in the transmission-side coil, it is possible, for example, to restrict the start of power transmission. It is thus possible to prevent the foreign object from being damaged or otherwise affected as a result of power transmission being started. This is achieved by use of pre-transmission sensed amplitude values in a plurality of transmission-side coils with mutually different sizes, and this helps improve the accuracy (sensibility) of foreign object detection.

A non-contact power feeding system $W_{3B}$ according to one aspect of the present invention is a non-contact power feeding system that includes the power transmission device $W_3$ and a power reception device, and enables transmission and reception of the electric power between the power transmission device and the power reception device by magnetic resonance. In addition, the power reception device includes a reception-side resonance circuit (RR) which includes a reception-side coil ($R_L$) for receiving electric power. The size of the reception-side coil is equal to the size of the transmission-side coil in the first transmission-side resonance circuit, or is closer to the size of the transmission-side coil in the first transmission-side resonance circuit than to the size of the transmission-side coil in the second transmission-side resonance circuit.

In this case, a configuration can be adopted where, while the power transmission is being performed in the power transmission device $W_3$, from the power transmission circuit, a predetermined first alternating-current voltage ($V_{OH}$) is fed to the first transmission-side resonance circuit and a second alternating-current voltage ($k_{DV} \times V_{OH}$) lower than the first alternating-current voltage is fed to the second transmission-side resonance circuit. Then, electric power is transmitted chiefly from, of the first and second transmission-side resonance circuits, the first transmission-side resonance circuit. This helps improve power transfer efficiency.

A power reception device according to the present invention can include a plurality of reception-side coils (hence a plurality of reception-side resonance circuits including those reception-side coils respectively).

The power feeding device 1 itself in the third embodiment described above may function as a power transmission device according to the present invention, or a part of the power feeding device 1 in the third embodiment described above may function as a power transmission device according to the present invention. Likewise, the electronic device 2 itself in the third embodiment described above may function as a power reception device according to the present invention, or a part of the electronic device 2 in the third embodiment described above may function as a power reception device according to the present invention.

<<Variations and Modifications>>

Embodiments of the present invention allow for many variations and modifications within the spirit and scope of the technical concepts recited in the appended claims. The embodiments described above merely present examples of how the present invention can be implemented, and the senses of the terms used to describe the present invention and its features are not limited to those in which the terms are used in the description of the embodiments. Any specific values mentioned in the above description are merely examples, and, needless to say, can be changed to many different values. As notes applicable to the embodiments described above, notes 1 to 4 are given below. Unless inconsistent, any of the notes below can be combined with any other.

[Note 1]

In the embodiments described above, the frequencies of different signals and the resonance frequencies are set at 13.56 MHz, that is, at the reference frequency. The frequency 13.56 MHz, however, is simply a target value for such settings, and in actual devices, those frequencies contain errors.

[Note 2]

In the embodiments, the present invention is implemented in conformity with the NFC standard, and this necessitates that the reference frequency be 13.56 MHz. The reference frequency, however, may instead be any frequency other than 13.56 MHz. In this connection, the communication and power transfer conducted between a power feeding device and an electronic device according to the present invention may be communication and power transfer conforming to any standard other than NFC.

Also in a case where the reference frequency of a non-contact power feeding system according to the present invention is set at a frequency (for example, 6.78 MHz) other than 13.56 MHz and in addition the resonance frequency of the resonance circuit JJ in a foreign object 3 configured as a non-contact IC card is 13.56 MHz, when the foreign object 3 is placed on the power feeding stage 12, a certain degree of variation is observed in the voltage value $V_D$ or $V_{DET}$ in the pFOD process or in the mFOD process. Thus, also in such cases, a foreign object 3 can be detected by the method described above.

[Note 3]

The transistors mentioned in the description of the embodiments given above may be transistors of any type. Accordingly, for example, the transistors 421 and 441, which are shown as MOSFETs in FIG. 12 and FIG. 29, may be replaced with junction FETs or bipolar transistors.

[Note 4]

A target device, that is, a power reception device or a power transmission device, according to the present invention can be built as hardware, such as an integrated circuit, or as a combination of hardware and software. Arbitrary particular functions, which are all or part of the functions performable by the target device, may be written in a program, and this program may be stored in a flash memory that can be mounted on the target device so that, when the program is run on a program execution device (for example, a microcomputer that can be mounted on the target device), those particular functions will be performed. The program can be stored in or fixed to any recording medium. The recording medium in or to which the program is stored or fixed may be mounted on or connected to a device (such as a server device) separate from the target device.

LIST OF REFERENCE SIGNS 1 power feeding device
2 electronic device
130, 130A, 130B NFC power transmission circuit
140 load sensing circuit
160 control circuit
440 class-E amplifier
450 selective voltage division circuit
460 class-A amplifier
470 selection circuit
TT, TT[i] transmission-side resonance circuit
$T_L$, $T_L[i]$ transmission-side coil
$T_C$, $T_C[i]$ transmission-side capacitor
RR reception-side resonance circuit
$R_L$ reception-side coil
$R_C$ reception-side capacitor

The invention claimed is:

1. A power transmission device that can transmit electric power to a power reception device by magnetic resonance, comprising:
a transmission-side resonance circuit which includes a transmission-side coil for transmitting the electric power and which has a predetermined reference frequency as a resonance frequency;
a class-E amplifier which generates and outputs an alternating-current voltage at the reference frequency by switching a direct-current voltage fed from a direct-current power source by using a periodic signal at the reference frequency;
a selective voltage division circuit which is inserted between the class-E amplifier and the transmission-side resonance circuit and which feeds the transmission-side resonance circuit selectively with either an output voltage of the class-E amplifier as a power transmission alternating-current voltage or a voltage obtained by dividing the output voltage of the class-E amplifier as a test alternating-current voltage;
a sensing circuit which senses an amplitude of a current passing through the transmission-side coil; and
a control circuit which controls the selective voltage division circuit and thereby controls a supply voltage to the transmission-side resonance circuit,
wherein
the control circuit
acquires, as an evaluation value, a sensed amplitude value from the sensing circuit when the test alternating-current voltage is fed to the transmission-side resonance circuit, and
controls, based on the evaluation value, whether or not to perform power transmission by feeding the power transmission alternating-current voltage to the transmission-side resonance circuit.

2. The power transmission device according to claim 1, wherein the control circuit
judges, based on the evaluation value, presence or absence of a foreign object which differs from the power reception device and in which a current based on a magnetic field generated in the transmission-side coil can be generated, and
controls, based on a result of the judgment, whether or not to perform the power transmission.

3. The power transmission device according to claim 2, wherein
the control circuit, on judging that no foreign object is present, permits the power transmission and, on judging that a foreign object is present, inhibits the power transmission.

4. The power transmission device according to claim 2, wherein
the control circuit judges the presence or absence of a foreign object by judging whether or not the evaluation value falls outside a predetermined range.

5. The power transmission device according to claim 1, wherein
the class-E amplifier includes:
a switching device which performs switching operation according to the periodic signal;
a first coil which is interposed between the direct-current power source and the switching device;
a first capacitor which is connected in parallel with the switching device; and
a resonance circuit which is connected to a connection node between the switching device and the first coil and which includes a second coil and a second capacitor, and the alternating-current voltage is output via the resonance circuit.

6. The power transmission device according to claim 1, wherein
the power reception device includes:
a reception-side resonance circuit which includes a reception-side coil for receiving the electric power and which has the reference frequency as a resonance frequency; and
a changing/short-circuiting circuit which either changes the resonance frequency of the reception-side resonance circuit from the reference frequency or short-circuits the reception-side coil, and
when the evaluation value is acquired, according to a signal communicated from the power transmission device, the resonance frequency of the reception-side resonance circuit is changed or the reception-side coil is short-circuited in the power reception device.

7. The power transmission device according to claim 6, wherein
the direct-current voltage has a voltage value such that, when the test alternating-current voltage is fed to the transmission-side resonance circuit, an absolute value of a difference between a first value and a second value, or a ratio of the absolute value to the first or second value, is equal to or lower than a predetermined value,
the first value is the sensed amplitude value from the sensing circuit acquired when the test alternating-current voltage is fed to the transmission-side resonance circuit and in addition the power reception device is not present in a predetermined power transmission region for performing the power transmission, and
the second value is the sensed amplitude value from the sensing circuit acquired when the test alternating-current voltage is fed to the transmission-side resonance circuit and in addition the power reception device is present in the power transmission region in a state where the resonance frequency of the reception-side resonance circuit is changed or the reception-side coil is short-circuited.

8. A non-contact power feeding system comprising:
the power transmission device according to claim 1; and
a power reception device,
transmission and reception of the electric power being possible between the power transmission device and the power reception device by magnetic resonance.

9. A non-contact power feeding system comprising:
the power transmission device according to claim 1; and
a power reception device,
transmission and reception of the electric power being possible between the power transmission device and the power reception device by magnetic resonance,
wherein
the power reception device includes:
a reception-side resonance circuit which includes a reception-side coil for receiving the electric power and which has the reference frequency as a resonance frequency; and
a changing/short-circuiting circuit which either
changes the resonance frequency of the reception-side resonance circuit from the reference frequency or short-circuits the reception-side coil, and
when the evaluation value is acquired in the power transmission device, according to a signal communicated from the power transmission device, the resonance frequency of the reception-side resonance circuit is changed or the reception-side coil is short-circuited.

10. The non-contact power feeding system according to claim 9, wherein
the direct-current voltage has a voltage value such that, when the test alternating-current voltage is fed to the transmission-side resonance circuit, an absolute value of a difference between a first value and a second value, or a ratio of the absolute value to the first or second value, is equal to or lower than a predetermined value,
the first value is the sensed amplitude value from the sensing circuit acquired when the test alternating-current voltage is fed to the transmission-side resonance circuit and in addition the power reception device is not present in a predetermined power transmission region for performing the power transmission, and
the second value is the sensed amplitude value from the sensing circuit acquired when the test alternating-current voltage is fed to the transmission-side resonance circuit and in addition the power reception device is present in the power transmission region in a state where the resonance frequency of the reception-side resonance circuit is changed or the reception-side coil is short-circuited.

11. A power transmission device that can transmit electric power to a power reception device by magnetic resonance, comprising:
a transmission-side resonance circuit which includes a transmission-side coil for transmitting the electric power and which has a predetermined reference frequency as a resonance frequency;
a class-E amplifier which generates and outputs a power transmission alternating-current voltage at the reference frequency by switching a direct-current voltage fed from a direct-current power source by using a periodic signal at the reference frequency;
an input signal amplifier which generates and outputs a test alternating-current voltage at the reference frequency by amplifying an input alternating-current voltage at the reference frequency;
a selection circuit which feeds the transmission-side resonance circuit selectively with either the power transmission alternating-current voltage or the test alternating-current voltage;
a sensing circuit which senses an amplitude of a current passing through the transmission-side coil; and
a control circuit which controls the selection circuit and thereby controls a supply voltage to the transmission-side resonance circuit,
wherein
the control circuit
acquires, as an evaluation value, a sensed amplitude value from the sensing circuit when the test alternating-current voltage is fed to the transmission-side resonance circuit, and
controls, based on the evaluation value, whether or not to perform power transmission by feeding the power transmission alternating-current voltage to the transmission-side resonance circuit.

12. The power transmission device according to claim 11, wherein
the control circuit
judges, based on the evaluation value, presence or absence of a foreign object which differs from the power reception device and in which a current based on a magnetic field generated in the transmission-side coil can be generated, and
controls, based on a result of the judgment, whether or not to perform the power transmission.

13. The power transmission device according to claim 12, wherein
the control circuit, on judging that there is no foreign object, permits the power transmission and, on judging that there is a foreign object, inhibits the power transmission.

14. The power transmission device according to claim 12, wherein
the control circuit judges the presence or absence of a foreign object by judging whether or not the evaluation value falls outside a predetermined range.

15. The power transmission device according to claim 11, wherein
the class-E amplifier includes:
a switching device which performs switching operation according to the periodic signal;
a first coil which is interposed between the direct-current power source and the switching device;
a first capacitor which is connected in parallel with the switching device; and
a resonance circuit which is connected to a connection node between the switching device and the first coil and which includes a second coil and a second capacitor, and the alternating-current voltage is output via the resonance circuit.

16. The power transmission device according to claim 11, wherein
an amplitude of the test alternating-current voltage is smaller than an amplitude of the power transmission alternating-current voltage.

17. The power transmission device according to claim 11, wherein
the periodic signal to the class-E amplifier and the input alternating-current voltage to the input signal amplifier are generated based on a common signal having the reference frequency.

18. The power transmission device according to claim 11, wherein
the power reception device includes:
a reception-side resonance circuit which includes a reception-side coil for receiving the electric power and which has the reference frequency as a resonance frequency; and
a changing/short-circuiting circuit which either
changes the resonance frequency of the reception-side resonance circuit from the reference frequency or
short-circuits the reception-side coil, and
when the evaluation value is acquired, according to a signal communicated from the power transmission device, the resonance frequency of the reception-side resonance circuit is changed or the reception-side coil is short-circuited in the power reception device.

19. A non-contact power feeding system comprising:
the power transmission device according to claim 11; and
a power reception device,
wherein
transmission and reception of the electric power being possible between the power transmission device and the power reception device by magnetic resonance.

20. A non-contact power feeding system comprising:
the power transmission device according to claim 11; and
a power reception device,
transmission and reception of the electric power being possible between the power transmission device and the power reception device by magnetic resonance,
wherein
the power reception device includes:
a reception-side resonance circuit which includes a reception-side coil for receiving the electric power and which has the reference frequency as a resonance frequency; and
a changing/short-circuiting circuit which either
changes the resonance frequency of the reception-side resonance circuit from the reference frequency or
short-circuits the reception-side coil, and
when the evaluation value is acquired in the power transmission device, according to a signal communicated from the power transmission device, the resonance frequency of the reception-side resonance circuit is changed or the reception-side coil is short-circuited.

21. A non-contact power feeding system comprising:
a power transmission device that can transmit electric power to a power reception device by magnetic resonance, comprising:
a plurality of transmission-side resonance circuits which include a plurality of transmission-side coils respectively;
a power transmission circuit which can feed an alternating-current voltage to each of the transmission-side resonance circuits;
a sensing circuit which senses a current passing through each of the transmission-side coils; and
a control circuit which controls transmission of the electric power by controlling a supply state of the alternating-current voltage to each of the transmission-side resonance circuits; and
a power reception device,
wherein the plurality of transmission-side resonance circuits include at least a first transmission-side resonance circuit and a second transmission-side resonance circuit, and
when the power transmission is being performed, from the power transmission circuit, a predetermined first alternating-current voltage is fed to the first transmission-side resonance circuit and a second alternating-current voltage lower than the first alternating-current voltage is fed to the second transmission-side resonance circuit,
the plurality of transmission-side coils included in the plurality of transmission-side resonance circuits have different sizes from each other,
the control circuit
starts the power transmission by feeding the alternating-current voltage to the plurality of transmission-side resonance circuits and thereafter
controls whether or not to continue the power transmission based on a plurality of sensed amplitude values sensed by the sensing circuit with respect to the plurality of transmission-side coils,
transmission and reception of the electric power being possible between the power transmission device and the power reception device by magnetic resonance,
the power reception device includes:
a reception-side resonance circuit which includes a reception-side coil for receiving the electric power; and
a changing/short-circuiting circuit which can, prior to reception of the electric power from the power transmission device, either
change the resonance frequency of the reception-side resonance circuit from the reference frequency during the power reception or
short-circuit the reception-side coil, and
the control circuit, in a state where the resonance frequency of the reception-side resonance circuit is changed or the reception-side coil is short-circuited in the power reception device according to a signal communicated from the power transmission device, prior to the power transmission,
has a third alternating-current voltage lower than the first alternating-current voltage fed to the plurality of transmission-side resonance circuits sequentially to acquire from the sensing circuit a plurality of pre-transmission sensed amplitude values with respect to the plurality of transmission-side coils, and
permits or restricts a start of the power transmission based on the plurality of pre-transmission sensed amplitude values.

22. The non-contact power feeding system according to claim 21, wherein
when the power transmission is being performed, the control circuit controls whether or not to continue the power transmission by monitoring, for the transmission-side coils respectively, whether or not the sensed amplitude values fall outside a predetermined reference range.

23. The non-contact power feeding system according to claim 22, wherein
when the power transmission is being performed, the control circuit stops the power transmission if a sensed amplitude value from at least one transmission-side coil out of the plurality of transmission-side coils falls outside the reference range.

24. The non-contact power feeding system according to claim 22, wherein
when the power transmission is being performed, the control circuit
judges, for the transmission-side coils respectively, whether or not the sensed amplitude values fall outside the reference range and thereby judges presence or absence of a foreign object which differs from the power reception device and in which a current based on a magnetic field generated in the transmission-side coils can be generated, and stops the power transmission on judging that a foreign object is present.

25. The non-contact power feeding system according to claim 24, wherein when the power transmission is being performed, the control circuit judges, for the transmission-side coils respectively, whether or not the sensed amplitude values exceed an upper limit value of the reference range and thereby judges whether or not, as the foreign object, a foreign object including a coil is present.

26. The non-contact power feeding system according to claim 22, wherein the reference range is set for each of the transmission-side coils.

27. The non-contact power feeding system according to claim 21, wherein when the power transmission is being performed, a division voltage of the first alternating-current voltage is fed, as the second alternating-current voltage, to the second transmission-side resonance circuit.

28. The non-contact power feeding system according to claim 21, wherein a size of the reception-side coil is equal to a size of the transmission-side coil in the first transmission-side resonance circuit, or is closer to the size of the transmission-side coil in the first transmission-side resonance circuit than to a size of the transmission-side coil in the second transmission-side resonance circuit.

* * * * *